US 6,960,948 B2

(12) United States Patent
Kizer et al.

(10) Patent No.: US 6,960,948 B2
(45) Date of Patent: Nov. 1, 2005

(54) SYSTEM WITH PHASE JUMPING LOCKED LOOP CIRCUIT

(75) Inventors: Jade M. Kizer, Mountain View, CA (US); Benedict C. Lau, San Jose, CA (US); Roxanne T. Vu, San Jose, CA (US); Craig E. Hampel, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 13 days.

(21) Appl. No.: 10/852,650

(22) Filed: May 24, 2004

(65) Prior Publication Data

US 2005/0001662 A1 Jan. 6, 2005

Related U.S. Application Data

(63) Continuation of application No. 10/374,390, filed on Feb. 25, 2003, now Pat. No. 6,759,881, which is a continuation-in-part of application No. 10/104,230, filed on Mar. 22, 2002.

(60) Provisional application No. 60/408,063, filed on Sep. 3, 2002, provisional application No. 60/408,101, filed on Sep. 3, 2002, and provisional application No. 60/436,745, filed on Dec. 27, 2002.

(51) Int. Cl.[7] .................................................. H03L 7/06
(52) U.S. Cl. ....................................... 327/147; 327/158
(58) Field of Search .............................. 327/147–161, 327/231, 236; 331/25, DIG. 3; 375/371, 373, 375, 376

(56) References Cited

U.S. PATENT DOCUMENTS

| 5,206,881 A | 4/1993 | Messenger et al. ......... 375/145 |
| 5,554,945 A | 9/1996 | Lee et al. .................... 327/105 |
| 5,614,855 A | 3/1997 | Lee et al. .................... 327/158 |
| 5,635,995 A | 6/1997 | Strolle et al. ............... 348/727 |
| 5,684,421 A | 11/1997 | Chapman et al. ........... 327/261 |
| 5,731,727 A | 3/1998 | Iwamoto et al. ............ 327/281 |

(Continued)

FOREIGN PATENT DOCUMENTS

| JP | 02000035831 A | 2/2000 |
| WO | WO 01/29680 A1 | 4/2001 |
| WO | WO 02/11355 A1 | 2/2002 |

OTHER PUBLICATIONS

John G. Maneatis, "Low–Jitter Process–Independent DLL and PLL Based on Self–Biased Techniques", IEEE Journal of Solid–State Circuits, vol. 31, No. 11, Nov. 1996, pp. 1723–1732.

Bang–Sup Song and David C. Soo, "NRZ Timing Recovery Technique For Band–Limited Channels", IEEE Journal of Solid–State Circuits, vol. 32, No. 4, Apr. 1997, pp. 514–520.

John Poulton, "Signalling in High–Performance Memory Systems", ISSCC, 1999, pp. 1–59.

Gu–Yeon Wei et al., "A Variable–Frequency Parallel I/O Interface with Adaptive Power Supply Regulation", IEEE Journal of Solid–State Circuits, vol. 35, No. 11, Nov. 2000, pp. 1600–1609.

Stefanos Sidiropoulos et al., "Circuit Design for a 2.2GB/s Memory Interface", 2001 IEEE International Solid–State Circuits Conference, Digest of Technical Papers, pp. 70–71.

*Primary Examiner*—Linh My Nguyen
(74) *Attorney, Agent, or Firm*—Vierra Magen Marcus Harmon & DeNiro LLP

(57) ABSTRACT

An integrated circuit device having a select circuit, a summing circuit and a phase mixer. The select circuit selects one of a plurality of offset values as a selected offset. The summing circuit sums the selected offset with a phase count value, the phase count value indicating a phase difference between a reference clock signal and a first plurality of clock signals. The phase mixer combines the first plurality of clock signals in accordance with the sum of the selected offset and the phase count value to generate an output clock signal.

27 Claims, 21 Drawing Sheets

U.S. PATENT DOCUMENTS

| | | |
|---|---|---|
| 5,742,798 A | 4/1998 | Goldrian .................... 395/551 |
| 5,852,378 A | 12/1998 | Keeth ........................ 327/171 |
| 5,880,612 A | 3/1999 | Kim ............................ 327/158 |
| 5,883,533 A | 3/1999 | Matsuda et al. ............ 327/156 |
| 5,889,423 A | 3/1999 | Trumpp ...................... 327/298 |
| 5,892,981 A | 4/1999 | Wiggers ...................... 395/878 |
| 5,920,518 A | 7/1999 | Harrison et al. ............ 365/233 |
| 5,940,608 A | 8/1999 | Manning .................... 395/558 |
| 5,940,609 A | 8/1999 | Harrison .................... 395/558 |
| 5,945,862 A | 8/1999 | Donnelly et al. ........... 327/278 |
| 5,946,244 A | 8/1999 | Manning .................... 365/194 |
| 5,963,502 A | 10/1999 | Watanabe ................... 365/233 |
| 6,011,732 A | 1/2000 | Harrison et al. ............ 365/233 |
| 6,016,282 A | 1/2000 | Keeth ........................ 365/194 |
| 6,026,050 A | 2/2000 | Baker et al. ................ 365/233 |
| 6,026,051 A | 2/2000 | Keeth et al. ................ 365/233 |
| 6,029,250 A | 2/2000 | Keeth ........................ 365/233 |
| 6,029,252 A | 2/2000 | Manning .................... 713/400 |
| 6,031,788 A | 2/2000 | Bando et al. ............... 365/233 |
| 6,043,717 A | 3/2000 | Kurd ............................ 331/17 |
| 6,047,346 A | 4/2000 | Lau et al. ................... 713/556 |
| 6,085,284 A | 7/2000 | Farmwald et al. ........... 711/105 |
| 6,101,197 A | 8/2000 | Keeth et al. ................ 370/517 |
| 6,101,612 A | 8/2000 | Jeddeloh .................... 713/401 |
| 6,104,228 A | 8/2000 | Lakshmikumar ............ 327/407 |
| 6,108,795 A | 8/2000 | Jeddeloh .................... 713/401 |
| 6,125,157 A | 9/2000 | Donnelly et al. ........... 375/371 |
| 6,133,773 A | 10/2000 | Garlepp et al. ............. 327/247 |
| 6,198,356 B1 | 3/2001 | Visocchi et al. .............. 331/34 |
| 6,255,912 B1 | 7/2001 | Laub et al. ................... 331/25 |
| 6,304,116 B1 | 10/2001 | Yoon et al. ................. 327/158 |
| 6,321,282 B1 | 11/2001 | Horowitz et al. ........... 710/104 |
| 6,373,308 B1 | 4/2002 | Nguyen ...................... 327/161 |
| 6,437,619 B2 | 8/2002 | Okuda et al. ............... 327/158 |
| 6,469,555 B1 | 10/2002 | Lau et al. ................... 327/158 |
| 6,470,060 B1 | 10/2002 | Harrison .................... 375/374 |
| 6,483,360 B2 | 11/2002 | Nakamura .................. 327/158 |
| 6,504,438 B1 | 1/2003 | Chang et al. ................. 331/17 |
| 6,566,924 B2 * | 5/2003 | Lin et al. .................... 327/160 |
| 6,580,305 B1 | 6/2003 | Liu et al. .................... 327/298 |
| 6,696,875 B1 * | 2/2004 | Arkas et al. ................ 327/277 |
| 6,759,881 B2 | 7/2004 | Kizer et al. ................. 327/147 |
| 6,784,714 B2 | 8/2004 | Nakamura .................. 327/271 |
| 2001/0053187 A1 | 12/2001 | Simon et al. ............... 375/257 |
| 2002/0084857 A1 | 7/2002 | Kim ............................ 331/60 |
| 2002/0140472 A1 | 10/2002 | Sonabe ...................... 327/158 |

\* cited by examiner

FIG. 4

SYSTEM WITH PHASE JUMPING LOCKED LOOP CIRCUIT

CROSS-REFERENCE TO RELATED APPLICATIONS

This application is a continuation of U.S. patent application Ser. No. 10/374,390, filed Feb. 25, 2003 (now U.S. Pat. No. 6,759,881), which is a continuation-in-part of U.S. patent application Ser. No. 10/104,230, filed Mar. 22, 2002, and claims the benefit of U.S. Provisional Application No. 60/408,063, filed Sep. 3, 2002, U.S. Provisional Application No. 60/408,101 filed Sep. 3, 2002, and U.S. Provisional Application No. 60/436,745 filed Dec. 27, 2002. Each of U.S. Provisional Application Nos. 60/408,063, 60/408,101 and 60/436,745 is hereby incorporated by reference in its entirety.

FIELD OF THE INVENTION

The present invention relates generally to the field of high-speed signaling, and more particularly to timing signal generation within a delay-locked loop or phase-locked loop circuit.

BACKGROUND

Delay-locked loop (DLL) circuits are often used in high-speed signaling systems to generate signals for precisely timing sampling and transmission events within input/output circuits. FIG. 1 illustrates a prior-art delay-locked loop (DLL) circuit 100 that includes a reference loop 101, tracking loop 103 and clock generator 105. A complementary pair of reference clock signals, CLK and /CLK (102 and 104), are supplied to the reference loop 101 which, in turn, generates eight incrementally delayed clock signals 122, $t_0$–$t_3$ and /$t_0$–/$t_3$, referred to as phase vectors. Ideally the phase vectors are evenly phase-spaced within a time interval that corresponds to a cycle of the reference clock signal 102 such that a 45° phase offset separates each phase-adjacent pair of phase vectors. The tracking loop 123 includes a mixer 117, clock tree circuit 119 and phase detector 115 which cooperate to generate a feedback clock signal 112 that is phase aligned with the reference clock signal 102. The mixer 117 receives the phase vectors 122 from the reference loop 101 and interpolates between a selected pair of the phase vectors to generate a mix clock signal 110. The mix clock signal 110 propagates through the clock tree circuit 119 (typically a set of amplifiers used to generate multiple instances of the mix clock signal 110) to generate the feedback clock signal 112. The phase detector 115 compares the feedback clock signal 112 with the reference clock signal 102 and generates a phase adjust signal 106 (U/D) according to which clock signal leads the other. For example, if the reference clock 102 signal leads the feedback clock signal 112, the phase detector 115 signals the mixer 117 (i.e., by appropriate state of the phase adjust signal) to shift interpolation toward the leading one of the selected phase vectors and away from the trailing phase vector, thereby advancing the phase of the feedback clock 112 and reducing the phase difference between the reference and feedback clock signals. If the reference clock signal 112 still leads (or lags) the feedback clock signal after interpolation has been shifted completely to one of the selected phase vectors, a different pair of phase vectors (i.e., bounding an adjacent phase range) is selected by the mixer 117. The DLL circuit 100 achieves phase lock when the phase of the feedback clock signal 112 becomes aligned with the phase of the reference clock signal 102.

The clock generator 105 includes a mixer 121 and clock tree circuit 123 that mirror the operation of the mixer 117 and clock tree circuit 119 within the tracking loop 103 to generate a local clock signal 116 (LCLK). The mixer 121 receives the phase adjust signal 106 generated within the mix loop 103 and therefore, when an offset control value 108 (OFFSET) is zero, performs nominally the same interpolation operation on the same pair of selected vectors as the mixer 117. Ideally, as the adjust signal 106 is incremented and decremented, the mixer 121 tracks the operation of the mixer 117 such that the local clock signal 116 and the feedback 112 are phase aligned. The offset control value 106 is summed with a count value maintained within the mixer 121 to provide a controlled, adjustable offset between the local clock signal 116 and reference clock signal 112, thereby allowing compensation for skew between the reference clock signal and a sampling instant, transmit instant or other event to be timed by the local clock signal 116.

FIG. 2 illustrates a prior-art phase mixer 121 in greater detail. The mixer 121 includes a counter 139, adder 141, bias voltage generator 143, and a bank of differential amplifiers 151. Each of the differential amplifiers 151 is formed by a pair of differentially coupled transistors having gate terminals coupled to receive a respective pair of complementary phase vectors, source terminals coupled to the drain terminal of a corresponding biasing transistor 153, and drain terminals coupled to a mix clock line 116 and complement mix clock line 118, respectively. The mix clock line 116 and complement mix clock lines are pulled up to a supply voltage via respective resistive elements, R. By this arrangement, when a given one of the biasing transistors 153 is biased to a current conducting state, the corresponding differential amplifier is enabled to draw current via resistive elements R in accordance with the input phase vectors, thereby causing the phase vector and its complement to appear on the complement mix clock line 118 and mix clock line 116 as a mix clock signal (MCLK) and complement mix clock signal (/MCLK), respectively. When two of the biasing transistors 153 are biased to a current conducting state, the input phase vectors supplied to the corresponding differential amplifiers are each enabled to contribute to the mix clock signal. The mix clock signal will initially slew (i.e., transition between states) at a rate determined by a leading one of the input phase vectors and then, after the trailing vector begins to transition, at a rate determined by the sum of the leading and trailing phase vectors, thereby yielding a mix clock signal phase that lies between the leading and trailing vectors according to the relative bias currents drawn by the biasing transistors 153.

The counter 171 is incremented and decremented in response to the phase adjust signal 106, and summed with the offset value 108 in adder circuit 141 to generate a phase control word 142. The phase control word 142 is decoded by decode logic 145 within the bias voltage generator 143 to generate a complementary pair of bias words 146 which are supplied to a digital-to-analog converter (DAC) 147. The most significant three bits of the complementary control values 146 indicate one of eight phase-adjacent pairs of phase vectors to be mixed to generate the mix clock signal, MCLK, and corresponding complementary phase vectors to be mixed to generate the complementary mix clock signal, /MCLK. Thus, the DAC 147 generates bias voltages on bias lines 154 in response to the complementary control values 146, such that at most two of the biasing transistors 153 are enabled at any given time, all other biasing transistors 153 being placed in a non-conducting state. As the count value is incremented by the counter, the bias voltage applied to one of the two enabled biasing transistors is increased, increasing the contribution of the corresponding phase vector to phase of the mix clock signal, and the bias voltage applied to the other selected biasing transistor is decreased, decreasing the contribution of the corresponding phase vector to the mix clock signal. Thus, as the count value is incremented and decremented, the phase of the mix clock signal is correspondingly advanced and delayed.

Because of the relatively small voltage steps generated by the DAC 147 and the high impedance load presented by the gates of biasing transistors 153, substantial time is typically required for each stepwise change in the output of DAC 147 to settle and produce a stable mix clock signal. Also, noise on the bias voltage lines 154 tends to produce phase jitter in the mix clock signals 116 and 118 so that capacitive elements are typically coupled to the bias voltage lines 154 as illustrated by (i.e., as illustrated by capacitive element, C, in FIG. 2). Unfortunately, capacitive loading of the bias voltage lines 154 further increases the time required for the lines 154 to settle in response to an increase or decrease of the bias voltage. Additionally, significant changes in the RC time constant result from process variations and from changes in temperature and voltage, making it difficult to quantify or predict the worst case settling time for the bias voltage lines 154. Consequently, several cycles of the reference clock signal are typically required for the phase of the output clock signal to stabilize in response to each bias voltage change. This is a significant disadvantage of the mixer 121, as a relatively long time is typically required to perform a phase locking operation in which numerous successive phase steps are needed to reach phase lock. The ability to rapidly switch between phase offsets in response to changes in the offset control value 108 is similarly limited by the DAC settling time.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4 illustrates a phase-jumping mixer according to an embodiment of the invention;

DETAILED DESCRIPTION

Figure 1:
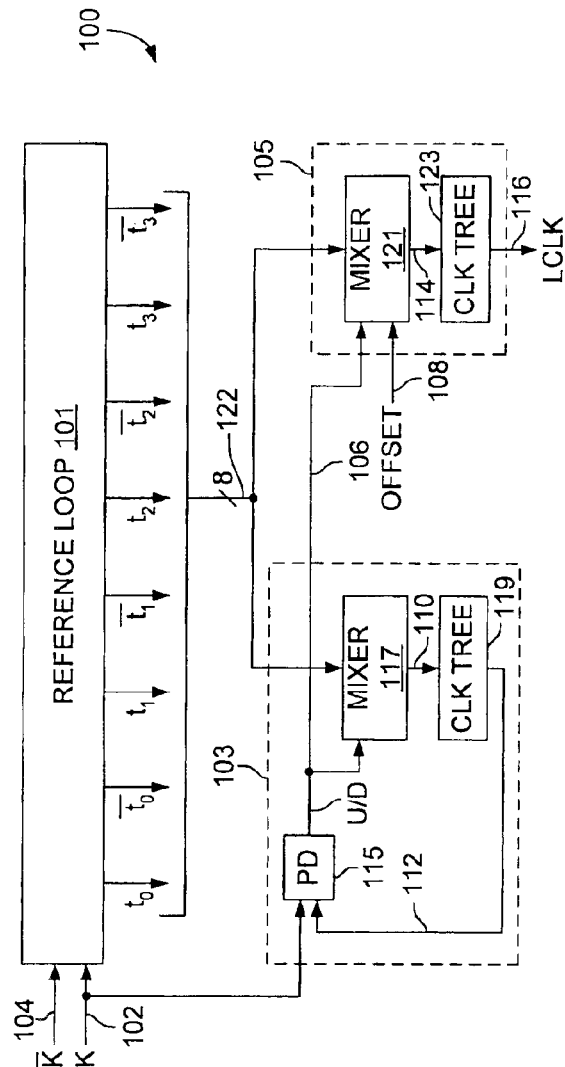
FIG. 1 illustrates a prior art delay-locked loop circuit.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signal name>') is also used to indicate an active low signal.

Phase Jumping Locked Loop

A locked loop circuit that enables rapid output clock phase changes, referred to herein as "phase jumping," is disclosed in various embodiments. In one embodiment, the locked loop circuit includes one or more phase-jumping mixers to enable rapid mixing of selected phase vector pairs. Each phase jumping mixer includes a bank of switch-selectable differential amplifiers coupled in series with a digitally-controlled current source. The digitally-controlled current source may be rapidly switched between different biasing levels to achieve rapid phase transitions (i.e., phase jumps) in a resultant, mix clock signal. In one embodiment, synchronizing elements are provided to ensure that digital control signals used to bias the digitally-controlled current source transition in synchronism (or substantially in synchronism), thereby reducing switching noise that otherwise may produce jitter in the mix clock signal. Also, in one embodiment, process-, voltage- and temperature-tracking control signals are generated within a reference loop of the locked loop circuit and used to maintain a desired slew rate and/or amplitude of the signals that are combined to generate the mix clock signal, thereby maintaining phase step linearity despite process variations and changes in voltage and temperature.

Overview of a Locked Loop Circuit According to an Embodiment of the Invention

Figure 3:
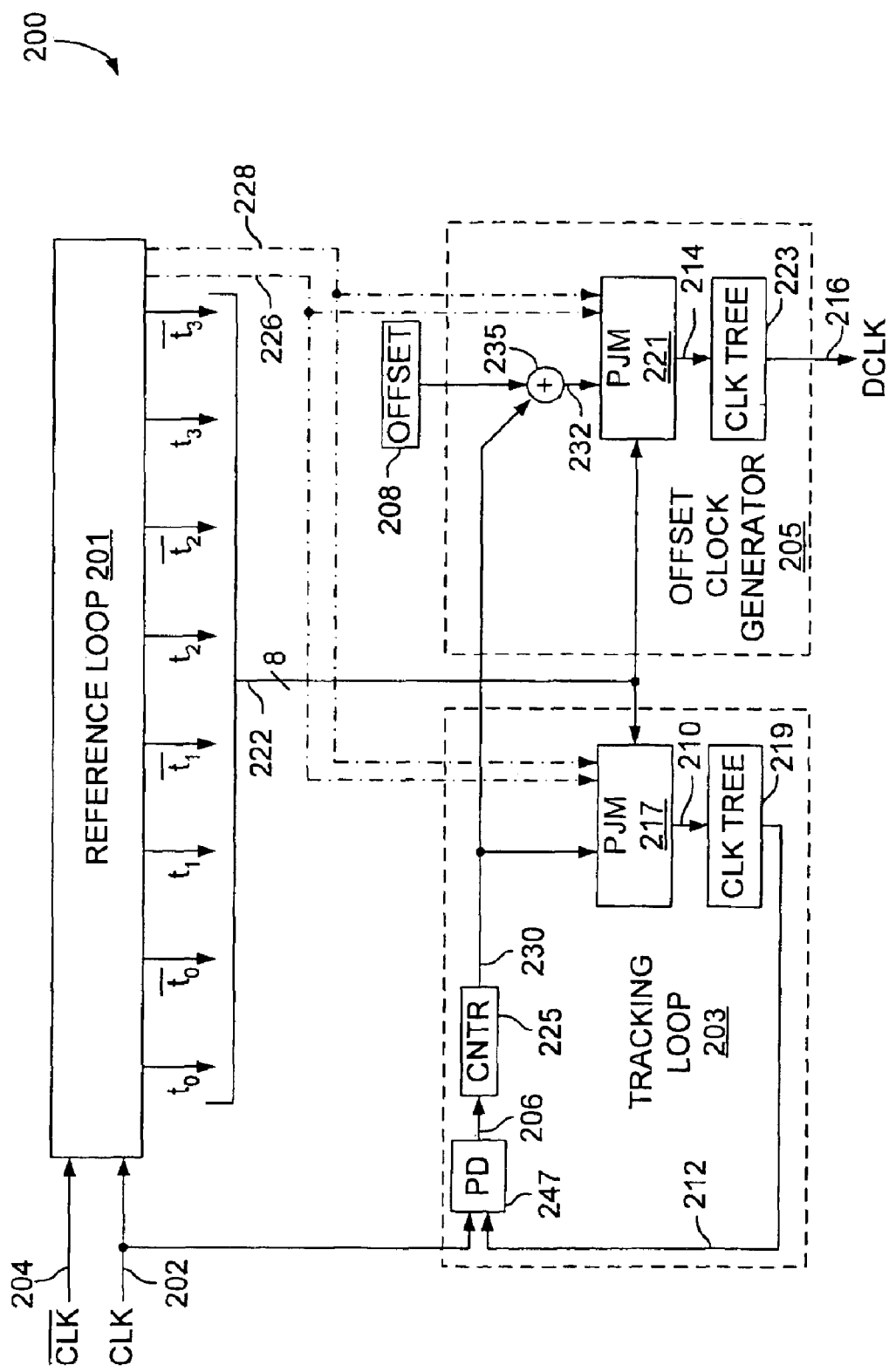
FIG. 3 illustrates a phase-jumping locked loop circuit according to an embodiment of the invention.

FIG. 3 illustrates a phase-jumping locked loop (PJLL) circuit 200 according to an embodiment of the invention. The locked loop circuit 200 includes a reference loop 201, tracking loop 203 and offset clock generator 205. Complementary reference clock signals 202 and 204 are input to the reference loop where they propagate through a series of delay elements to produce a set of substantially evenly spaced phase vectors 222 (note that even spacing between phase vectors is not required; the phase vectors may be unevenly spaced in alternative embodiments). The reference loop 201 outputs the phase vectors 222 to respective phase jumping mixers 217 and 221 within the tracking loop 203 and offset clock generator 205. In the embodiment of FIG. 3, the reference loop generates eight phase vectors, spaced evenly at 45° phase intervals over a cycle time of the reference clock signal. In alternative embodiments, more or fewer phase vectors may be generated by the reference loop 201 (and used in downstream circuits such as mixers 217 and 221) such that the phase range between adjacent phase vectors is less than or greater than 45°. In one embodiment, the reference loop 201 outputs a slew control signal 226 and amplitude control signal 228 to the phase-jumping mixers 217 and 221 to maintain substantially linear phase mixing and output clock amplitude through changes in voltage and temperature, and over fast and slow process corners.

The tracking loop 203 includes a clock tree circuit 219, phase detector 247 and phase counter 225, along with the phase-jumping mixer 217. A mix clock signal 210 generated by the phase-jumping mixer propagates through the clock tree circuit 219 to generate a feedback clock signal 212 which is provided, in turn, to the phase detector 247. The phase detector 247 compares the feedback clock signal to the reference clock signal 202 and outputs a phase adjust signal 206 to the phase counter 225 according to which of the clock signals 202 and 204 leads the other. The phase counter 225 increments and decrements a phase count value 230 in response to the phase adjust signal 206. The phase count value 230 represents a phase offset between a selected one of the phase vectors 222 (e.g., one of the phase vectors designated to be a 0° vector) and the reference clock signal 202, and is supplied to the phase jumping mixer 217 and to the offset clock generator 205. The phase-jumping mixer 217 selects and interpolates between a pair of phase vectors according to the phase count value, thereby advancing or retarding the phase of the mix clock signal 210 in response to decreases and increases in the phase count value 230. Thus, the phase detector 247, phase counter 225, and phase jumping mixer 217 form a closed-loop, negative-feedback circuit that adjusts the phase of the feedback clock signal 212 as necessary to reduce the phase difference between the feedback clock signal 212 and the reference clock signal 202.

The offset clock generator includes a phase jumping mixer 221, clock tree 223 and adder 235. The adder 235 generates a phase control word 232 by summing the phase count value 230 from the tracking loop 203 with an offset control value 208 (OFFSET). In one embodiment, the offset control value 208 is supplied by other logic within the integrated circuit that contains the locked loop circuit 200 (e.g., a configuration register or bank of configuration registers). Alternatively, the offset control value 208 may be received from an external source. In one embodiment, the phase jumping mixer 221 is implemented in the same manner as the phase jumping mixer 217 so that, when the phase control word 232 matches the phase count value 230 (i.e., when the offset control value 208 is zero), the phase-jumping mixer 221 generates a mix clock signal 214 having substantially the same phase as the mix clock signal 210 generated within the tracking loop 203. The mix clock signal 214 is output to the clock tree circuit 223 which, in turn, generates multiple instances of a device clock signal 216 (DCLK). In one embodiment, the clock tree circuit 219 within the tracking loop 203 is implemented in the same manner as the clock tree circuit 223 within the offset clock generator 205 so that substantially equal delays are produced within the clock tree circuits 219 and 223. Accordingly, in the case of a zero-valued offset control value 208, the feedback clock signal 212 and device clock signal 216 are substantially aligned in phase. In an alternative embodiment in which multiple instances of the device clock signal 216 are not required (e.g., the number of circuit elements clocked by the device clock signal 216 is relatively small), the clock tree circuits 219 and 223 may be omitted.

Phase Jumping Mixer

Figure 4:
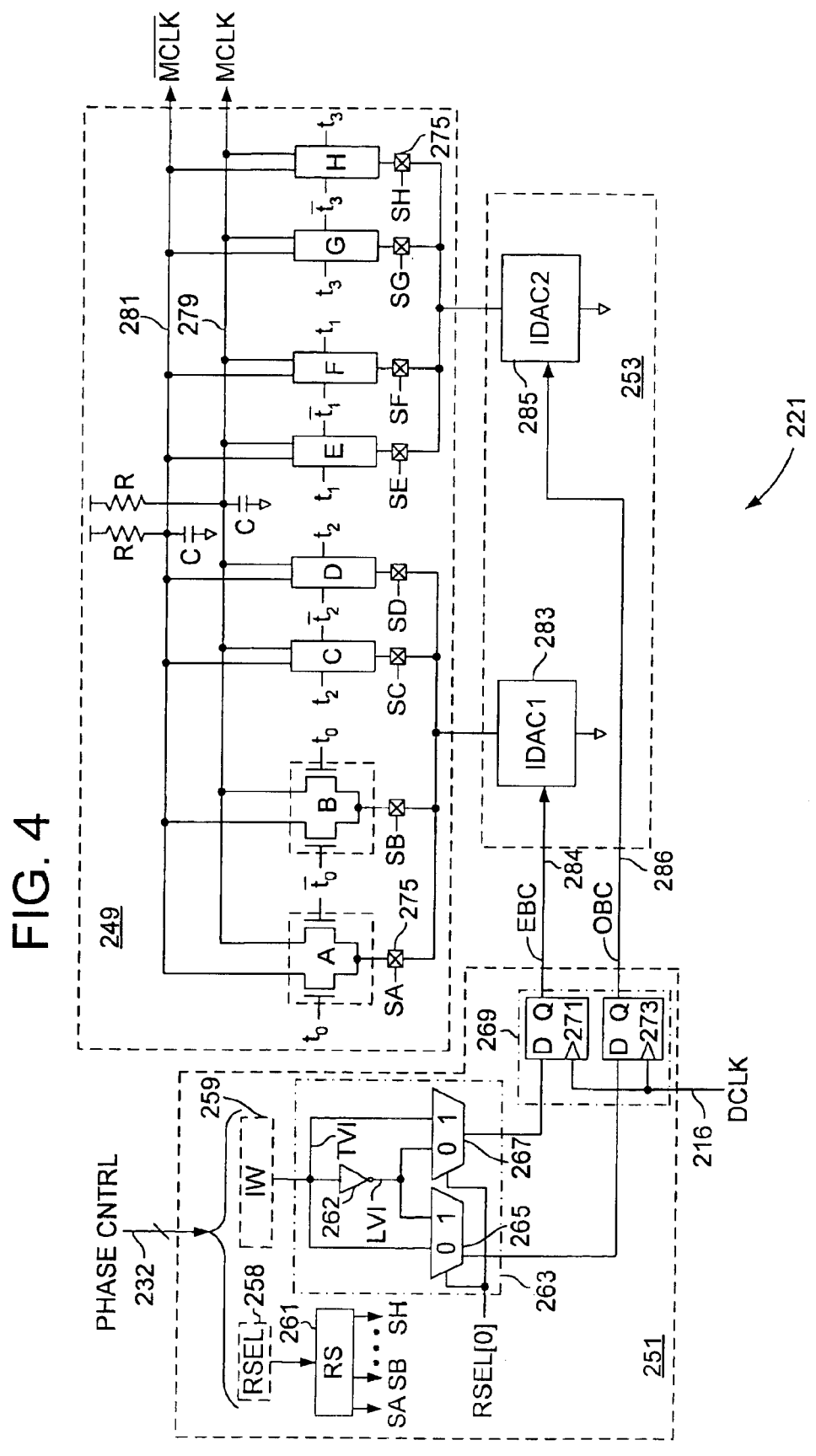

FIG. 4 illustrates the phase jumping mixer 221 according to an embodiment of the invention (phase jumping mixer 217 may be implemented in the same manner as mixer 221). The mixer 221 includes a bank of switch-selectable differential amplifiers 249, mix logic 251, and amplifier biasing circuit 253. The amplifier bank 249 includes eight differential amplifiers, A, B, C, D, E and H, each formed by a pair of transistors having drain terminals coupled respectively to a mix clock line 279 and complement mix clock line 281, and source terminals coupled in common to a corresponding one of eight switch elements 275. It should be noted that the number of differential amplifiers (and switch elements) corresponds to the number of phase vectors generated by the reference loop (i.e., element 201 of FIG. 3) and therefore may be higher or lower in alternative embodiments. Also, in alternative embodiments the number of differential amplifiers may be different from the number of switch elements (e.g., in an application in which the number of phase vectors is different from the number of differential amplifiers).

The mix clock line 279 and complement mix clock line 281 are pulled up to a predetermined reference voltage (supply voltage, VDD, in this example) by respective resistive elements, R. In the exemplary embodiment of FIG. 4, the rightmost transistor within each differential amplifier A–H is coupled to the mix clock line 279 and is referred to herein as the mix transistor, while the leftmost transistor is coupled to the complement mix clock line 281 and referred to as the complement mix transistor. Each of the mix transistors within the differential amplifiers A–H is coupled to receive a respective one of eight phase vectors from a reference loop, thereby allowing each of the eight phase vectors to be selected to be mixed into the mix clock signal, MCLK and complement mix clock signal, /MCLK. Each of the complement mix transistors is coupled to receive a phase vector that is the complement of the phase vector input to the corresponding mix transistor. By this arrangement, whenever a given phase vector is selected to be mixed into the mix clock signal, the complement phase vector is selected to be mixed into the complement mix clock signal.

In one embodiment, the switch elements 275 are transistor switches (e.g., MOS transistors) having control terminals coupled to receive respective amplifier select signals, SA–SH, from the mix control logic 251. When a given control signal, SA–SH, is asserted, the switching transistor coupled to receive the asserted signal is switched on, coupling the corresponding differential amplifier to the amplifier biasing circuit 253. Switch elements 275 controlled by amplifier select signals SA–SD are coupled between differential amplifiers A–D, respectively, and an even-phase bias circuit 283 within the amplifier biasing circuit 253, while switch elements 275 controlled by amplifier select signals SE–SH are coupled between differential amplifiers E–H and an odd-phase bias circuit 285 within the amplifier biasing circuit 253. By this arrangement, a selected one of amplifier select signals SA–SD may be asserted to enable a corresponding one of differential amplifiers A–D to contribute to generation of the mix clock signal and complement mix clock signal, while the others of the amplifier select signals are deasserted to disable the corresponding differential amplifiers from participating in the phase mixing operation. Similarly, a selected one of amplifier select signals SE–SH may be switched on to enable a corresponding one of differential amplifiers E–H to contribute to generation of the mix clock signal and complement mix clock signal, while the others of the amplifier select signals SE–SH are deasserted to disable the corresponding differential amplifiers.

The mix logic 251 receives the phase control word 232 (e.g., from adder 235 of FIG. 3) and includes a range selector 261, bias word generator 263, and bias word synchronizer 269. In one embodiment, the most significant M bits of the phase control word 232 constitute a range select value 258 (RSEL) and the remaining bits constitute an interpolation weight 259 (IW). In the embodiment of FIG. 4, the range select value 258 is a three-bit value in which each of the eight possible bit patterns corresponds to one of eight phase ranges (i.e., octants) bounded by a respective pair of phase-adjacent phase vectors. The range select value 258 is input to the range selector 261 which decodes the range select value 258 to generate the amplifier select signals, SA–SH. The following table illustrates the correspondence between the range select value 258 and amplifier select signals, SA–SH, in an exemplary embodiment of the range selector 261:

TABLE 1

| RSEL | SA | SB | SC | SD | SE | SF | SG | SH |
|------|----|----|----|----|----|----|----|----|
| 000  | 1  | 0  | 0  | 0  | 1  | 0  | 0  | 0  |
| 001  | 0  | 0  | 1  | 0  | 1  | 0  | 0  | 0  |
| 010  | 0  | 0  | 1  | 0  | 0  | 0  | 1  | 0  |
| 011  | 0  | 1  | 0  | 0  | 0  | 0  | 1  | 0  |
| 100  | 0  | 1  | 0  | 0  | 0  | 1  | 0  | 0  |
| 101  | 0  | 0  | 0  | 1  | 0  | 1  | 0  | 0  |
| 110  | 0  | 0  | 0  | 1  | 0  | 0  | 0  | 1  |
| 111  | 1  | 0  | 0  | 0  | 0  | 0  | 0  | 1  |

Figure 5:
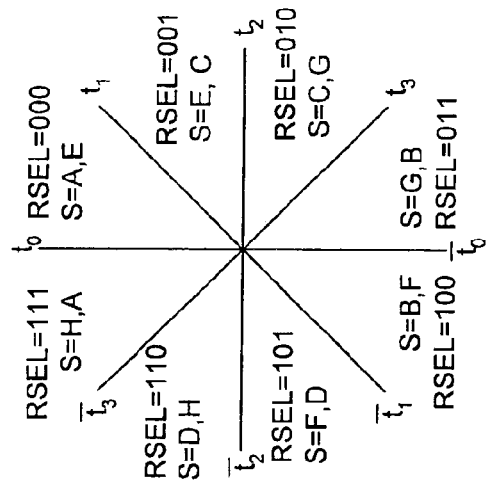
FIG. 5 illustrates the correspondence between range select values, phase vectors and mix-enabled differential amplifiers in the phase-jumping mixer of FIG. 4.

FIG. 5 illustrates the correspondence between range select values, phase vectors and mix-enabled differential amplifiers (i.e., differential amplifiers enabled to contribute to the mix clock signals, MCLK and /MCLK) in the mixer embodiment of FIG. 4. As an example, when the range select value 258 is zero (000), amplifier select signals SA and SE are asserted (i.e., to a logic high state), thereby enabling amplifiers A and E to contribute to generation of the mix clock signal and complement mix clock signal. In such a state, phase vectors t0 and t1 are mixed according to the bias currents drawn by biasing circuits 283 and 285 to generate the mix clock signal, MCLK; and phase vectors /t0 and /t1 are mixed to generate the complement mix clock signal /MCLK. All other amplifier select signals are driven low (as illustrated above in Table 1), thereby disabling amplifiers B, C, D, F, G and H. Rotating through the selectable phase ranges, differential amplifiers E and C are enabled (and all others disabled) when the range select value 258 is 1 (001), selecting phase vectors t1 and t2 to be mixed to generate the mix clock signal, and vectors /t1 and /t2 to be mixed to generate the complement mix clock signal; differential amplifiers C and G are enabled when the range select value 258 is 2 (010), selecting phase vectors t2 and t3 to be mixed to generate the mix clock signal and phase vectors /t2 and /t3 to be mixed to generate the complement mix clock signal; differential amplifiers G and B are enabled when the range select value 258 is 3 (011), selecting phase vectors t3 and /t0 to be mixed to generate the mix clock signal, and phase vectors /t3 and t0 to be mixed to generate the complement mix clock signal; differential amplifiers B and F are enabled when the range select value 258 is 4 (100), selecting phase vectors /t0 and /t1 to be mixed to generate the mix clock signal, and phase vectors t0 and t1 to be mixed to generate the complement mix clock signal; differential amplifiers F and D are enabled when the range select value 258 is 5 (101), selecting phase vectors /t1 and /t2 to be mixed to generate the mix clock signal, and phase vectors t1 and t2 to be mixed to generate the complement mix clock signal; differential amplifiers D and H are enabled when the range select value 258 is 6 (110), selecting phase vectors /t2 and /t3 to be mixed to generate the mix clock signal, and phase vectors t2 and t3 to be mixed to generate the complement mix clock signal; and differential amplifiers H and A are enabled when the range select value 258 is 7 (111), selecting phase vectors /t3 and t0 to be mixed to generate the mix clock signal, and phase vectors t3 and /0 to be mixed to generate the complement mix clock signal.

Reflecting on the phase diagram of FIG. 5, it can be recognized that for each selectable phase range, an even numbered phase vector (i.e., t0, t2, /t0, or /t2) is mixed with an odd numbered phase vector (i.e., t1, t3, /t1, or /t3). Thus, referring again to FIG. 4, because all but a selected one of the even-phase differential amplifiers (A, B, C, D) is decoupled from the amplifier biasing circuit 253 at a given time (i.e., by opening selected switches 275) and all but one of the odd-phase differential amplifiers (E, F, G, H) is decoupled from the amplifier biasing circuit 253 at a given time, the total number of component bias circuits required within the amplifier biasing circuit 253 is reduced by a factor of four. That is, because only one of the even-phase differential amplifiers is selected at a time, a single even-phase bias circuit may be shared by the four even-phase differential amplifiers. Similarly, a single odd-phase bias circuit may be shared by the four odd-phase differential amplifiers. As discussed below, each of the component bias circuits 283, 285 within the amplifier biasing circuit 253 is formed by multiple, digitally controlled biasing transistors and therefore is substantially larger than the single-transistor biasing circuits used in the prior-art arrangement of FIG. 2 (i.e., transistors 153). Thus, the sharing of component bias circuits 283, 285 among multiple differential amplifiers A–D and E–H significantly reduces the total area consumed by the amplifier biasing circuit 253, making the digitally controlled, multi-transistor biasing circuits more feasible than if a dedicated component biasing circuit was required for each differential amplifier within amplifier bank 249.

Referring again to the mix logic 251, the interpolation weight 259 is input to an inverter 262 to generate a complement interpolation weight, with both the interpolation weight and complement interpolation weight being supplied to respective inputs of multiplexers 265 and 267. In one embodiment, the complement interpolation weight is used to bias a differential amplifier coupled to receive the leading phase vector for a selected phase range, and therefore constitutes a leading-vector interpolation weight, LVI. Conversely, the uncomplemented interpolation weight is used to bias a differential amplifier coupled to receive the trailing phase vector for the selected phase range, and therefore constitutes a trailing-vector interpolation weight, TVI. The selection of trailing- and leading-vector interpolation weights is made by the multiplexers 265, 267 in response to the least significant bit (LSB) of the range select signal, which indicates whether the leading phase vector for a selected phase range is an even or odd phase vector. Thus, when the trailing phase vector for a selected phase range is an odd phase vector (i.e., the range select value 258 is 0, 2, 4 or 6), TVI is output by multiplexer 265 as an odd-phase bias control word, OBC, and LVI is output by multiplexer 267 as an even-phase bias control word, EBC. Conversely, when the trailing phase vector for a selected phase range is an even phase vector (i.e., the range select value 258 is 1, 3, 5 or 7), TVI is output by multiplexer 267 as the even-phase bias control word, EBC, and LVI is output by multiplexer 265 as the odd-phase bias control word, OBC. By this arrangement, as the interpolation weight 259 is incremented from zero to a maximum value, interpolation is shifted from the leading phase vector to the trailing phase vector, interpolation being shifted entirely to the trailing phase vector when the interpolation weight 259 reaches a maximum value (i.e., LVI=0 so that the leading phase vector does not contribute to the pahse of the mix clock signal). When the interpolation weight rolls over from a maximum value to zero (i.e., in response an increment indication in signal 206, or an increment in the offset control value 208), a new phase range is selected, with the trailing phase vector for the preceding phase range becoming the leading phase vector for the new phase range. By the operation of the multiplexers 265 and 267, the interpolation weight applied to the new leading phase vector is the maximum-valued LVI; the same weight as previously applied as a trailing phase vector weight (maximum-valued TVI). Accordingly, mixing progresses smoothly through the transition between adjacent phase ranges.

The selection of trailing- and leading-vector interpolation weights as the even- and odd-phase bias control words for the embodiment of FIG. 4 is illustrated by the following table:

TABLE 2

| RSEL | OBC | EBC |
|---|---|---|
| 000 | TVI | LVI |
| 001 | LVI | TVI |
| 010 | TVI | LVI |
| 011 | LVI | TVI |
| 100 | TVI | LVI |
| 101 | LVI | TVI |
| 110 | TVI | LVI |
| 111 | LVI | TVI |

The even- and odd-phase bias control words, EBC and OBC, are strobed into respective storage registers 271 and 273 within the bias word synchronizer 269 in response to the device clock signal 216 (other clock or strobe signals may be used to strobe the bias control words into the bias word synchronizer 269 in alternative embodiments). The even-phase bias control word is output from storage register 271 to the even-phase bias circuit 283 within the amplifier biasing circuit 253, and the odd-phase bias control word is output from storage register 273 to the odd-phase bias circuit 285 within the amplifier biasing circuit 253. In the embodiment of FIG. 4, the even- and odd-phase bias circuits 283 and 285 are implemented by digitally controlled current sources (current-sinking digital-to-analog converters referred to herein as current DACs) in which multiple digitally controlled, current sinking transistors are coupled in parallel with one another and in series between a switch-selected differential amplifier and a reference voltage (ground in this example). By this arrangement, each current sinking transistor within the even- and odd-phase current DACs 283 and 285 may be quickly switched on or off according to the constituent bits of the even- and odd-phase bias control words, thereby rapidly increasing or decreasing the bias current applied to a selected differential amplifier and producing a corresponding rapid phase change in the mix clock signal and complement mix clock signal. Thus, in contrast to the prior-art arrangement of FIG. 2 in which changes in DAC-generated bias voltages require significant time (e.g., multiple device clock cycles) to settle at the gates of biasing transistors 153, the current sinking transistors within the even- and odd-phase current DACs 283, 285 are rapidly switched between on and off states, without need to wait for gate voltages to settle at precise levels.

The bias word synchronizer 269 ensures that transitions of constituent bits within the even- and odd-phase bias control words, EBC and OBC, are applied to the constituent current sinking transistors within the even- and odd-phase current DACs 283 and 285 at substantially the same time, significantly reducing the phase jitter that otherwise may result from timing differences in the generation of the bias control words (e.g., due to propagation of the trailing-vector interpolation word through inverter 262). Also, because each current sinking transistor within the even- and odd-phase current DACs 283 and 285 is switched fully on or off (i.e., in contrast to the analog bias voltages used to set a precise transconductance value for transistors 153), the current DACs are substantially less susceptible to control line noise (i.e., noise on the bias control word paths 284 and 286) than in the prior-art arrangement of FIG. 2. Accordingly, the capacitive elements used to reduce noise-induced jitter in the prior-art arrangement of FIG. 2 may be omitted in the embodiment of FIG. 4, enabling more rapid transition between successive bias control words and therefore further speeding phase transitions in the mix clock signal and complement mix clock signal. The electrical lengths of the bias control word paths 284 and 286 may also be equalized (e.g., through layout symmetry, or capacitive or inductive compensation on one or both of the paths 284 and 286) to further reduce difference between arrival times of the even- and odd-phase bias control words within the even- and odd-phase current DACs 283 and 285.

Slew Control

Figure 6:
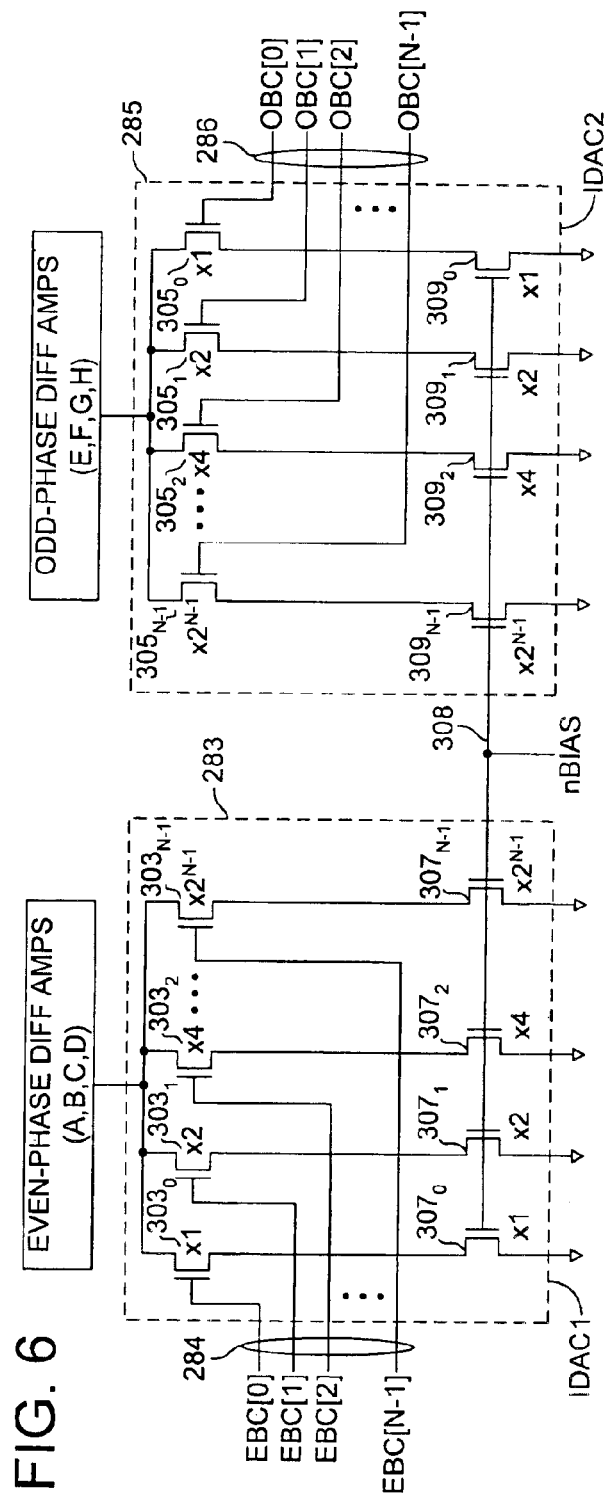
FIG. 6 illustrates the even- and odd-phase current DACs of FIG. 4 according to an embodiment of the invention.

FIG. 6 illustrates the even- and odd-phase current DACs 283 and 285 of FIG. 4 according to an embodiment of the invention. The even- and odd-phase current DACs have identical structures and each include N biasing transistors (i.e., current sinking transistors) coupled to receive a respective, constituent bit of a bias control word (i.e., EBC[i] or OBC[i], i being an integer between 0 and N−1). Each of the biasing transistors $303_0$–$303_{N-1}$ within current DAC 283 is coupled in series between a selected even-phase differential amplifier (i.e., A, B, C or D) and a reference voltage (ground in this example). Similarly, each of the biasing transistors $305_0$–$305_{N-1}$ within current DAC 285 is coupled in series between a selected odd-phase differential amplifier (i.e., E, F, G or H) and the reference voltage. Thus, when switched on, the digitally-controlled biasing transistors 303 and 305 draw current directly from a selected differential amplifier and thereby enable the phase vectors applied at the control terminals of the differential amplifier to affect the level of the mix clock lines 279 and 281. Accordingly, the current DACs 283 and 285 are referred to herein as in-line current DACs to emphasize the digitally controlled switching of biasing transistors coupled in series with the differential amplifiers within the amplifier bank 249 of FIG. 4.

In one embodiment, each of the N biasing transistors 303 within current DAC 283 (and transistors 305 within current DAC 285) is binary weighted (e.g., by transistor sizing) such that, when switched on, biasing transistor $303_0$ draws a reference current, $I_{REF}$, (indicated by the designation "×1" in FIG. 6), biasing transistor $303_1$ draws $I_{REF}$×2 (i.e., ×2 weighting), biasing transistor $303_2$ draws $I_{REF}$×4, and so forth to biasing transistor $303_{N-1}$ which, when switched on, draws $I_{REF}$×$2^{N-1}$ (i.e., ×$2^{N-1}$ weighting). Bits 0 to N−1 of the even-phase bias control word (i.e., EBC[0] to EBC[N−1]) are supplied to the gates of biasing transistors $303_0$–$303_{N-1}$, respectively. By this arrangement, the total current drawn by the biasing transistors $303_0$–$303_{N-1}$ ranges from zero to $I_{REF}$×($2^N$−1) according to the corresponding value of the even-phase bias control word, EBC[N−1:0]. Similarly, the total current drawn by the biasing transistors $305_0$–$305_{N-1}$ ranges from zero to $I_{REF}$×($2^N$−1) according to the corresponding value of the odd-phase bias control word, OBC[N−1:0].

Still referring to FIG. 6, each of binary weighted transistors $307_0$–$307_{N-1}$ is coupled in series with a respective one of the parallel-coupled biasing transistors $303_0$–$303_{N-1}$ and is biased by a steady state bias voltage, nBIAS, to establish the reference current $I_{REF}$. Each of binary weighted transistors $309_0$–$309_{N-1}$ is similarly coupled in series with a respective one of the parallel-coupled biasing transistors $305_0$–$305_{N-1}$ and biased by the nBIAS voltage. In one embodiment, each of transistors $307_0$–$307_{N-1}$ and $309_0$–$307_{N-1}$ is biased to draw a current substantially equal to its weight (i.e., ×1, ×2, ×4, etc . . . ) multiplied by $I_{REF}$ such that the total current drawn by the current DACs 283 and 285 may be linearly stepped in $I_{REF}$ increments in response to corresponding increments in the even- and odd-phase bias control words.

The nBIAS voltage level is set such that, when all the biasing transistors within a given one of current DACs 283 and 285 are switched on and all the biasing transistors within the other of the current DACs are switched off, the resulting mix clock signal slews at a desired rate. In one embodiment, the nBIAS voltage is set to an empirically determined level by a current mirroring circuit. In an alternative embodiment, described in greater detail below, the nBIAS voltage is generated within a reference loop (e.g., element 201 of FIG. 3) and reflects the voltage level required to achieve a desired slew rate within a delay element of the reference loop for a given voltage, temperature and process.

Figure 7:
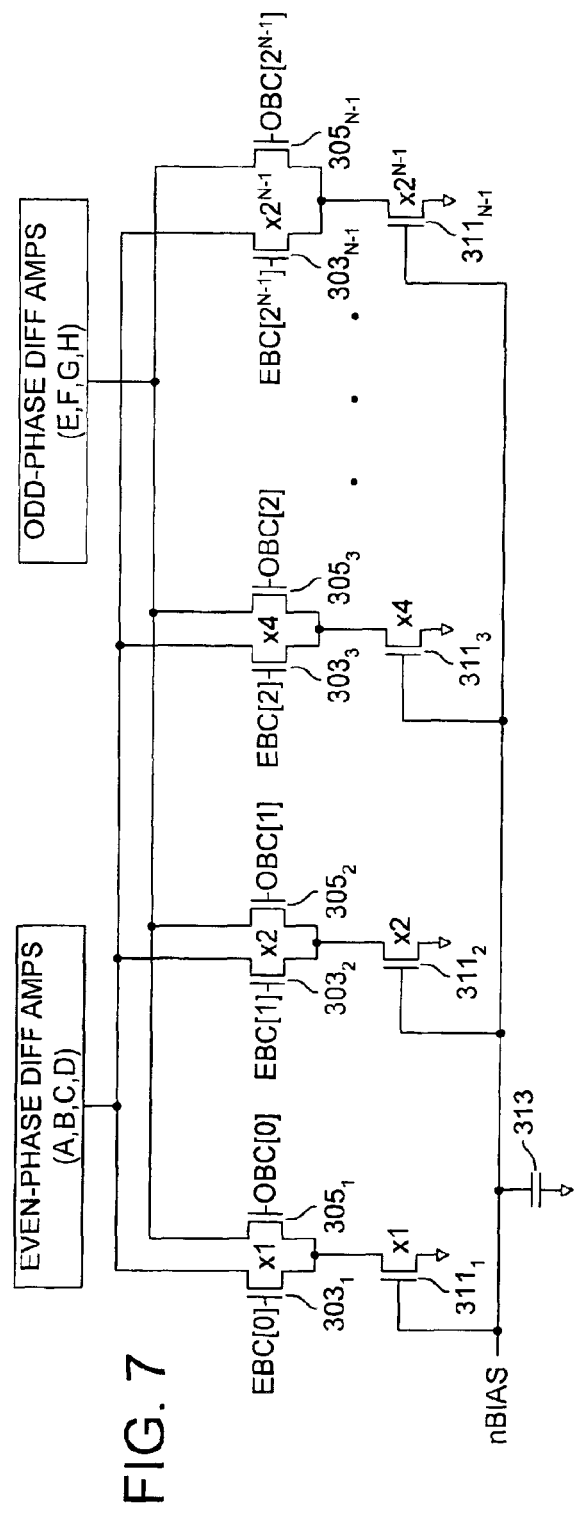
FIG. 7 illustrates an alternative amplifier biasing circuit according to an alternative embodiment of the invention.

Because the even- and odd-phase bias control words are complements of one another (i.e., due to the operation of inverter 262 of FIG. 4), when a biasing transistor 303 of a given weight is turned on within the even-phase current DAC 283, a corresponding transistor 305 (i.e., transistor having the same weight) within the odd-phase current DAC 285 is turned off, and vice-versa. This circumstance is used to advantage in an alternative amplifier biasing circuit embodiment depicted in FIG. 7. As shown, each of the even-phase and odd-phase biasing transistors 303 and 305 of a given weight are coupled differentially to one another and in series with a reference-current-setting transistor 311 of similar weight. That is, EBC[i] and OBC[i] (i representing an integer between 0 and N−1) are supplied to respective gate terminals of transistors $303_i$ and $305_i$, each of which is coupled in series between a reference-current-setting transistor $311_i$ and a respective set of differential amplifiers (i.e., even phase differential amplifiers A–D or odd-phase differential amplifiers E–H). Thus, a single set of transistors 311 is used in place of the two sets of transistors 307 and 309 of FIG. 6 to establish a reference current for both even-phase and odd-phase biasing transistors 303 and 305. By this arrangement, space is saved and any distortion due to operational differences between transistors 307 and 309 (e.g., due to temperature gradient) is avoided. Steady-state bias voltage, nBIAS is supplied via line 312 to the gate terminals of the reference-current-setting transistors 311 to establish the desired slew rate in the mix clock signal. Capacitive element 313 (or a distribution of capacitive elements) may be coupled to line 312 to reduce noise.

Figure 8:
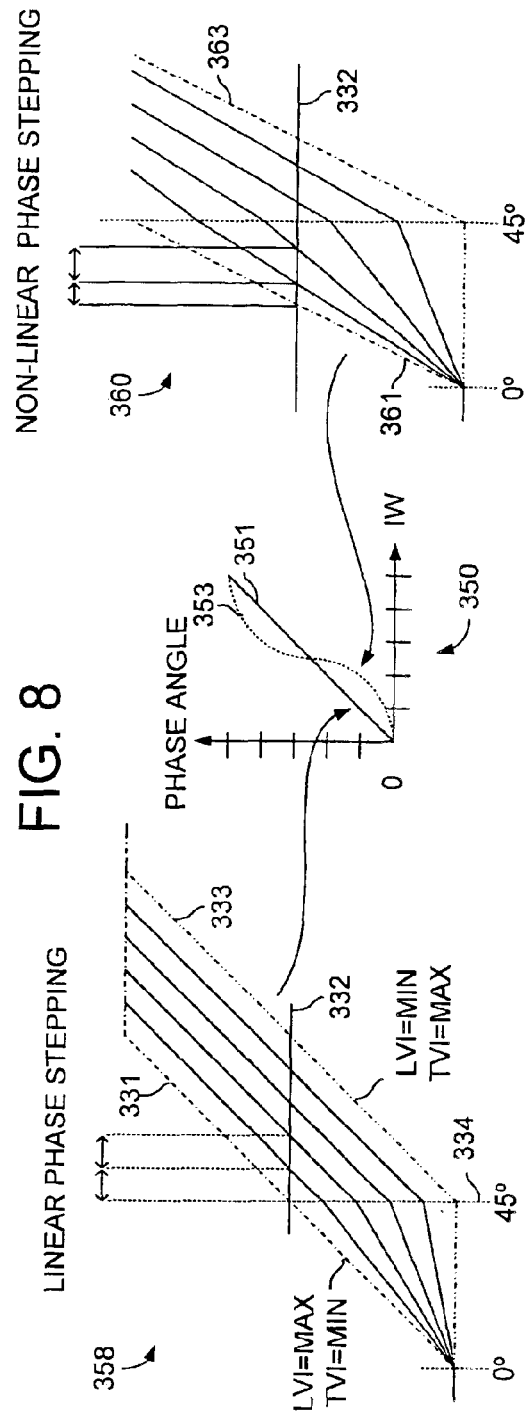
FIG. 8 illustrates the phase steps produced in a mix clock signal as the interpolation weight generated by the mix logic of FIG. 4 is incremented from zero to a maximum value.

FIG. 8 illustrates the phase steps produced in a mix clock signal as the interpolation weight generated by the mix logic 251 of FIG. 4 is incremented from zero to a maximum value. Initially, when the interpolation weight is zero, the trailing-vector interpolation weight, TVI, is at a minimum value (e.g., zero), and the leading-vector interpolation weight, LVI, is at a maximum value. Thus, the differential amplifier coupled to receive the leading phase vector is biased at full scale and the differential amplifier coupled to receive the trailing phase vector is biased at zero. Consequently, the resultant mix clock signal has a phase according to the leading phase vector and is slewed at a maximum rate determined by the current flowing through the leading-vector differential amplifier. Referring briefly to FIG. 4, it can be seen that the slew rate of the mix clock signal, dv/dt, is a function of the capacitance value of the capacitive elements (C) coupled to the mix clock lines, and the full-scale current drawn by the amplifier biasing circuit. That is, $dv/dt=I_{DAC\text{-}FULLSCALE}/C$. Thus, the full-scale current drawn by the amplifier biasing circuit 253, a value controlled by nBIAS, may be increased or decreased to produce a corresponding increase or decrease in the maximum slew rate of the mix clock signal.

When the interpolation weight is incremented, TVI is incremented and LVI decremented so that, before the trailing vector begins to transition (a time 334 indicated by the 45° line), the slew rate of the mix clock signal is incrementally lower than the maximum slew rate. That is, the current flowing through the differential amplifier is incrementally lower than the maximum current, resulting in a proportional reduction in dv/dt. At time 334, when the trailing vector begins to transition, the mix clock slew rate increases to the maximum slew rate (i.e., the sum of currents drawn by the even-phase current DAC and odd-phase current DAC equal the full-scale biasing current). Consequently, the mix clock signal, having slewed at a slightly reduced rate, crosses the midpoint voltage 332 slightly later than under the previous LVI/TVI condition, thereby achieving a stepped phase delay relative to leading-vector-driven phase 331. Thus, by incrementally reducing LVI and increasing TVI, the midpoint crossing of the mix clock signal is incrementally stepped from a leading-vector-aligned phase to a trailing-vector-aligned phase.

As discussed in reference to FIG. 3, an offset control value 208 is added to the phase count value 230 in adder 235 to establish a desired phase offset between the device clock signal 216 and the feedback clock signal 212. Because the device clock signal 216 is generated by an open loop circuit (i.e., the offset clock generator), the accuracy of the phase offset is dependent on the linearity of the mixing operation performed within the phase-jumping mixers 217 and 221. That is, any nonlinearity in the mixing operation is manifested as unequal phase steps within a given phase range, thereby producing potential phase error in the mix clock signal.

Referring to FIG. 8, it can be seen that a general requirement for mixing linearity is that the mix clock signal, when slewing at a maximum rate, not cross the mid point voltage 332 before the trailing vector begins to transition. Otherwise, as illustrated by phase step diagram 360, the contribution of the trailing vector to the mix clock slew rate (illustrated by 363) will be inconsequential for all LVI-TVI weightings in which the leading vector 361 alone produces a midpoint crossing (i.e., crossing the voltage indicated by 332) prior to the 45° time. Thus, as shown by the unequal phase steps in phase step diagram 360 and by the dashed line 353 in phase angle plot 350, distorted, non-linear mixing of the leading and trailing phase vectors is produced when the maximum mix clock slew rate is too high; a distortion referred to herein as S-curve distortion. By contrast, so long as the mix clock signal, when slewing at a maximum rate, crosses the midpoint voltage 332 when or after the trailing vector begins to transition, the phase steps will be substantially equal as shown in phase step diagram 358, producing the linear mix curve 351 shown in phase angle plot 350. If the mix clock signal slews too slowly, the overall signal swing may not reach the desired maximum and minimum voltage levels. That is, the peak-to-peak voltage of the signal swing, $V_{SWING}$, is reduced. Accordingly, by setting the full-scale DAC current (i.e., within the amplifier biasing circuit 253 of FIG. 4) such that the mix clock signal slews to the midpoint voltage 332 in a time substantially equal to the mix clock period divided by the number of selectable phase ranges, S-curve distortion may be avoided without undue reduction of $V_{SWING}$. Expressed analytically, the mix clock signal slew rate is set to $(V_{SWING}/2)/(T_{MCLK}/\#\text{Vectors})$, where $V_{SWING}$ is the desired peak-to-peak amplitude of the mix clock signal, $T_{MCLK}$ is the period of the mix clock signal, and #Vectors is the number of phase vectors used to subdivide the mix clock period.

Clock Signal Swing

Referring again to FIG. 4, it should be noted that any adjustment in the bias currents drawn by the amplifier biasing circuit 253 will produce a corresponding change in the minimum voltage level of the mix clock signal. That is, an increase in the biasing current will produce an increased voltage drop across the resistive elements, R, and a decrease in the biasing current will produce a corresponding decrease in the voltage drop. This is generally undesirable as changes in the mix clock signal swing may have disruptive consequences in downstream circuits, for example, causing distortion in conversion from small swing to complementary-MOS signaling levels.

Figure 9:
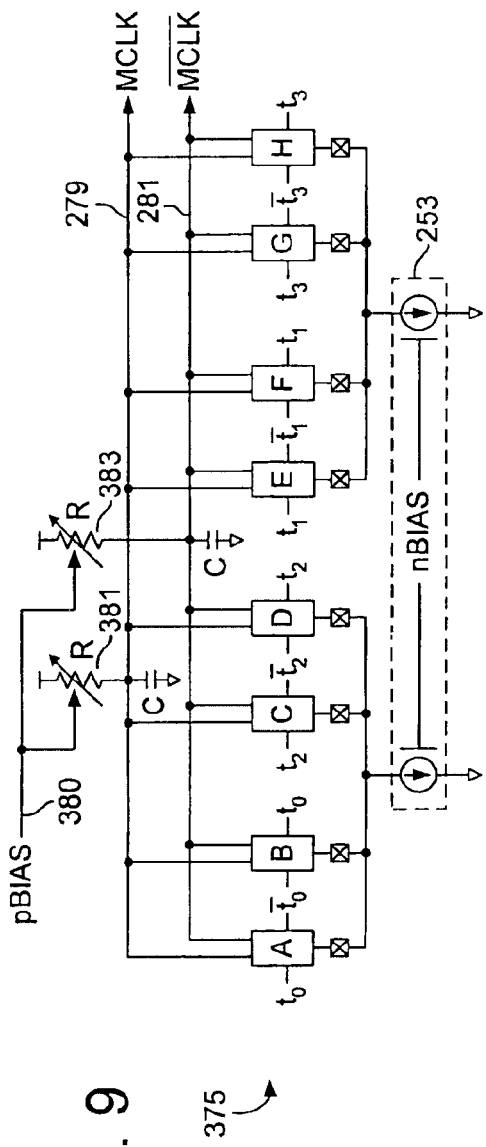
FIG. 9 illustrates a mixer according to an embodiment of the invention in which the resistance values of mix clock line pull-up elements are dynamically adjusted to maintain a relatively constant mix clock signal swing over changes in bias current drawn by an amplifier biasing circuit.

FIG. 9 illustrates a mixer embodiment 375 in which the resistance values of mix clock line pull-up elements 381 and 383 are dynamically adjusted by a bias voltage, pBIAS, to maintain a relatively constant mix clock signal swing over changes in bias current drawn by the amplifier biasing circuit 253. Thus, the bias current drawn by the amplifier biasing circuit 253 may be increased or decreased as necessary to maintain a desired mix clock slew rate, and the resistance of the resistive elements 381 and 383 correspondingly decreased or increased to maintain a relatively constant mix clock voltage swing. That is, $dv/dt=(M_1 \times I_{DAC\text{-}FULLSCALE})/C$, and $V_{MIN\ SWING}=(M_1 \times X_{DAC\text{-}FULLSCALE}) \times (R/M_2)$, where $M_1$ is adjusted by nBIAS and $M_2$ is adjusted by pBIAS. By maintaining a substantially constant proportionality between $M_1$ and $M_2$ (i.e., $M_1/M_2=K$), the mix clock voltage swing is maintained at a substantially constant value over changes in the mix clock slew rate.

Reflecting on the effect of the nBIAS and pBIAS voltages within the phase jumping mixer 375, it can be seen that the nBIAS voltage constitutes a clock slew control signal and the pBIAS voltage constitutes a clock amplitude control signal. Referring briefly to FIG. 3, in one embodiment of the invention, the nBIAS and pBIAS voltages are generated within the reference loop 201 and output to the phase jumping mixers 217 and 221 as the slew rate control signal 226 and the amplitude control signal 228, respectively.

Figure 10:
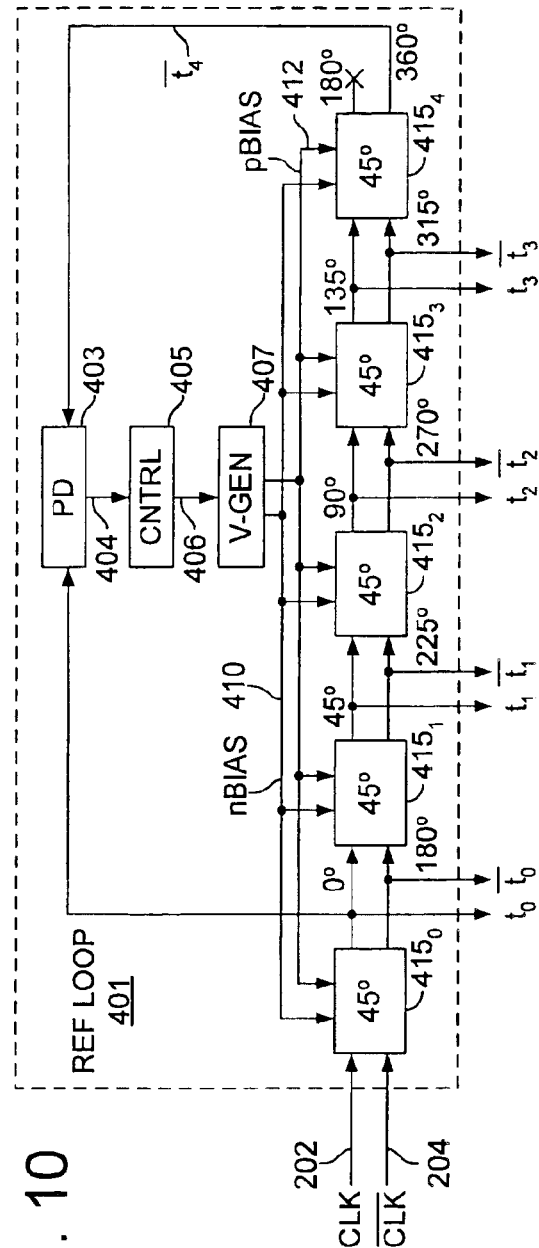
FIG. 10 illustrates a reference loop according to an embodiment of the invention for outputting process-, temperature- and voltage-tracking bias voltages to the phase-jumping mixers of FIGS. 4 and 9.

FIG. 10 illustrates a reference loop for generating phase vectors t0–t3, /t0–/t3, and the nBIAS and pBIAS voltages that are output to the phase jumping mixers as control signals 226 and 228. The reference loop includes a series of delay elements $415_0$–$415_4$, a phase detector 403, control word generator 405, and bias voltage generator 407. Each of the delay elements 415 receives a complementary pair of input clock signals and generates a corresponding pair of complementary phase vectors. The nBIAS voltage is supplied to each delay element 415 via bias line 410 to control the slew rate of the phase vectors generated by the delay element, and therefore the overall phase delay achieved by the delay element. The pBIAS voltage is supplied to each delay element 415 via bias line 412 to control the amplitude of the output clock for the delay element.

In the reference loop 401 of FIG. 10, five delay elements $415_0$–$415_4$ are provided, each being biased to generate phase vectors that transition from a peak voltage level (maximum or minimum) to the swing midpoint voltage (i.e., $(V_{PEAK-MAX}+V_{PEAK-MIN})/2$) over a time interval that corresponds to 45 degrees of the cycle time of reference clock signal 202. By this arrangement, each delay element 415 generates a pair of phase vectors that are delayed by 45 degrees (i.e., of the phase vector cycle time) relative to the input phase vectors (or, in the case of delay element $415_0$, relative to the input reference clock signals 202, 204). Thus, delay element $415_0$ receives the complementary reference clock signals 202 and 204 and outputs phase vectors t0 and /t0 in response. Delay element $415_1$ receives phase vectors t0 and /t0 and outputs phase vectors t1 and /t1 to delay element $415_2$, which outputs phase vectors t2 and /t2 to delay element $415_3$, which outputs phase vectors t3 and /t3 to delay element $415_4$ which outputs phase vectors t4 and /t4. Phase vectors t4 and t0 are input to the phase detector 403 which outputs a signal 404 having a high or low state according to which phase vector leads the other. If phase vector t4 leads phase vector t0, then the total delay through delay elements $415_1$–$415_4$ is less than a full cycle of the reference clock signal 202 and therefore is too short. Conversely, if phase vector t0 leads phase vector t4, then the delay though delay elements $415_1$–$415_4$ is more than a full cycle of the reference cock signal 202 and therefore is too long. If t4 leads t0 (delay too short), the phase detector 403 outputs a decrement signal (e.g., a low-state signal 404) to the control word generator 405 which responds by decrementing a slew control word 406. If t4 lags to (delay too long), the phase detector outputs an increment signal (e.g., a high-state signal 404) to the control word generator 405 which increments the slew control word 406 in response. The slew control word 406 is output to the bias voltage generator 407. The bias voltage generator 407 outputs the nBIAS and pBIAS voltages on lines 410 and 412, respectively, according to the slew control word 406 from the control word generator 405. In one embodiment, the bias voltage generator 407 includes a frequency-dependent bias control circuit to adjust the nBIAS and pBIAS voltages according to the frequency of the reference clock signal 202, thereby allowing the reference loop 401 to be operated over a relatively broad range of reference clock frequencies.

Figure 11:
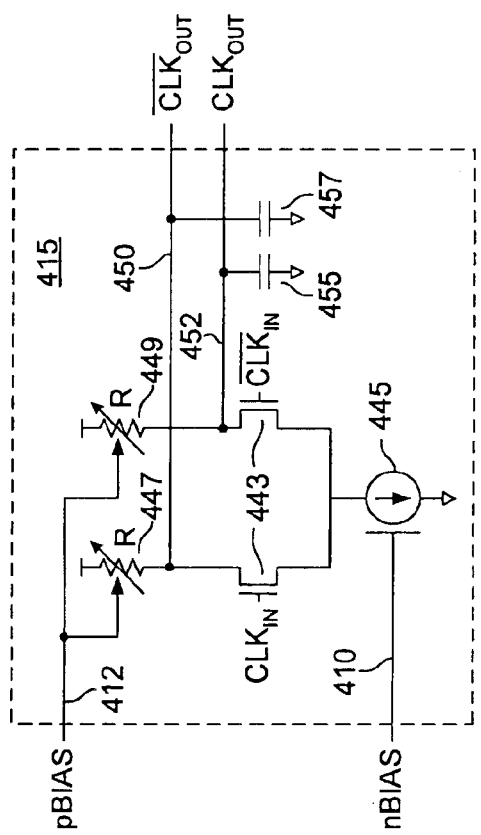
FIG. 11 illustrates an exemplary embodiment of a delay element that may be used within the reference loop of FIG. 10.

FIG. 11 illustrates an exemplary embodiment of a delay element 415 that may be used within the reference loop of FIG. 10. The delay element 415 includes a differential amplifier formed by differentially coupled transistors 443, resistive pull up elements 447 and 449, capacitive elements 455 and 457, and current source 445. Differential clock signals ($CLK_{IN}$ and $/CLK_{IN}$) are applied to the gate terminals of transistors 443, such that, when $CLK_{IN}$ is high and $/CLK_{IN}$ is low, all or substantially all of the current drawn by current source 445 flows through resistive element 447, thereby pulling down complement output clock line 450 and enabling output clock line 452 to charge. Conversely, when $/CLK_{IN}$ is high and $CLK_{IN}$ is low, substantially all of the current drawn by current source 445 flows through resistive element 449, thereby pulling down output clock line 452 and enabling complement output clock line 450 to charge. The rate at which the clock lines 450 and 452 are pulled down is proportional to the current, I, drawn by current source 445 (i.e., dv/dt=I/C, C being one of capacitive elements 455 and 457) which, in turn, is controlled by the nBIAS voltage. Thus, the nBIAS voltage controls the slew rate of the complementary output clock signals ($CLK_{OUT}$ and $/CLK_{OUT}$) generated on clock lines 450 an 452, and therefore the clock phase delay achieved by the delay element 415. In the exemplary embodiment of FIG. 10, the nBIAS voltage is adjusted through the closed loop operation of the reference loop 401 until the slew rate of the output clock signal, $CLK_{OUT}$, produces a midpoint crossing after a time period substantially equal to $T_{REFCLK}/8$; a 45 degree phase delay. If the phase delay is greater than 45 degrees, phase vector t4 will lag phase vector to, causing nBIAS to be increased, thereby increasing the output clock slew rate and decreasing the phase delay. Conversely, if the phase delay is less than 45 degrees, phase vector t4 will lead phase vector t0, causing nBIAS to be decreased, thereby decreasing the output clock slew rate and increasing the phase delay. Because the nBIAS voltage is generated through the closed loop operation of the reference loop, nBIAS is adjusted as necessary to maintain the desired output clock slew rate over gradual changes in voltage and temperature (i.e., environmental changes), and over process variations from device to device.

Still referring to FIG. 11, the pBIAS voltage is used to adjust the resistance of resistive elements 447 and 449 as necessary to maintain a substantially constant output clock amplitude (i.e., $V_{SWING}$) over a given range of nBIAS voltages. In one embodiment, the pBIAS and nBIAS voltages are generated in a manner that maintains a substantially constant proportionality between the voltages so that, like nBIAS, pBIAS is adjusted in response to changes in process, voltage and temperature to maintain a desired output clock amplitude. Thus, the nBIAS and pBIAS voltages constitute slew rate and amplitude control signals, respectively, that are adjusted by a closed loop circuit to compensate for changes in process voltage and temperature (PVT).

Comparing the delay element of FIG. 11 to a given one of the differential amplifiers A–H of FIG. 4, it can be seen that the differential amplifier and delay element have essentially the same structure. Accordingly, by using the PVT-compensated nBIAS voltage to establish the mix bias current within the phase-jumping mixers, a desired mix clock slew rate is maintained through changes in process, voltage and temperature. Similarly, by using the PVT-compensated pBIAS voltage to establish the resistance of the mix clock pull-up elements, R, within the phase-jumping mixer 221, a desired mix clock amplitude is maintained through changes in process, voltage and temperature.

Figure 12:
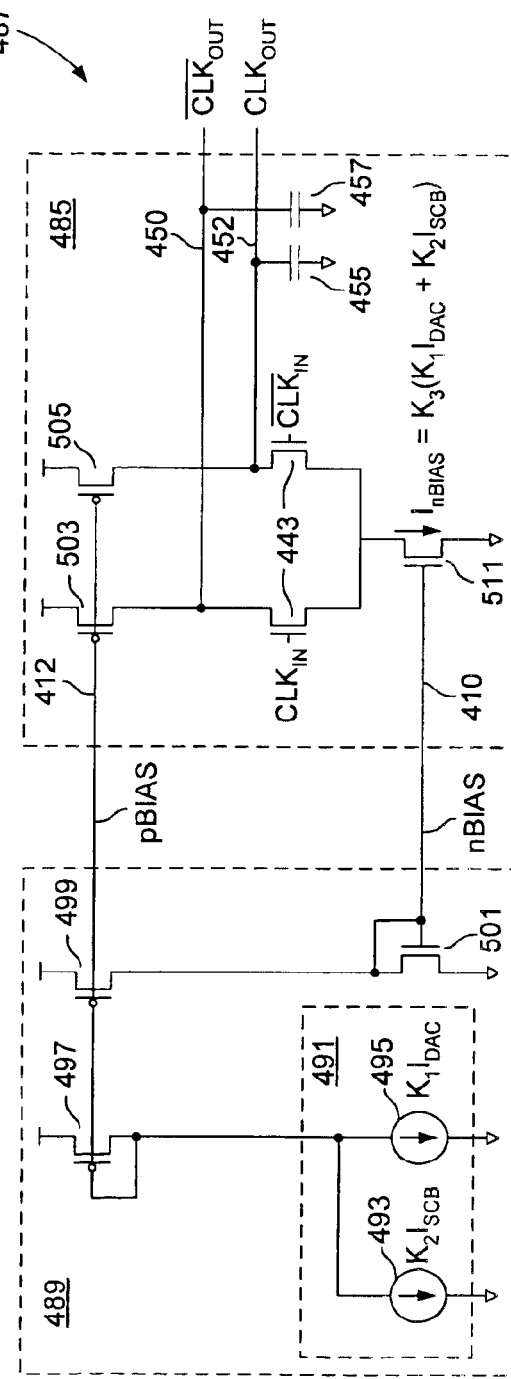
FIG. 12 illustrates the voltage generation circuit of FIG. 10 according to an embodiment of the invention.

FIG. 12 illustrates an exemplary embodiment of the voltage generation circuit 489 of FIG. 10 and its interconnection to an exemplary delay element 485. The voltage generation circuit 487 includes a dual-control current source 491 that includes component current sources 493 and 495 that draw bias currents, $K_2I_{SCB}$ and $K_1I_{DAC}$, respectively. As discussed below, current source 493 is controlled by a switched-capacitor biasing circuit that generates a bias control value according to the frequency of the reference clock signal. Current source 495 is controlled by the slew control word 406 from the control word generator 405 of FIG. 10 and therefore enables digital adjustment of the delay through the delay element 487 to achieve a desired slew rate in output clock signals, $CLK_{OUT}$ and $/CLK_{OUT}$.

Still referring to FIG. 12, the current drawn by dual-control current source 491 (i.e., $I_X=K_1I_{DAC}+K_2I_{SCB}$) is used to establish the pBIAS voltage at the gate of diode-configured transistor 497. Transistor 497 is coupled in a current-mirroring configuration with transistor 499 and, via line 412, with transistors 503 and 505 of the delay element 485. In one embodiment, transistor 499 is substantially identical (i.e., same length-width ratio) to transistor 497 so that current $I_X$ flows through transistor 499 thereby establishing the nBIAS voltage at the gate of diode-configured transistor 501. As shown, the nBIAS voltage is applied via line 410 to the gate of biasing transistor 511 within the delay element 485 to achieve a bias current, $I_{nBIAS}$, equal to (or substantially equal to) $K_3I_X=K_3(K_1I_{DAC}+K_2I_{SCB})$, K3 being a constant established, for example, by the width ratios between transistors 511 and 501 (and/or by the width ratios between transistors 497 and 499).

The pBIAS voltage applied to transistors 503 and 505 increases in proportion to the nBIAS voltage applied to the gate of biasing transistor 511, and is used to control the resistive load presented by transistors 503 and 505. Because the current flow through transistors 503 and 505 is substantially proportional to the gate-to-source voltage, $V_{GS}$, the resistive load presented by transistors 503 and 505 is substantially inversely proportional to the pBIAS voltage and therefore is inversely proportional to the nBIAS voltage. That is, the resistive load presented by transistors 503 and 505 is inversely proportional to the current drawn by biasing transistor 511 and therefore is decreased as the current drawn by biasing transistor 511 is increased. Because the output clock signals developed on lines 450 and 452 swings approximately between $V_{MAX}=V_{DD}$ and $V_{MIN}=V_{DD}-(R_{503} \times I_{nBIAS})$, the inverse proportionality between $R_{503}$ (i.e., the resistance presented by transistor 503) and $I_{nBIAS}$ serves to maintain $V_{MIN}$ (and therefore $V_{SWING}$) at a relatively constant level as $I_{nBIAS}$ is adjusted to achieve a desired slew rate. Additional resistive elements (e.g., diode configured transistors, transistors biased at predetermined operating points, etc.) may additionally be coupled to the output clock lines 450 and 452 to provide a baseline resistance which is adjusted by changes in the resistive values of transistors 503 and 505.

Figure 13:
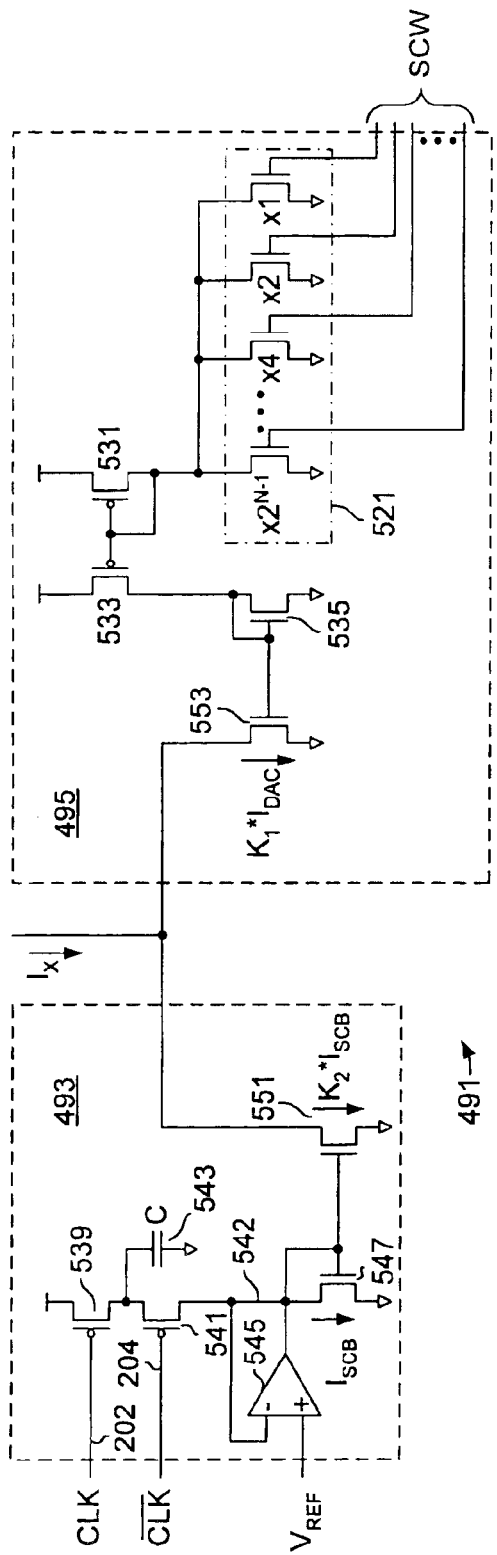
FIG. 13 illustrates the dual-control current source of FIG. 12 according to an embodiment of the invention.

FIG. 13 illustrates an embodiment of the dual-control current source 491 of FIG. 12. The dual-control source 491 includes the frequency-tracking current source 493 and the digitally controlled current source 495 described in reference to FIG. 12. The frequency-tracking current source 493 includes a pair of transistors 539 and 541 coupled in series between a supply voltage and the output 542 of a follower-configured amplifier 545. A capacitive element 543 is coupled between ground and the junction of transistors 539 and 541 (i.e., to the drain terminal of transistor 539 and the source terminal of transistor 541). The complementary reference clock signals 202 and 204 are input to gate terminals of the transistors 539 and 541, respectively, such that, when clock signal 202 is high (and clock signal 204 is low), transistor 539 is switched on to charge the capacitive element 543, and transistor 541 is switched off. The voltage output by the follower-configured amplifier 545 is set to a value (determined by reference voltage, $V_{REF}$) lower than $V_{DD}$ so that, when the clock signal 204 is high (and clock signal 202 is low), transistor 541 is switched on to discharge the capacitor through diode-configured transistor 547, thereby generating a bias voltage at the gate of transistor 547 according to the discharge current. The current flowing through the series coupled transistors 539 and 541 (and therefore through diode-configured transistor 547), $I_{SCB}$, is $(V_{DD}-V_{REF})/Z$, where Z is $1/(C \times F_{CLK})$. Note that the transistors 539 and 541 contribute a resistive component to the impedance, but are dominated by the $C \times F_{CLK}$ term. Thus, $I_{SCB}$ is substantially equal to $[(V_{DD}-V_{REF}) \times C] \times F_{CLK}$, and, because $V_{DD}$, $V_{REF}$ and C are relatively constant, is therefore proportional to the frequency of the reference clock signal. This is a desirable result as the required output clock slew rate in the delay elements and the phase-jumping mixers increases linearly with the frequency of the reference clock signal. Diode-configured transistor 547 is coupled in a current mirror configuration with transistor 551, such that a current $K_2 \times I_{SCB}$ flows through transistor 551, the $K_2$ term being a constant established by the relative length-width ratios of transistors 551 and 547.

The digitally controlled current source 495 includes a current DAC 521 coupled to receive the slew control word (SCW) from the control word generator (i.e., element 405 of FIG. 10). In one embodiment, the current DAC 521 includes N binary weighted transistors (designated ×1, ×2, ×4, ..., $\times 2^{N-1}$ in FIG. 13) coupled in parallel with one another, each having a gate terminal coupled to receive a respective bit of the slew control word. By this arrangement, the current drawn by DAC 521, $I_{DAC}$, is adjustable between zero to $2^{N-1} \times I_{UNIT}$ in steps of $I_{UNIT}$ ($I_{UNIT}$ being the current drawn by the ×1 transistor, when switched on) according to the value of the slew control word. $I_{DAC}$ flows through diode-configured transistor 531 which is coupled in a current mirror configuration with transistor 533. In one embodiment, transistors 531 and 533 are substantially the same size so that, by virtue of the current mirror, $I_{DAC}$ flows through transistor 533 and therefore through diode configured transistor 535. Transistor 535 is coupled in a current mirror configuration with transistor 553 so that current $K_1 \times I_{DAC}$ flows through transistor 553. The multiplier $K_1$ is a constant determined by the relative length-width ratios of transistors 553 and 535. In an alternative embodiment, transistors 533 and 531 may be used to establish $K_1$ instead of (or in addition to) transistors 535 and 553.

Figure 14:
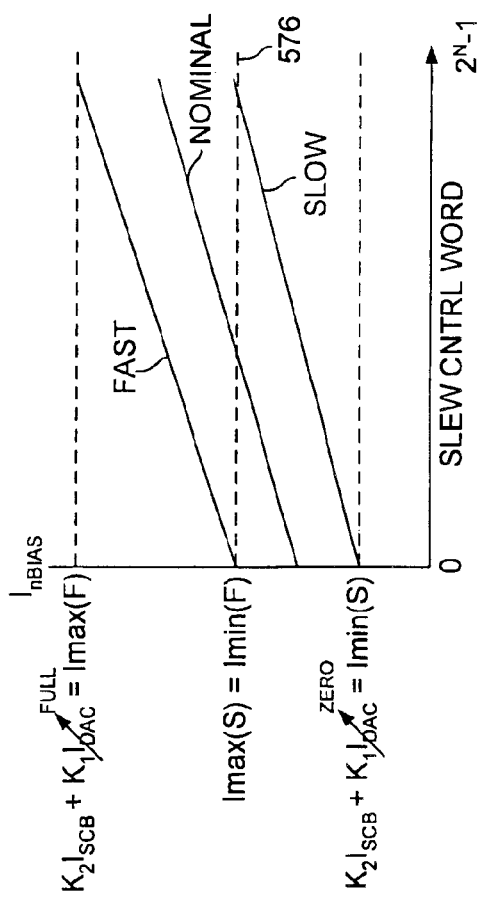
FIG. 14 illustrates the manner in which the dual-control current source of FIG. 12 may be used to achieve a desired operation over process variations that range between fast and slow corners.

Reflecting on the operation of the dual-control current source 491, it should be noted that, for a reference clock signal having a given frequency, the current drawn by the frequency-tracking current source 493, $K_2 \times I_{SCB}$, is substantially constant. Consequently, the adjustable range of the current source 491 extends from a mini-mum value, $K_2 \times I_{SCB}$, when $I_{DAC}$ is zero; to a maximum value, $K_2 \times I_{SCB}+K_1I_{DAC}$, when $I_{DAC}$ is at full-scale. In one embodiment, illustrated in FIG. 14, the multiplier $K_2$ is selected such that a nominally mid-point $I_{nBIAS}$ value (576) may be achieved in a fast process corner (i.e., fabrication process that yields the highest acceptable transconductance value for a transistor of a given size) when $I_{DAC}$ is set to zero, and that may also be achieved in a slow process corner (i.e., fabrication process that yields the lowest acceptable transconductance value for a transistor of a given size) when $I_{DAC}$ is set to full-scale. That is, as shown in FIG. 14, both the slow process line (SLOW) and the fast process line (FAST) cross the midpoint $I_{nBIAS}$ line 576 at opposite extremes of the slew control word, with a nominal process having an adjustable $I_{nBIAS}$ range centered around the mid-point $I_{nBIAS}$ 576. $I_{nBIAS}$ for the fast process corner ranges from the mid-point $I_{nBIAS}$ 576, to the mid-point $I_{nBIAS}$ plus $K_1 I_{DAC}$ (designated "Imax(F)" in FIG. 14). $I_{nBIAS}$ for the slow process comer ranges from the mid-point $I_{nBIAS}$ 576 to the mid-point $I_{nBIAS}$ minus $K_1 \times I_{DAC}$ (designated "Imin(S)" in FIG. 14).

Although the phase-jumping locked loop architecture of FIG. 3 and component circuits thereof described in reference to FIGS. 4–14 have been described as generating a device clock signal having the same frequency as a reference clock signal (i.e., a delay-locked loop), the phase-jumping locked loop architecture and component circuits may readily be adapted to form a phase-locked loop (PLL) circuit in which the output clock signal is a frequency multiple of the reference clock signal. Referring to FIG. 3, for example, clock divider circuitry may be used within the reference loop 201 to generate frequency-multiplied phase vectors, and the frequency-multiplied phase vectors mixed within the phase-jumping mixers 217 and 221 as described above. In either type of phase-jumping locked loop circuit, DLL or PLL, the process-, temperature- and voltage-tracking bias voltages used to control the slew rate and amplitude of clock signals within the reference loop may be output to the phase-jumping mixers 217 and 221 to maintain substantially linear mixing and substantially constant output clock signal swing over changes in process, temperature and voltage.

System Application of Phase Jumping Locked Loop Circuit

Figure 15:
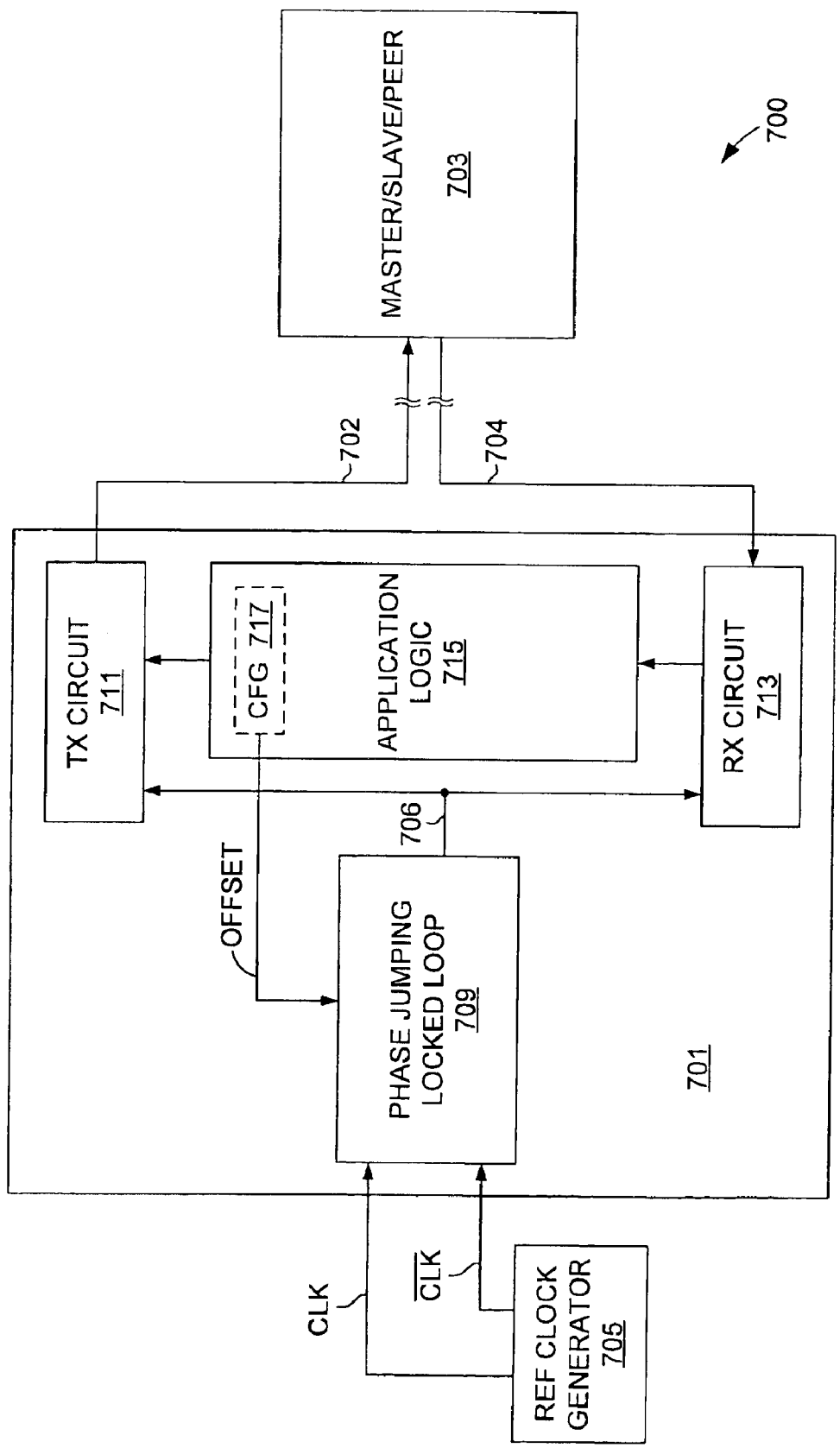
FIG. 15 illustrates a system in which a phase jumping locked loop circuit according to embodiments described above in reference to FIGS. 3–14 may be used.

FIG. 15 illustrates a system 700 in which a phase jumping locked loop circuit 709 (i.e., a DLL or PLL circuit) according to embodiments described above in reference to FIGS. 3–14 may be used. The system 700 may be used, for example, within a computing device (e.g., mobile, desktop or larger computer), networking equipment (e.g., switch, router, etc.), consumer electronics device (e.g., telephone, camera, personal digital assistant (PDA), etc.), or any other type of device in which a PLL or DLL circuit may be used. More specifically, the system 700 may be a memory subsystem or any other subsystem within such computing device, networking equipment, consumer electronics device, etc.

The system 700 includes a pair of integrated circuits (ICs) 701 and 703 coupled to one another via a transmit signal path 702 and a receive signal path 704. In the embodiment, shown, the signal paths 702 and 704 are unidirectional high-speed serial links for conducting serialized transmissions from one IC to the other. In alternative embodiments, either or both of the links may be bi-directional (i.e., with appropriate circuitry provided to select which of the ICs is enabled to transmit on the link at a given time), and multiples of such signal paths may be provided to enable transmission of parallel groups of bits (e.g., each group of bits forming a data or control word (e.g., command, address, etc.) or portion of a data or control packet). Also, the transmit signal path 702, receive signal path 704, and/or shared transmit-receive signal path may be a multi-drop bus that is coupled to additional ICs. The ICs 701 and 703 may be peers (e.g., each IC is capable of independently initiating a signal transmission to the other), or master and slave. Also, the relative status of the ICs 701 and 703 may change from time-to-time such that one IC is a master at a first time, then a slave at another time, and/or a peer at another time.

IC 701 is shown in simplified block diagram form and includes a transmit circuit 711, receive circuit 713, locked loop circuit 709, and application logic 715. As shown, the locked loop circuit 709 is coupled to receive complementary reference clock signals, CLK and /CLK, from an off-chip reference clock generator 705, and outputs a phase-locked clock signal 706 to the transmit circuit 711 and the receive circuit 713. In an alternative embodiment, the reference clock signals, CLK and /CLK, may be generated within IC 701 or IC 703. A configuration circuit 717 (e.g., register, one-time programmable circuit, non-volatile memory, etc.) may be included within the application logic 715 to store one or more offset control values (OFFSET) that are used to establish a phase offset between clock signal 706 and reference clock signal, CLK. Note that clock signal 706 may include a complementary pair of clock signals as described above. Also, while the locked loop 709 is depicted as providing a clock signal to both the transmit circuit 711 (i.e., a transmit clock signal) and to the receive circuit 713 (i.e., a sampling clock signal), separate locked loop circuits may be provided to generate separate transmit and sampling clock signals. Alternatively, multiple clock generation circuits may be provided within the locked loop circuit 709 to generate separate transmit and sampling clock signals. For example, in an embodiment in which locked loop 709 is a DLL circuit implemented as shown in FIG. 3, an additional phase jumping mixer and clock tree circuit may be provided to generate a transmit clock in response to a separate offset control value (OFFSET). Also, although two ICs are depicted in FIG. 15 (i.e., ICs 701 and 703), the circuits within each of the ICs may alternatively be implemented in a single IC (e.g., in a system-on-chip or similar application), with signal paths 702 and 704 being routed via metal layers or other signal conducting structures fabricated within the IC. Also, if distinct ICs are used as shown in FIG. 15, the ICs may be packaged in separate IC packages (e.g., plastic or ceramic encapsulation, bare die package, etc.) or in a single IC package (e.g., multi-chip module, paper thin package (PTP), etc.).

Phase Jumping

Figure 2:
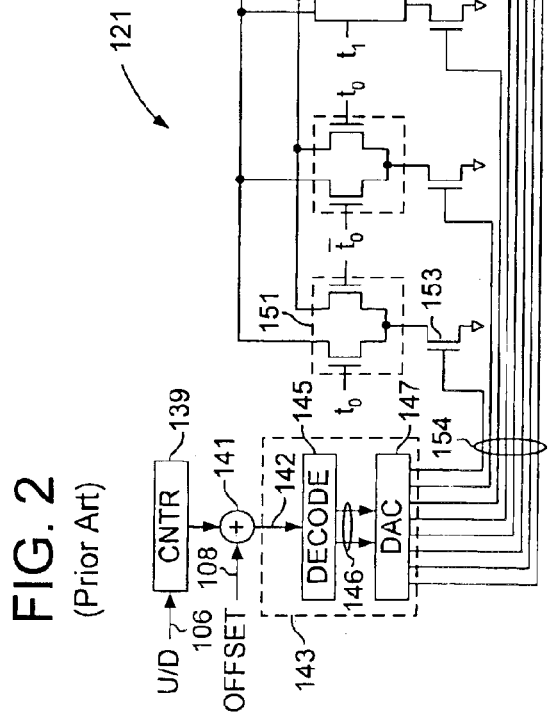
FIG. 2 illustrates a prior-art phase mixer.

Because the phase-jumping mixer of the present invention exhibits relatively fast settling time between phase steps (i.e., as compared to the prior-art phase mixer described in reference to FIG. 2), a number of applications which require rapid, relatively large, phase changes become possible. For example, in an application in which the phase jumping mixer is used to generate a transmit clock (i.e., to time transmission of signals), it may be desirable to select a different phase offset between the transmit clock and a reference clock signal according to a data (and clock) propagation distance. More specifically, a respective offset control value may be established for each recipient device in a signaling system and selected (e.g., from a lookup table or other memory) by a transmitting device according to which recipient device is the intended recipient of an outgoing transmission. Because the transmitting device may need to transmit to one or more different recipient devices in rapid succession, delay in generating transmit clock signals having the desired phase offsets would present a substantial bottleneck in such a system. Using the phase jumping mixer of FIG. 4 (or FIG. 9), a sequence of transmit clocks having different phase offsets may be rapidly generated by changing the offset control value 208. This type of operation is referred to herein as destination-based phase jumping. While some settling time in the resultant mix clock signal is still necessary, the settling time is, in general, substantially shorter than in the prior art mixer described above.

Embodiments of the present invention may also be used to achieve a rapid succession of different phase alignments of a sampling clock signal, with each different phase alignment corresponding to a respective transmission source within a signaling system. For example, in a master/slave system in which slave transmissions to a master device occur deterministically in response to master device commands or requests (i.e., when the master device issues a command or request, the master device may anticipate a responsive transmission from the slave a predetermined time later), the master device may select a previously determined sampling clock offset according to which slave device is scheduled to transmit at a given time. Such operation is referred to herein as source-based phase jumping and may be implemented within a master device, for example, by storing a respective offset control value for each slave device in a signaling system and selecting (e.g., from a lookup table or other memory) different ones of the stored offset controlled values according to the identities of the slave devices scheduled to transmit. More generally, source-based phase jumping may be used in any device that has or receives forehand information of transmission sources. Such forehand information may result from system determinism (i.e., predetermined response times to system events such as commands, requests, interrupts, timing signals, etc.) or from other communications including, without limitation, communications via out-of-band signaling channels (e.g., handshaking signals).

Both destination and source-based phase jumping may be implemented within the same integrated circuit device (e.g., one or more master devices within a master/slave system) and a shared memory structure used to store offset control values for the various transmission destinations and sources. Offset control values may be determined, for example, by transmission of predetermined test patterns between system devices to learn the leading and lagging phase boundaries beyond which transmission errors are detected. Methods and apparatuses for performing such timing calibration operations are disclosed, along with other locked-loop applications in which embodiments of the present invention may be used, in U.S. patent application Ser. No. 09/421,073, filed Oct. 19, 1999 (entitled "Bus System Optimization"), and U.S. Pat. No. 6,321,282, each of which is hereby incorporated by reference in its entirety.

Embodiments of the present invention may also be applied to achieve destination and/or source-based phase jumping in signaling systems in which integrated circuit devices (or components within an integrated circuit device) are clocked by different clock signals having nominally the same frequency, but arbitrary phase relationships. In such a system, the phase offsets between various transmit and sampling clock signals used to time signal transmission and reception may be systematically determined and used to generate offset control values. The offset control values may then be dynamically retrieved (e.g., from a lookup table or other memory) to time data reception and/or transmission operations in one or more of the integrated circuits according to the source or destination of the data transmission. In one such system, for example, a memory controller mounted to a motherboard (or other substrate) is coupled to multiple memory modules (i.e., daughterboards or other substrates having one or more integrated circuit memory devices mounted thereon) via a common signaling path, the memory modules being clocked by respective clock signals having nominally the same frequency, but arbitrary phase relationships. The memory controller may receive any or all of the clock signals provided to the memory modules, and/or a separate clock signal. In one embodiment, the memory controller includes a DLL circuit or PLL circuit according to the present invention to achieve rapid, source and/or destination-based phase jumping.

The phase jumping capability of the phase jumping mixer of FIGS. 4 (or the phase jumping mixer of FIG. 9) may also be applied in phase locking operations performed upon device power up or exit from a reduced power state. In phase locking operations, the phase of a sampling clock signal and/or transmit clock signal generated by a locked loop circuit (i.e., DLL or PLL) is incrementally rotated through a cycle (or part of a cycle) of a reference clock signal until a desired phase offset is reached. Referring to FIG. 3, the phase jumping mixers within tracking loop and offset clock generator the may be used to jump between different phases in search of a desired phase offset. For example, the phase jumping mixer 217 of FIG. 3 may be used to rapidly jump between target phases of the feedback clock signal 212 in a binary search in which the search range is repeatedly halved to converge on a phase count value that establishes phase alignment between the reference clock signal 202 and the feedback clock signal. Similarly, the phase jumping mixer 221 of FIG. 3 may be used to rapidly jump between a number of phase offsets in an effort to locate leading and trailing edges of a data valid window within an incoming data signal (i.e., leading and trailing edges of a data eye). In both cases, a combination of binary and linear searching techniques may be used, for example, by using a binary search to reduce the search range to a predetermined phase range, then stepping through the predetermined phase range in linear increments until a desired phase offset is reached. In general, any searching technique in which it is desirable to rapidly switch between different phase offsets may potentially benefit from the short settling time of the phase jumping mixers of the invention.

Time-Multiplexed TX/RX Clock Line

Figure 16:
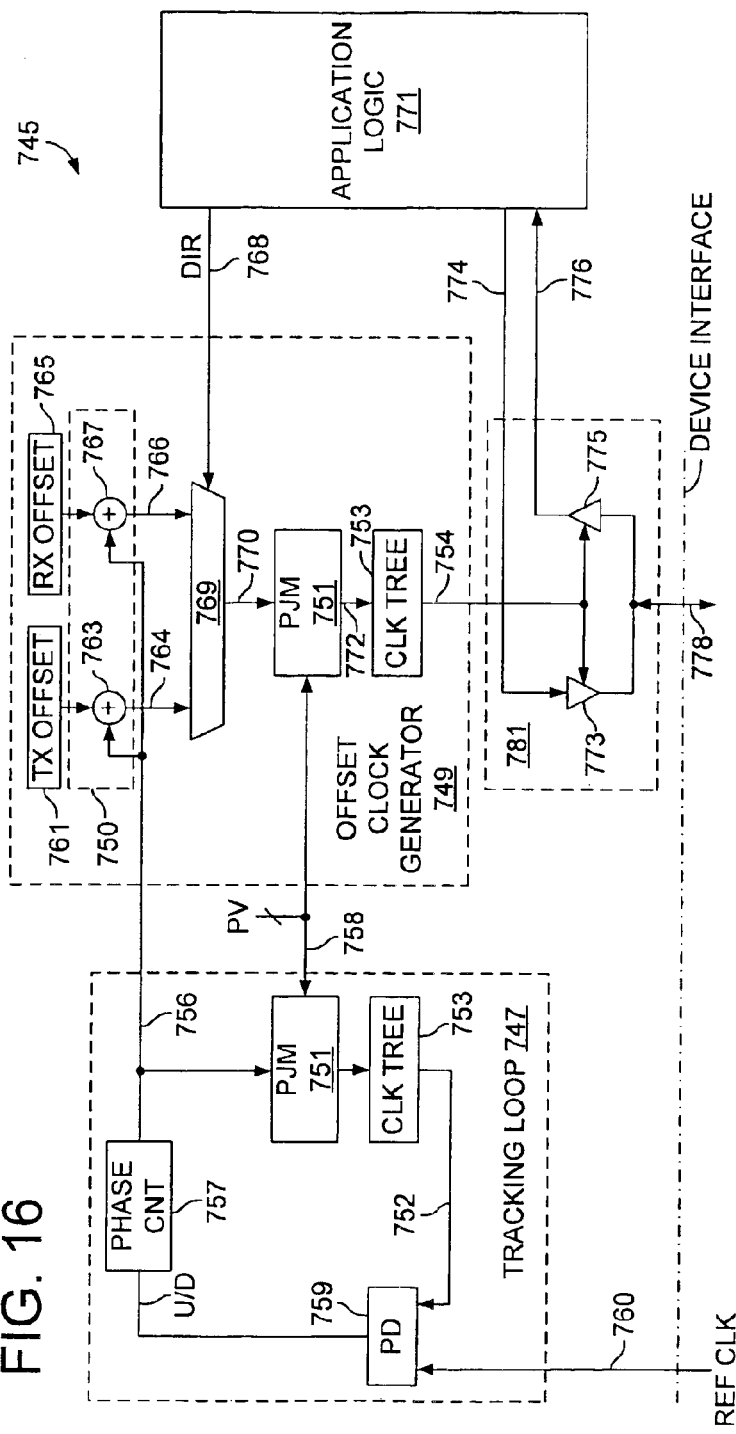
FIG. 16 illustrates a signaling device according to an embodiment of the invention.

FIG. 16 illustrates a signaling device 745 in which transmit and receive phase control values are alternatively supplied to a phase jumping mixer 751 such that a corresponding transmit clock signal and receive clock signal are alternatively output onto a shared clock line 754. That is, the clock signal line 754 is effectively time-multiplexed so that, during a data reception interval, an incoming data waveform on signal path 778 is sampled by a receive circuit 775 in response to transitions of a receive clock signal generated on the clock line 754 and, during a data transmission interval, data is transmitted onto the signal path 778 by a transmit circuit 773 in response to transitions of a transmit clock signal generated on the clock line 754. Note that clock line 754 may be gated within the clock tree circuit 753 or elsewhere such that the signal transitions used to time the reception and transmission of data constitute strobe signals rather than clock signals. Also, signal path 778 may be a single-ended or differential signal path.

The signaling device 745 includes a tracking loop 747, offset clock generator 749, transceiver 781 and application logic 771. The signaling device additionally includes a reference loop supply a set of phase vectors 758 (and optionally, the slew control signal 226 and amplitude control signal 228 described in reference to FIG. 3) to the tracking loop 747 and the offset clock generator 749. The tracking loop 747 includes a phase counter 757, phase jumping mixer 751, clock tree 753 and phase detector 759 that operate generally in the same manner as the corresponding components described in reference to FIG. 3 to generate a phase count value 756. The phase count value 756 represents a phase offset between the reference clock signal 760 and a reference phase vector of phase vectors 758 (i.e., one of phase vectors 758 arbitrarily selected to represent a 0 degree phase angle). Within the tracking loop 747, the phase count value 756 constitutes a phase control word that is supplied to the phase jumping mixer 751 to produce a feedback clock signal 752 that is phase aligned with the reference clock signal 760.

The offset clock generator 749 includes a pair of storage circuits 761 and 765, summing circuit 750, select circuit 769, phase jumping mixer 751 and clock tree 753. The storage circuits 761 and 765 are used to store a transmit phase offset value and a receive phase offset value, respectively, which are output to the summing circuit 750. In the embodiment of FIG. 16, the summing circuit 750 includes a pair of adder circuits 763 and 767 each of which is coupled to receive the phase count value 756 from the tracking loop. Adder circuit 763 sums the phase count value 756 with the transmit phase offset value from register 761 to generate a transmit phase control word 764, and adder circuit 767 sums the phase count value 756 with the receive phase offset value from register 765 to generate a receive phase control word 766. The phase control words 764 and 766 are input to the select circuit 769 which outputs a selected one of the phase control words (i.e., as selected phase control word 770) to the phase jumping mixer 751 according to the state of a direction signal 768 received from the application logic 771. The phase jumping mixer 751 mixes a selected pair of phase vectors 758 according to the selected phase control word 770 to produce a mix clock signal 772. The mix clock signal propagates through the clock tree circuit 753 to generate an output clock signal on clock line 754, the output clock signal having a phase offset relative to the reference clock signal 760 according to the selected phase control word 770. Thus, when the direction signal 768 from the application logic 771 indicates a receive operation, the receive phase control word 766 is selected to generate a receive clock signal on clock line 754, the receive clock signal being used to time the sampling instant within a receive circuit 775 (i.e., within transceiver 781), and the data samples captured in response to the receive clock signal being supplied to the application logic 771 via receive data line 776. Conversely, when the direction signal 768 from the application logic 771 indicates a transmit operation, the transmit phase control word 764 is selected to generate a transmit clock signal on clock signal line 754, the transmit clock signal being used to time the transmission of data on signal path 778 by the transmit circuit 773, the data being supplied to the transmit circuit 773 by application logic 771 via transmit data line 774.

The application logic 771 includes circuitry specific to the general function of the integrated circuit device (e.g., memory controller, memory device, processor, application-specific integrated circuit (ASIC), programmable logic device (PLD), or any other type of integrated circuit device. In one embodiment, the transmit circuit 773 is a pull-down type transmit circuit that pulls signal path 778 down from a precharged level (e.g., pulled up to a supply voltage) to transmit a symbol other than a zero-valued symbol, and that transmits a zero-valued symbol by allowing the signal path 778 to remain at the precharged level. Thus, the application logic 771 may effectively disable transmitter 773 from affecting the state of the signal path 778 during a data reception interval by outputting a value onto the transmit data line 774 that corresponds to a zero-valued symbol. In an alternative embodiment in which the transmitter 773 is a push-pull output driver (or any other type of output driver that affects the state of the signal path 778 regardless of the value of the symbol being transmitted), the application logic may output a disable signal to the transmitter 773 to disable the transmitter from affecting the state of the signal path 778 during a data reception interval. Also, while the transmit phase offset value and the receive phase offset value are depicted as being stored in dedicated storage circuits 761 and 765, a shared storage circuit (e.g., a multi-entry memory array) may alternatively be used.

Figure 17:
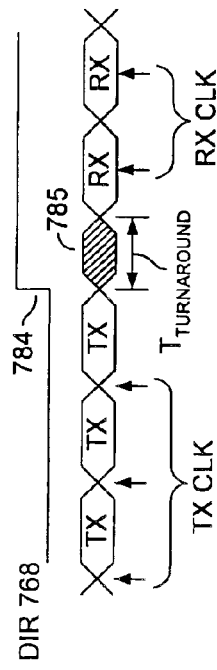
FIG. 17 illustrates the relationship between an exemplary data waveform, the direction signal of FIG. 16 and corresponding transitions of the transmit and receive clock signals generated on the shared clock line of FIG. 16.

FIG. 17 illustrates the relationship between an exemplary data waveform on signal path 778, the direction signal 768 and corresponding transitions of the transmit and receive clock signals generated on clock line 754. When the direction signal 768 is in a first state (low in this example), a transmit clock signal is generated on clock signal line 754 and used to time the transmission of successive data values on signal path 778. In the embodiment shown, a data value (e.g., a symbol represented by one of at least two discrete signal levels, or more than two discrete signal levels in a multi-level signaling embodiment) is transmitted on signal path 778 in response to each transition of the transmit clock signal (i.e., a double data-rate signal in which each symbol is transmitted during a successive half-cycle of the transmit clock signal). In alternative embodiments, more or fewer data values may be transmitted during each cycle of the transmit clock signal. As shown at 784, the application logic 771 transitions the direction signal from low to high in anticipation of receiving data via the signal path 778. During a turnaround interval shown at 785, no data is transmitted or received on the signal path 778, thereby allowing the signal path 778 to settle. The duration of the turnaround interval 785, $T_{TURNAROUND}$, may be longer or shorter than the time between successive data transmissions and/or data receptions. The offset clock generator 749 of FIG. 16 responds to the transition of the direction signal 768 by selecting the receive phase control value 766 to be supplied to the phase jumping mixer 751 and therefore transitioning the phase of the clock signal generated on clock line 754 from the transmit clock signal phase to the receive clock signal phase. Thus, after the turnaround interval 785, the clock signal on clock line 754 has the desired phase offset for sampling data within receive circuit 775 and is used to sample data values for transfer to the application logic 771.

Figure 18:
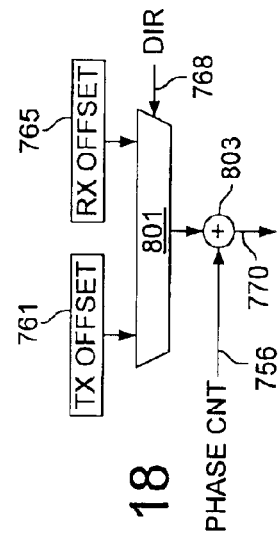
FIG. 18 illustrates an alternative circuit arrangement for generating a phase control value within the offset clock generator of FIG. 16.

FIG. 18 illustrates an alternative circuit arrangement for generating the phase control value 770 within the offset clock generator 749 of FIG. 16. As shown, a select circuit 801 is coupled to receive the transmit and receive offset values from the storage circuits 761 and 765, respectively. The select circuit outputs a selected one of the phase offset values (i.e., selected according to the state of the direction signal 768) to a summing circuit implemented by an adder 803. The adder 803 sums the selected phase offset value with the phase count value 756 received from the tracking loop 747 to generate the phase control value 770. The phase control value 770 is supplied to the phase jumping mixer 751 and used to generate an output clock signal as described in reference to FIG. 16. Note that the registers 761 and 765 depicted in FIGS. 16 and 18 may alternatively be implemented by a memory array having at least two storage entries (i.e., to store the transmit and receive phase offset values), an address decoder to select between the storage entries in response to an address signal (e.g., the direction signal 768) and an output port (e.g., bit lines coupled to columns of storage elements within the memory array) to supply the content of the selected storage entry to the adder 803.

Reflecting on the operation of the device of FIG. 16, it should be noted that, absent the fast phase jumping ability of the mixer 751 within the offset clock generator 749, a transmit or receive clock signal would likely require a time significantly longer than the turnaround interval to stabilize on the clock signal line 754. Thus, the fast phase jumping ability of the mixer 751 enables generation of both transmit and receive clock signals on the same clock signal line, avoiding the need for an additional phase mixer and clock tree. More generally, the architecture of device 745 may be used in any application in which it is desirable to quickly transition an output clock signal between two or more phase offsets. Also, while the phase jumping mixer 751 may be implemented by the phase jumping mixers described above in reference to FIGS. 4–14, any circuit capable of rapidly transitioning the phase of an output clock signal according to the selection between two or more phase control values may alternatively be used within the clock generating circuit in place of the phase jumping mixer 751.

Phase Searching

To save power during periods of non-communication in a high-speed signaling system, delay locked loop and phase locked loop circuits are often disabled from tracking a reference clock signal (the reference clock signal itself being shut off in some systems). Before communication is restored in such systems, the locked loop circuits are re-enabled in a wake-up operation. In many systems, the time required to complete the wake-up operation is the dominant factor in how quickly communication may be restored, and is directly related to the time required for the locked loop circuit to regain phase lock with the reference clock signal.

Figure 19:
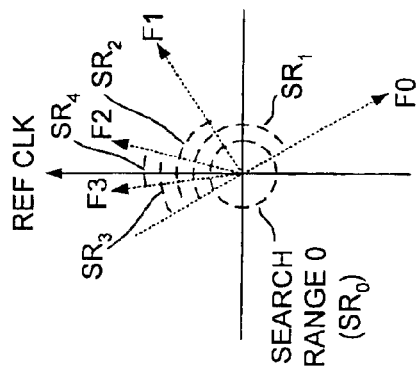
FIG. 19 illustrates a binary phase searching operation according to an embodiment of the invention.

FIG. 19 illustrates a binary phase searching operation in which phase jumping within the tracking loop 203 of the locked loop circuit of FIG. 3 (or tracking loop 747 of FIG. 16) is used to reduce the time required to regain phase lock within the locked loop circuit 200. At the start of a wake-up operation, when the locked loop circuit is enabled (e.g., by enabling the reference clock signal 202 to transition), the tracking loop generates an initial feedback clock signal, F0, having an arbitrary phase with respect to the reference clock signal (REF CLK). The initial feedback clock signal may be generated based on a previously generated (and now stale) phase count value or, in the case of initial wake-up (i.e., at device power-up), a random phase count value or a phase count value that has been reset to a predetermined value (e.g., zero).

Figure 20:
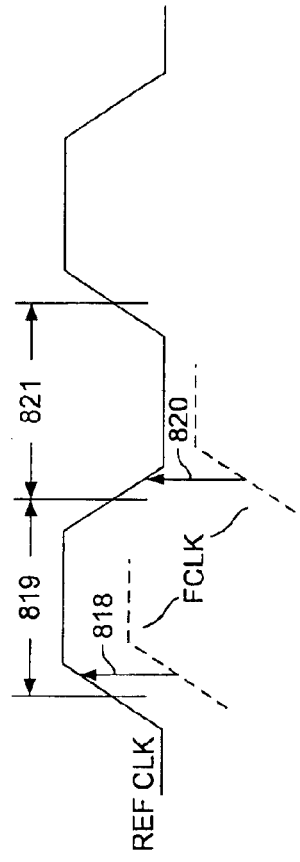
FIG. 20 illustrates possible phase relationships between a reference clock signal and a feedback clock signal generated by a tracking loop.

FIG. 20 illustrates possible phase relationships between the reference clock signal (REF CLK) and the feedback clock signal (FCLK). If a rising edge transition 818 of the feedback clock signal falls within a high interval 819 of the reference clock signal, the feedback clock signal will be determined by a phase detector (i.e., element 247 of FIG. 3 or 757 of FIG. 16) to lag the reference clock signal. Conversely, if a rising edge transition 820 of the feedback clock signal falls within a low interval 821 of the reference clock signal, the feedback clock signal will be determined by the phase detector to lead the reference clock signal. Thus, shortly after a wake-up operation is begun, the phase detector 247 of FIG. 3 (or phase detector 757 of FIG. 16) will output a phase adjust signal that indicates whether the feedback clock signal leads or lags the reference clock signal.

Reflecting on FIG. 20, it can be seen that if the feedback clock signal is indicated to lag the reference clock signal, the feedback clock signal lags the reference clock signal by at most 180°. Conversely, a feedback clock signal indicated to lead the reference clock signal does so by at most 180 degrees. Thus, as shown in FIG. 19, the initial lead/lag indication by the phase detector may be used to halve an initial 360° search range, $SR_0$ (i.e., range of possible phase offsets between the initial feedback clock signal and reference clock signal), thereby producing 180° search range, $SR_1$. Accordingly, by transitioning the phase of the feedback clock signal (i.e., in a phase-jumping operation) to a phase angle in the center of search range $SR_1$, and repeating the lead/lag determination for the new feedback clock signal (F1), search range $SR_1$ may be halved to produce search range, $SR_2$. Search range $SR_3$ may similarly be determined by jumping to feedback clock signal F2 (i.e., in the center of search range $SR_2$) and halving search range $SR_2$ based on the subsequent lead/lag determination. Search range $SR_3$ is similarly halved to produce search range $SR_4$ based on the lead/lag determination for feedback clock phase F3. This operation is continued with the size of the phase jump being halved for each successively determined search range, until the desired phase offset is determined or until the size of the phase jump reaches a minimum value.

Figure 21:
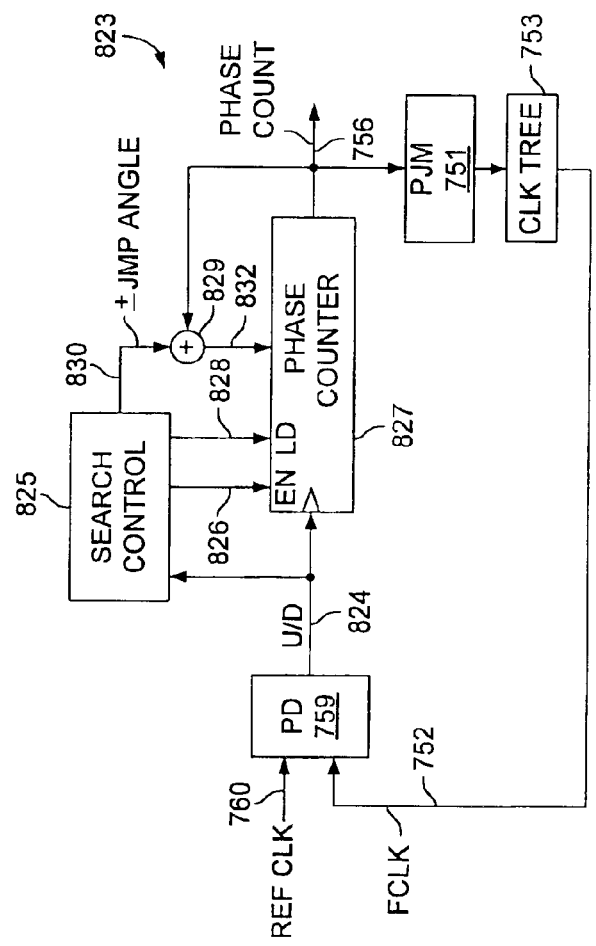
FIG. 21 illustrates a tracking loop for performing a phase searching operation according to an embodiment of the invention.

FIG. 21 illustrates a tracking loop 823 for performing the phase searching operation illustrated in FIG. 19. The tracking loop 823 includes a phase detector 759, phase counter 827, phase jumping mixer 751 and clock tree 753, all of which operate generally as described in reference to FIG. 16 and FIG. 3 to generate a feedback clock signal 752. The tracking loop 823 additionally includes search control logic 825 and adder circuit 829 which are used in the phase search operation to load the phase counter 827 with a sequence of conditionally-determined phase count values.

When a locked loop circuit which includes the tracking loop 823 is enabled (e.g., in a wake-up operation), the value in the phase counter 827 may be stale, random or otherwise may not reflect the phase difference between the reference clock signal 760 and the feedback clock signal 752. Accordingly, the phase of the feedback clock signal 752 may have any phase offset relative to the reference clock signal 760 and the phase search operation of FIG. 19 is undertaken to achieve a phase count value 756 within the phase counter 827 that produces phase alignment between the reference and feedback clock signals 760 and 752.

Figure 22:
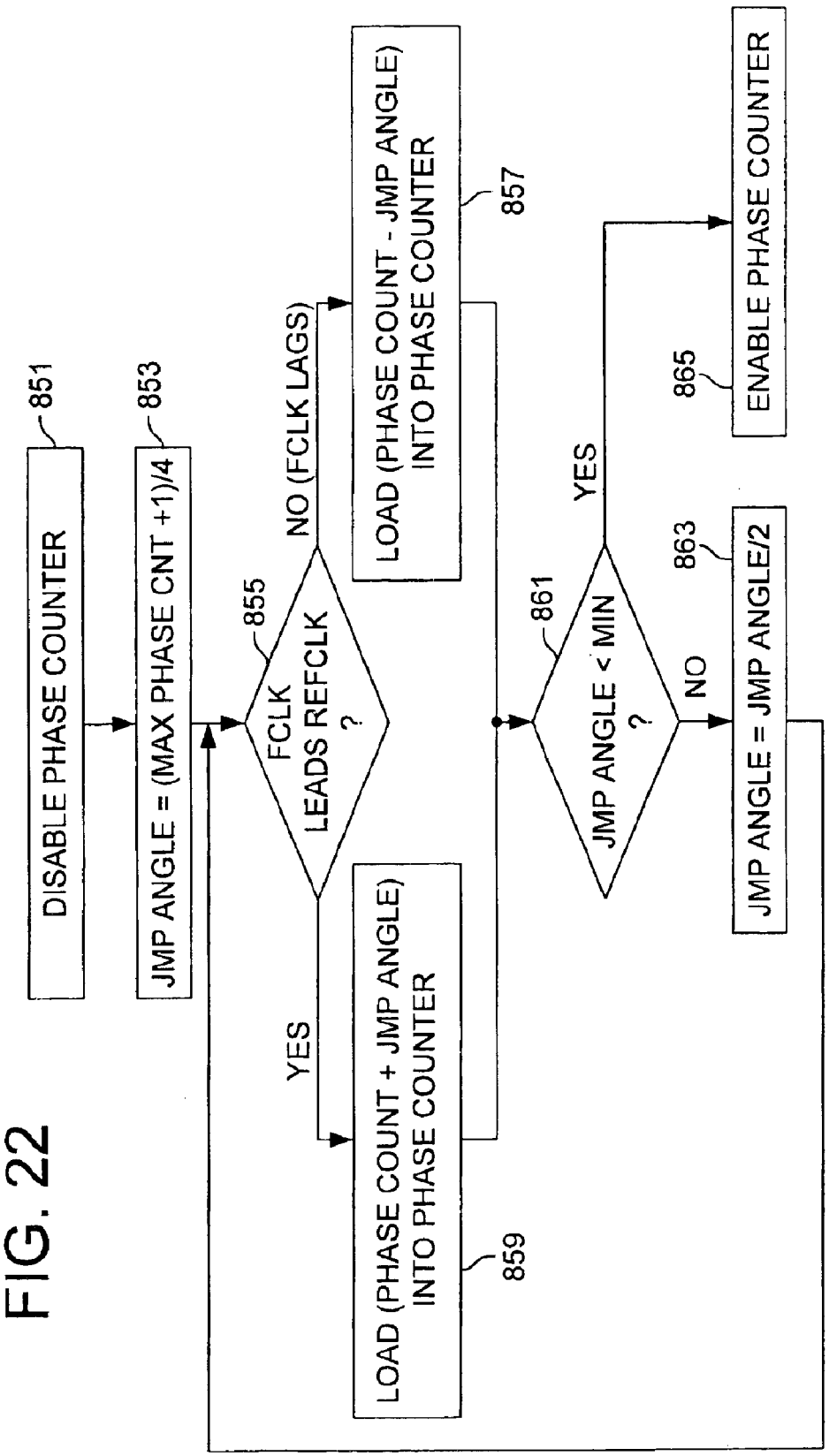
FIG. 22 is a flow diagram of a phase searching operation illustrated according to an embodiment of the invention.

Referring to FIGS. 21 and 22, initially, at block 851, the search control logic 825 deasserts enable signal 826 to disable the phase counter 827 from incrementing and decrementing the phase count 756 in response to the phase adjust signal 824 (I/D) from the phase detector 759. The search control logic 825 also outputs a digital value that represents a phase jump angle; the jump angle initially being set to a value that corresponds to one-fourth of a full cycle of the reference clock signal 760 (i.e., 360°/4=(maximum phase count+1)/4). Note that different initial jump angles may be used, for example, in systems or applications in which the overall search range is less than a full cycle of the reference clock signal 760. The search control logic 825 receives one or more lead/lag indications 824 from the phase detector (e.g., having vote logic to determine a lead/lag result according to whether more lead indications than lag indications, or vice versa, are received within a given time interval) and thereby determines, at decision block 855 whether the feedback clock signal 752 leads or lags the reference clock signal 760. If the feedback clock signal 752 leads the reference clock signal 760, the search control logic 825 outputs a positive jump angle to adder 829 (i.e., via path 830), which responds by adding jump angle to the present phase count value 756 to produce an updated phase count value on path 832. The updated phase count value is loaded into the phase counter 827 in response to assertion of a load signal 828 by the search control logic 825. Thus, as illustrated at block 859 of FIG. 22, the search control logic 825 responds to the lead determination at 855 by loading the phase counter with a sum of the current phase count value and the jump angle, thereby retarding the phase of the feedback clock signal 752 by a phase angle that corresponds to the jump angle. If, at decision block 855, the feedback clock signal 752 is determined to lag the reference clock signal 760, then the search control logic 825 outputs a negative jump angle to the adder 829 (e.g., by operation of a circuit within the search control logic 825 that changes the sign of the jump angle in response to a lag indication), thereby effecting a subtraction of the jump angle from the current phase count value and advancing the phase of the feedback clock signal 752 by a phase angle that corresponds to the jump angle. At block 861 of FIG. 22, the search control logic 825 compares the jump angle to a minimum value. If the jump angle is less than the minimum value, then the search operation is completed and the phase counter 827 is re-enabled at 865 (i.e., search control logic 825 asserts the enable signal 826), thereby enabling linear, incremental phase tracking within the phase counter 827 in response to the phase adjust signal 824 from the phase detector 759. If the jump angle is not less than the minimum value, then the jump angle is halved at block 863 and a new iteration of the binary search operation is begun at 855. In one embodiment, the search control logic 825 includes a shift register to halve the jump angle by right-shifting a binary representation of the jump angle by one bit.

Searching for Leading and Trailing Edges of a Data Eye

After phase lock is achieved within the tracking loop of a phase jumping locked loop circuit, another phase search may be performed in the offset clock generator (i.e., element 749 of FIG. 16, or 205 of FIG. 3) to determine the phase offset between a desired sampling instant and the reference clock signal. Because the tracking loop generates a phase count value that represents an offset between a reference phase vector and the reference clock signal, determining the phase offset for the desired sampling instant may be achieved by determining an offset value to be added to the phase count value to produce a receive clock signal (i.e., sampling clock signal) having the desired phase offset from the feedback clock signal. In one embodiment, this operation involves initiating a data transmission in a remote device to produce an incoming test data stream, then adjusting the phase of the receive clock signal to determine pass-fail phase boundaries that correspond to leading and trailing edges within data eyes of the incoming data stream. The desired sampling instant may then be selected at the midpoint between the pass-fail phase boundaries.

While the task of determining pass-fail phase boundaries may be achieved by incrementing a phase offset value (e.g., the value 208 of FIG. 3, or the value stored in register 765 of FIG. 16) in unitary steps, and testing for correct reception of the test data at each step, this operation can take considerable time, extending the overall system initialization and/ or wake-up time. In one embodiment of the invention, the fast-phase jumping ability of the phase jumping locked loop of FIG. 3 (or FIG. 16) is employed to perform a coarse linear search for leading and trailing edges within data eyes of the test data sequence, for example, by phase jumping through a sequence of clock signals, referred to herein as search vectors, that are offset from one another by a phase angle smaller than an expected minimum eye width. By this operation, at least one of the search vectors, referred to herein as a pass-vector, should fall within the incoming data eye and therefore yield proper reception of the test data sequence. Accordingly, a leading edge of the data eye is known to have a phase offset between a fail-vector (i.e., search vector which fails to yield proper reception of the test data sequence), and an immediately succeeding pass-vector. Similarly, a trailing edge of the data eye is known to have a phase offset between a pass-vector and an immediately succeeding fail vector. The fail-vectors and pass-vectors which bound the leading and trailing edges of the incoming data eye may then be used as bounds in a binary search to rapidly locate the edges of the data eye. A linear search (or other type of search) may be used to locate the edges of the data eye instead of or in addition to the bounded binary search (e.g., bounded binary search to reduce the search range, followed by linear search to determine a precise phase offset). The overall effect of the coarse linear search followed by fine search (binary, linear and/or other), is to significantly reduce the number of phase offsets that are evaluated to locate the edges (and therefore the midpoint) of the data eye, potentially producing a corresponding reduction in the amount of time required to determine the desired receive clock phase offset.

Figure 23:
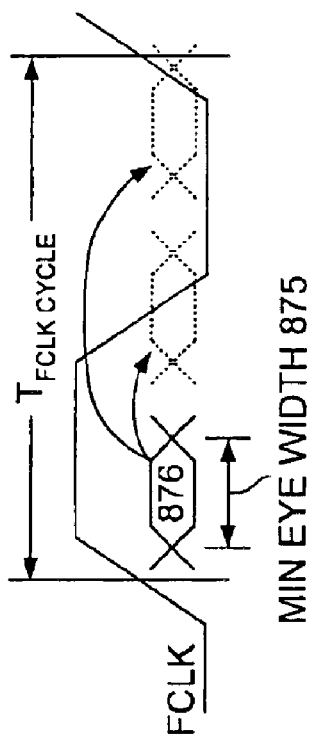
FIG. 23 illustrates the phase offset of an incoming data eye relative to the feedback clock signal generated by a tracking loop.

As shown in FIG. 23, the phase offset of the incoming data eye 876 may have any phase offset within a cycle time of the feedback clock signal, but should have at least some minimum eye width 875. In one embodiment, the minimum eye width is a specified value that is used to determine a number of coarse search ranges by dividing an offset that corresponds to a full cycle angle of the feedback clock signal (i.e., 360°=max offset value+1) by the angle that corresponds to the minimum eye width 875. For example, if the duration of the minimum eye width 875 corresponds to 75° of the feedback clock cycle time, the number of search ranges would be 360°/75°=4 (plus a remainder). In one embodiment, the integer number of search ranges is increased by one to ensure a coarse search range that is smaller than the phase angle of the minimum eye width 875. That is, the number of coarse search ranges=[360°/(phase angle of minimum eye width)]+1. Other formulations for determining the number of coarse search ranges may be used in alternative embodiments.

Figure 24:
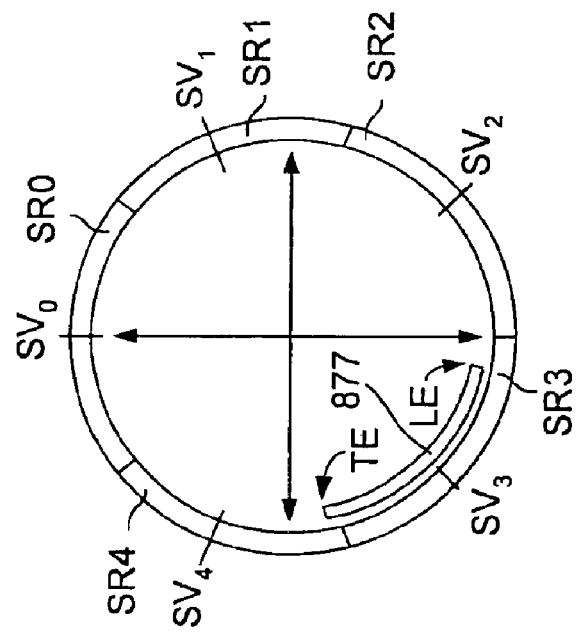
FIG. 24 illustrates a division of a cycle of a feedback clock signal into exemplary search ranges.

FIG. 24 illustrates the division of a cycle of the feedback clock signal (and therefore the reference clock signal) into five search ranges, SR0–SR4, in response to a minimum eye width having an exemplary phase angle of 75°. The minimum eye width may correspond to a substantially smaller or larger phase angle in alternative embodiments. As an example, an actual eye 877 is depicted in FIG. 24 as extending through most of search range SR3 and into part of search range SR4. A search vector is generated for each of the search ranges, SR0–SR4, in sequence by phase jumping from an initial phase offset of zero (search vector, $SV_0$) through a sequence of phase offsets that correspond to the phase angle of the search ranges. That is, a digital phase jump value that corresponds to the size of each search range (i.e., (max phase count +1)/# search ranges) is cumulatively added to the offset control value 208 of FIG. 3 (or the receive clock phase offset value stored in register 765 of FIG. 16) to produce the sequence of search vectors, $SV_0$–$SV_4$, that correspond to the center points of search ranges SR0–SR4, respectively. Thus, in the example of FIG. 24, search vectors $SV_0$, $SV_1$, $SV_2$ and $SV_4$ fall outside the data eye 877 and therefore constitute fail-vectors, while search vector $SV_3$ falls within the data eye and therefore constitutes a pass-vector (i.e., search vector $SV_3$ will yield correct data reception; search vectors $SV_0$–$SV_2$ and $SV_4$ will not). Accordingly, a leading edge of the data eye is bounded by search vectors $SV_2$ and $SV_3$, while a trailing edge of the data eye 877 is bounded by search vectors $SV_3$ and $SV_4$. These bounding vectors may now be used as outer limits in subsequent, finer-granularity searches for the leading and trailing edges of the data eye 877.

Figure 25:
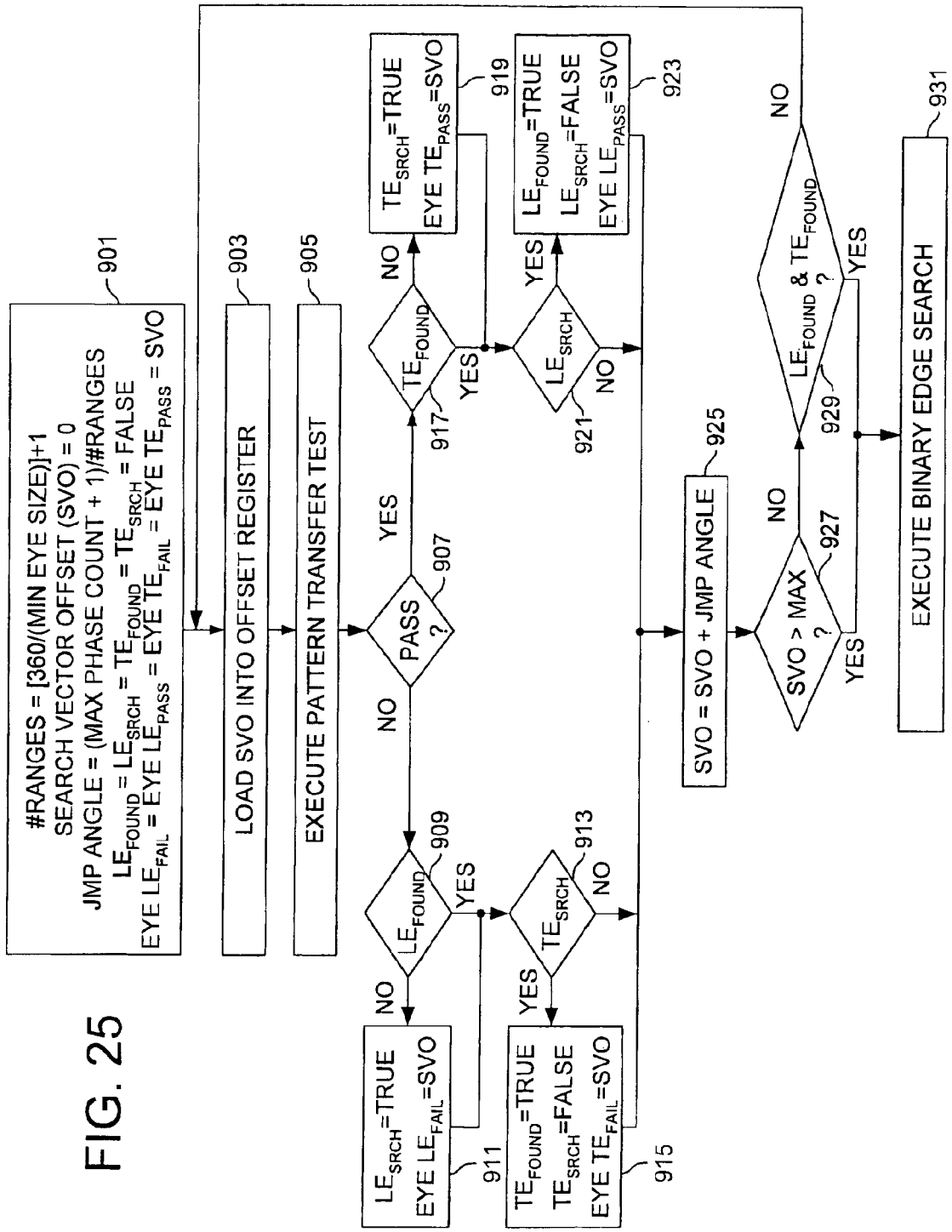
FIG. 25 is a flow diagram of a coarse linear search for leading and trailing edges of a data eye according to an embodiment of the invention.

FIG. 25 is a flow diagram of a coarse linear search for leading and trailing edges of a data eye according to an embodiment of the invention. At 901, the number of search ranges is determined as described above according to the minimum eye size; a search vector offset (SVO), which represents a phase offset value summed with the phase count value from a tracking loop to generate a given search vector, is initialized to zero; a jump angle value (JMP ANGLE) is initialized as described above according to the number of search ranges; Boolean variables, $LE_{FOUND}$, $LE_{SEARCH}$, $TE_{FOUND}$ and $TE_{SEARCH}$, used to indicate the status of the leading and trailing edge searches are initialized to indicate a false state (FALSE); and phase offset variables, EYE $LE_{FAIL}$, EYE $LE_{PASS}$, EYE $TE_{PASS}$ and EYE $TE_{FAIL}$, used to store the phase offsets of search vectors determined to bound the leading and trailing edges of the data eye are initialized to the value of the search vector offset (zero in this example). Note that in alternative embodiments, the number of search ranges may be a predetermined value (i.e., an initial value) or may be generated using other formulations. The jump angle may also be a predetermined value in alternative embodiments.

At 903, the search vector offset is loaded into the offset register to produce an initial search vector (i.e., clock signal generated by the offset clock generator 205 of FIG. 3 or 749 of FIG. 16) that is substantially phase aligned with the feedback clock signal. A pattern transfer test is executed at 905 (i.e., receiving a predetermined sequence of test data values transmitted by a remote device). If the test data sequence was not properly received (i.e., pass/fail determination at 907), then the current search vector is a fail-vector and the search operation branches to 909. If the test data sequence was properly received, the current search vector is a pass-vector, and search operation branches to 917. In the case of a fail-vector, if a leading edge of the data eye has not been found (i.e., any preceding executions of the pattern transfer test have not yielded a fail-vector determination followed by a pass-vector determination), then the fail-vector represents a possible bounding vector for a leading edge of the data eye. Accordingly, at 911, Boolean value $LE_{SEARCH}$ is set to true to indicate detection of a fail-vector, and the search vector offset is recorded in EYE $LE_{FAIL}$, a value that represents the phase angle of the bounding fail-vector for a leading edge of the data eye. At 913, Boolean value $TE_{SEARCH}$ is inspected to determine whether a pass-vector was located in a prior execution of the pattern transfer test at 905. If so, the fail-vector detected in the present iteration constitutes an outer bound of a trailing edge of the data eye. Accordingly, at 915, Boolean value $TE_{FOUND}$ is set to TRUE to indicate that pass- and fail-vectors that bound the trailing edge of the data eye have been found, and the search vector offset that yielded the present fail-vector is recorded in EYE $TE_{FAIL}$. Also, Boolean value $TE_{SEARCH}$ is set to FALSE to prevent further update to the EYE $TE_{FAIL}$ value.

Returning to 907, in the case of a pass-vector, if a trailing edge of the data eye has not been found (i.e., any preceding executions of the pattern transfer test have not yielded a pass-vector determination followed by a trail-vector determination), then the pass-vector represents a possible bounding vector for a trailing edge of the data eye. Accordingly, at 919, Boolean value $TE_{SEARCH}$ is set to true to indicate detection of a pass-vector, and the search vector offset is recorded in EYE $TE_{PASS}$, a value that represents the phase angle of the bounding pass-vector for a trailing edge of the data eye. At 921, Boolean value $LE_{SEARCH}$ is inspected to determine whether a fail-vector was located in a prior execution of the pattern transfer test 905. If so, then the pass-vector detected in the present iteration constitutes an outer bound of a leading edge of the data eye. Accordingly, at 923, Boolean value $LE_{FOUND}$ is set to TRUE to indicate that fail- and pass-vectors that bound the leading edge of the data eye have been found, and the search vector offset that yielded the present pass-vector is recorded in EYE $LE_{PASS}$. Also, Boolean value $LE_{SEARCH}$ is set to FALSE to prevent further update to the EYE $LE_{PASS}$ value.

After fail-vector processing in blocks 909–915 or pass-vector processing in blocks 917–923, the jump angle is summed with the search vector offset at 925 to produce a search vector offset that corresponds to the next search vector. At 927, the search vector offset is compared with a maximum value to determine whether all the search vectors have been evaluated. If so, the coarse linear search is completed and a binary edge search is executed at 931. The binary edge search is described in further detail below in reference to FIG. 26. In one embodiment, even if all the search vectors have not been evaluated, the coarse linear search may still be concluded if the leading and trailing edges of the data eye have been found (i.e., $LE_{FOUND}$ and $TE_{FOUND}$ are determined to be true in 929). Otherwise, the coarse linear search is repeated, starting at 903, for the updated search vector offset.

The following table illustrates the result of a coarse linear search according to FIG. 25 assuming the data eye location depicted in FIG. 24:

TABLE 3

| SVO | Test Result | $LE_{SRCH}$ | $LE_{FOUND}$ | $LE_{FAIL}$ | $LE_{PASS}$ | $TE_{SRCH}$ | $TE_{FOUND}$ | $TE_{PASS}$ | $TE_{FAIL}$ |
|---|---|---|---|---|---|---|---|---|---|
| 0° | Fail | True | False | 0° | 0° | False | False | 0° | 0° |
| 72° | Fail | True | False | 72° | 0° | False | False | 0° | 0° |
| 144° | Fail | True | False | 144° | 0° | False | False | 0° | 0° |
| 216° | Pass | True | True | 144° | 216° | True | False | 216° | 0° |
| 288° | Fail | True | True | 144° | 216° | True | True | 216° | 288° |

Thus, at the conclusion of the coarse linear search, a leading edge of the data eye has been determined to be bounded by phase offsets of 144° and 216°, and a trailing edge of the data eye has been determined to be bounded by phase offsets of 216° and 288°. Note that the search vector offset is a digital value, but is listed in degrees in the table above for purposes of illustration.

Still referring to FIG. 25, in one embodiment, if none of the search vector offsets yields a pass-vector determination, the size of the jump angle is decreased (e.g., by a predetermined factor or by a fixed amount), and the coarse linear search repeated. This shrinking of the jump angle produces a corresponding reduction in the size of the search ranges, and may be repeated until at least one pass-vector is found. Similarly, if no fail-vector is identified, the size of the jump angle may be decreased and the coarse search repeated until at least one fail-vector is found. In such embodiments, the initial size of the search range (or minimum eye width) need not be specified, as the system will iteratively shrink or expand the search ranges (i.e., by jump angle decrease or increase) until pass-fail boundaries are located.

Figure 26:
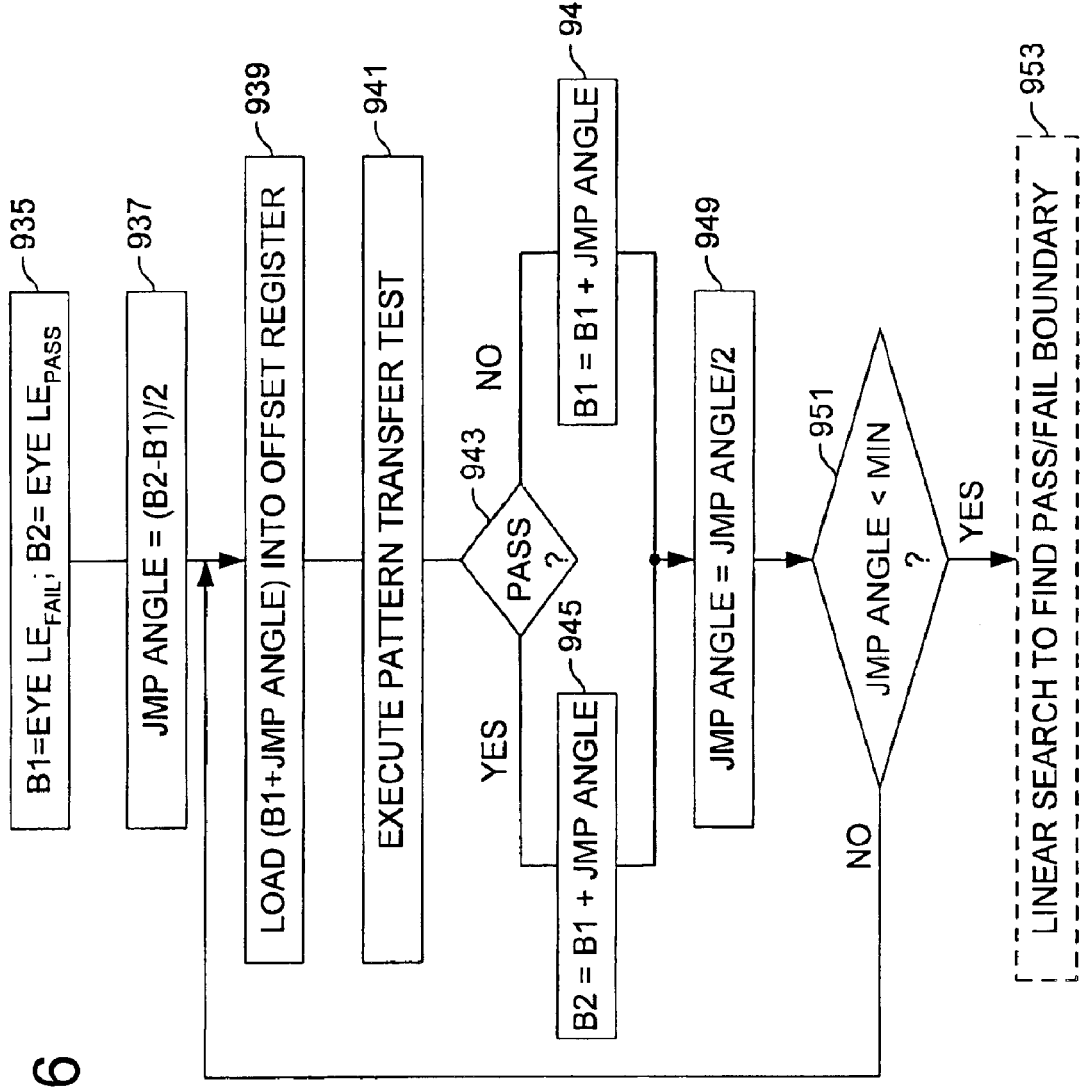
FIG. 26 illustrates a binary search for an edge of a data eye according to an embodiment of the invention.

FIG. 26 illustrates a bounded binary search that may be executed to locate the phase offset of a leading edge of the data eye after execution of the coarse linear search of FIG. 25. Initially, at 935, bounding variables B1 and B2 are loaded with the phase offset values (EYE $LE_{FAIL}$ and EYE $LE_{PASS}$, respectively) determined in the coarse linear search to bound the phase offset of the leading edge of the data eye. At 937, the jump angle (i.e., digital value used to establish a phase jump size) is assigned a value equal to half the size of the phase range defined by bounding phase offsets (i.e., (B2−B1)/2). At 939, a sum of the leading bounding variable, B1, and the jump angle (i.e., B1+JMP ANGLE) is loaded into the offset register (i.e., to control the phase offset of the clock signal generated by the offset clock generator 205 of FIG. 3 or 749 of FIG. 16) to produce an initial binary search vector that falls substantially midway between the phase vectors represented by bounding variables B1 and B2. A pattern transfer test is executed at 941 by receiving a predetermined sequence of test data values transmitted by a remote device and comparing the sequence test data values with an expected sequence. If the test data sequence was not properly received (i.e., test determined not to have passed at 943), then the search vector falls outside the data eye and the bounding variable B1 is loaded with the offset of the current search vector (i.e., B1+JMP ANGLE) at 947, thereby moving the fail-vector offset (represented by B1) closer to the leading edge of the data eye and halving the search range. If the pattern transfer test is determined to have passed at 943, then the bounding variable B2 is loaded with the offset of the current search value at 945, thereby moving the pass-vector offset (represented by B2) closer to the leading edge of the data eye and halving the search range. At 949 the jump angle is halved in preparation for the next iteration of the bounded binary search. At 951 the jump angle is compared with a minimum jump angle (which may be, for example, a programmable value). If the jump angle is less than the minimum jump angle, then the bounded binary search is concluded and a stepwise linear search is optionally performed at 953 to find the precise phase offset of the leading edge of the data eye (i.e., the precise pass-fail boundary). If the jump angle is not less than the minimum jump angle, then the bounded binary search is iterated with the smaller jump angle, starting at 939.

Upon conclusion of the bounded binary search at 951 (and optionally the linear search at 953), the bounded binary search may be repeated to determine the phase offset of the trailing edge of the data eye; the bounding variables B1 and B2 being assigned trailing edge bounding offsets (EYE $TE_{PASS}$ and EYE $TE_{FAIL}$ values, respectively), instead of the leading edge bounding offsets shown in 935; and the operations in 947 and 945 being swapped to account for the opposite direction of the transition between pass- and fail-vectors.

As discussed above, fine linear searches may be used to determine the precise phase offsets of leading and trailing edges of a data eye instead of bounded binary searches. In one embodiment, a coarse linear search is performed as described in reference to FIG. 25 to locate a pair of phase offsets that bound a leading edge of the data eye and a pair of phase offsets that bound a trailing edge of the data eye, then a fine linear search is performed within the phase range bounded by each pair of phase offsets to determine the precise phase offsets of the leading and trailing edges of the data eye. In such an embodiment, the total number of phase search operations (i.e., phase change plus phase comparison) performed may be expressed as follows:

$$N=C+F_1+F_2, \qquad (1)$$

where C is the number of phase search operations performed in the coarse linear search; $F_1$ is the number of phase search operations performed in a fine linear search (i.e., stepwise increment of phase control value, rather than a discontinuous jump) for the phase offset of the leading edge of the data eye, and $F_2$ is the number of phase search operations performed in a fine linear search for the trailing edge of the data eye. Letting M represent the total number of selectable phase offsets within the complete searchable range, then $F_1$ and $F_2$ may be expressed as follows:

$$F_1=F_2=(M-C)/C. \qquad (2)$$

For example, if an 9-bit phase control value is used to control the phase offset of the mix clock signal generated by a phase jumping mixer, and twenty coarse phase search operations are performed to locate the bounding phases of the leading and trailing edges of the data eye, then $M=2^9=512$, and $F_1=F_2=(512-20)/20=25$ (i.e., after rounding up from 24.6 to an integer value). Thus, 25 stepwise phase search operations are performed between bounding coarse phase offsets to locate the leading edge of the data eye and another 25 stepwise phase comparison operations are performed between bounding coarse phase offsets to locate the trailing edge of the data eye, yielding a total of $N=20+25+25=70$ phase search operations to precisely locate the phase offsets of the leading and trailing edges of the data eye.

Substituting the right-hand side of expression (2) for the $F_1$ and $F_2$ terms in expression (1), the following expression for N is obtained:

$$N=C+2(M-C)/C. \qquad (3)$$

In locked loop circuits for which M is a predetermined-value and therefore fixed (M may alternatively be a programmable or adjustable value), it can be seen that N is a nonlinear function of C. Based on this insight, expression (3) may be rewritten as a differential expression and solved for a relative minima (the second derivative of expression (3) is positive for C>0, so that the zero-valued first derivative is a relative minima) as follows:

$$N=C+2MC^{-1}-2 \text{ \{rewriting expression (3) to simplify the differential\}} \qquad (4)$$

$$dN/dC=1-2MC^{-2} \qquad (5)$$

$$0=1-2MC^{-2} \text{ \{setting the differential to zero to solve for the relative minima\}} \qquad (6)$$

$$C=(2M)^{1/2} \qquad (7)$$

Thus, for a locked loop circuit having M selectable phase offsets within a searchable range, the number of coarse linear search operations, C, which yields the lowest total number (N) of coarse and fine linear search operations used to determine the phase offsets of the trailing and leading edges of a data eye is given by the square root of 2M. In the example above in which M=512, expression (7) indicates a minimum N when C=32. Inserting C=32 into expression (2) yields F1=F2=15. Similar analyses may be performed for systems in which a coarse linear search is followed by a bounded binary search, and for systems in which phase comparison operations are performed more than once per phase offset (e.g., performing the phase comparison operation multiple times to filter erroneous lead-lag determinations).

For some values of M (256, for example), the expression (7) yields a non-integer value for C which, when rounded up or down to the nearest integer, may lead to a value of N that is not a minimum. In such cases, neighboring values of C (i.e. C+1, C+2, ..., C−1, C−2, ...) can be checked to determine if the resulting number of searches (i.e. values of N) are lower than with the calculated value of C. Alternatively, the calculated, rounded value of C can be used since the corresponding value of N will be close to the absolute minimum, if not the absolute minimum.

Timing Maintenance; Compensation for Drift

Figure 27:
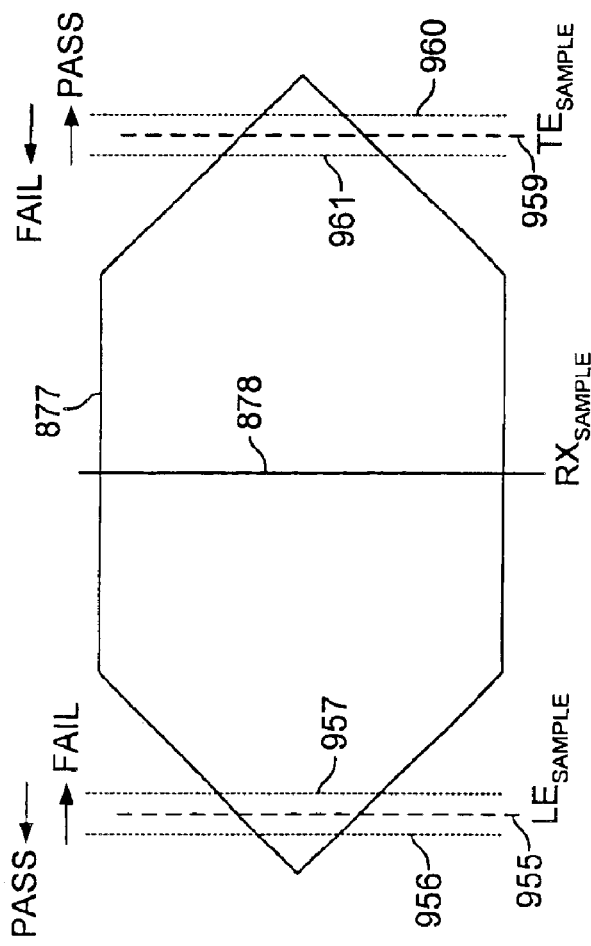
FIG. 27 illustrates a timing maintenance operation according to an embodiment of the invention.

In one embodiment of the present invention, the fast phase-jumping ability of the locked loop circuit 200 of FIG. 3 (or locked loop circuit 745 of FIG. 16) is employed to perform a periodic (and/or event-driven) timing maintenance operation, for example to compensate for a voltage- and/or temperature-induced phase error. Referring to FIG. 27, during normal operation of the locked loop circuit, a receive clock signal is used to sample an incoming data waveform in the center of each successive data eye 877 to provide maximum leading and trailing edge margin (note that sampling instants offset from the center of the data eye may be used in alternative embodiments, particularly where the data setup and hold times of the receiver circuit are asymmetric). Due to changes in voltage, temperature or other environmental or device parameters, the actual sampling instant, indicated by 878 may become skewed relative to the desired sampling instant, resulting in a loss of timing margin.

Figure 28:
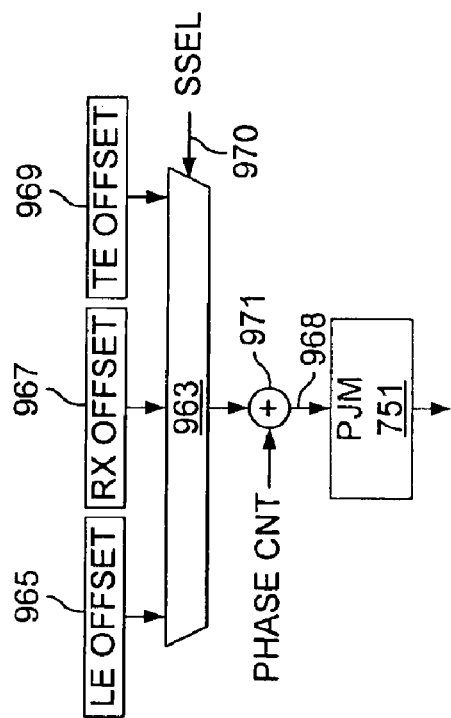
FIG. 28 illustrates a circuit for generating a phase control value according to an embodiment of the invention.

Referring to FIGS. 27 and 28, in one embodiment, leading-edge and trailing-edge phase offset values that correspond to leading and trailing edge boundaries of the data eye 877 are recorded in a storage registers 965 and 969 within a phase jumping locked loop circuit according to the invention (or elsewhere in the integrated circuit that includes the phase jumping locked loop circuit) and therefore may be selected for summation with the phase count value (i.e., generated by the tracking loop 203 of FIG. 3 and the tracking loop 747 of FIG. 16) to generate leading- and trailing-edge sampling clocks. In one embodiment, the leading-edge and trailing-edge phase offset values are generated during system initialization (e.g., by using the search operations described above in reference to FIGS. 23–26), and used to generate a receive phase offset value that is stored in register 967; the receive phase offset value being generated, for example, by averaging the leading-and trailing-edge offset values stored in registers 965 and 969. During normal operation, sample select signal 970 (SSEL) is set to a normal state to select, via select circuit 963, register 967 to source a phase offset value to be summed with the phase count value (PHASE CNT) in adder 971. The resulting phase control value 968 is then supplied to phase jumping mixer 751 which generates an offset clock signal (optionally to propagate through a clock tree) for timing the sampling instant 878.

When a timing maintenance operation is to be performed, the sample select signal 970 is transitioned to a leading-edge-test state, and selects register 965 to source a leading edge phase offset value to adder 971. Consequently, the phase control value 968 is transitioned from the sampling clock phase control value to a leading-edge phase control value. The phase jumping mixer 751 responds to the transition of the phase control value 968 by rapidly transitioning the phase of the output clock signal to the leading edge sampling instant shown at 955 of FIG. 27. A data transfer test is then performed to determine whether an incoming data eye (or sequence of data eyes) is properly received when sampled at the leading fringe of the data eye 877 (i.e., at 955). If the leading-edge data transfer test is passed (i.e., proper data reception confirmed), the leading-edge phase offset value within register 965 is decremented to establish the new leading-edge sampling instant shown at 956. If the leading-edge data transfer test is failed, the leading-edge phase offset value within register 965 is incremented to establish the new leading-edge sampling instant shown at 957.

After a pass/fail result is recorded for the leading-edge data transfer test, the sample select signal 970 is transitioned to a trailing-edge-test state, and selects register 969 to source a trailing edge phase offset value to adder 971. The adder 971 responds to the new phase offset value by transitioning the phase control value 968 from the leading-edge phase control value to a trailing-edge phase control value, and the phase jumping mixer 751 responds in turn by rapidly transitioning the phase of the output clock signal to the trailing edge sampling instant shown at 959 of FIG. 27. A data transfer test is then performed to determine whether an incoming data eye (or sequence of data eyes) is properly received when sampled at the trailing fringe of the data eye 877 (i.e., at 959). If the trailing-edge data transfer test is passed, the trailing-edge phase offset value within register 969 is incremented to establish the new leading-edge sampling instant shown at 960. If the trailing-edge data transfer test is failed, the trailing-edge phase offset value within register 969 is decremented to establish the new leading-edge sampling instant shown at 961.

Still referring to FIG. 27, it can be seen that if the leading-edge data transfer test passes and the trailing-edge data transfer test fails, then the phase of the data eye 877 has shifted in the direction of the leading edge (i.e., the phase of the data eye 877 has advanced relative to the reference clock signal). Thus, the receive clock phase offset value stored in register 967 is decremented in response to a leading-edge pass/trailing-edge fail condition, thereby keeping the sampling instant 878 substantially phase aligned with the center of the data eye 877 (or phase aligned with a desired phase offset from the center of the data eye 877). Conversely, if the leading-edge data transfer test fails and the trailing-edge data transfer test passes, then the data eye 877 has shifted in the direction of the trailing edge (i.e., the phase of the data eye has become increasingly delayed relative to the reference clock signal), and the receive clock phase offset value stored in register 967 is incremented to keep the sampling instant substantially phase aligned with the center of the data eye (or phase aligned with a desired phase offset from the center of the data eye 877). By periodically repeating the phase adjustment operations illustrated in FIG. 27, the sampling instant 878 is enabled to track phase drift in the data eye (e.g., caused by changes in voltage and temperature), thereby conserving system timing margin.

Figure 29:
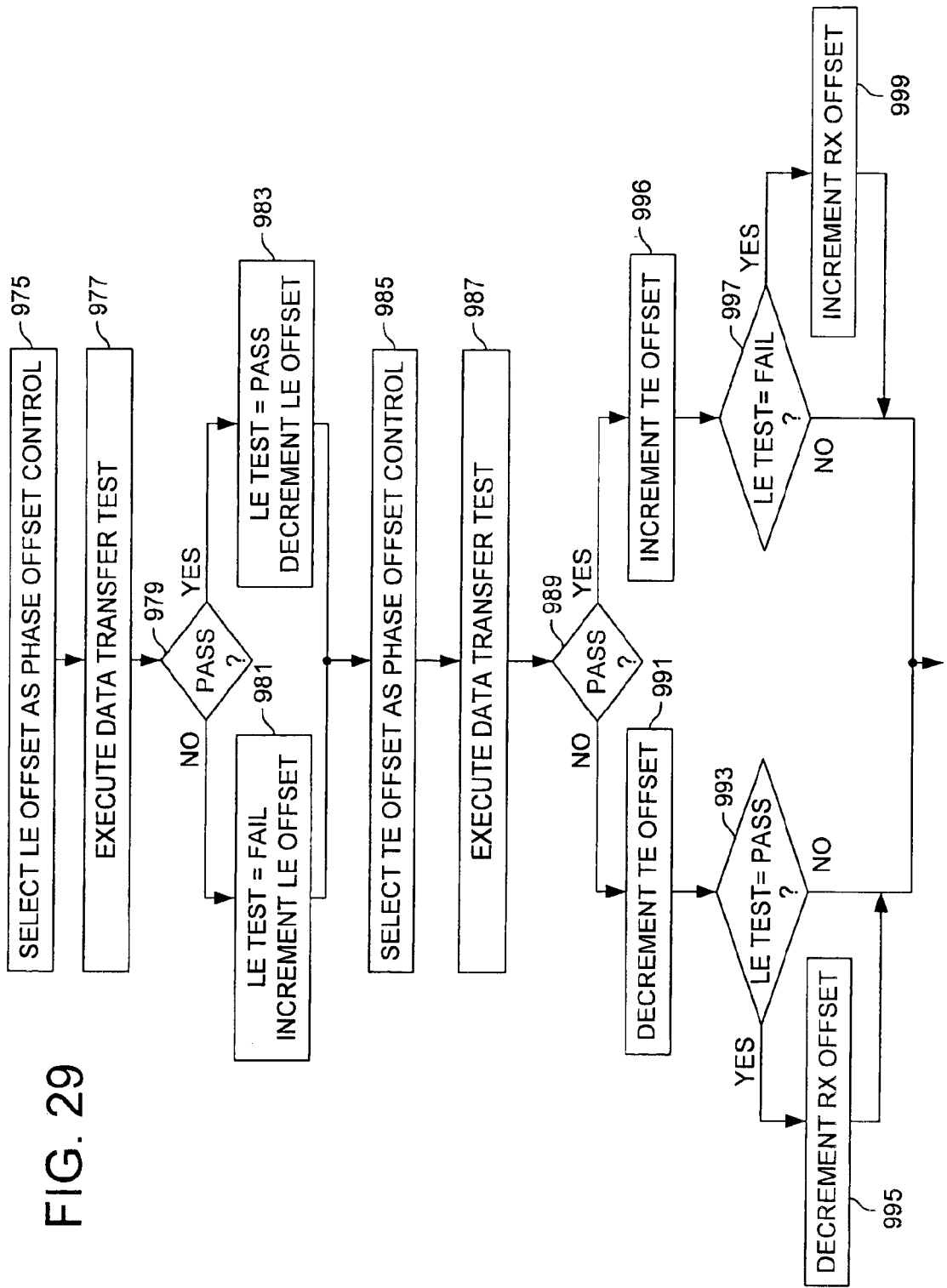
FIG. 29 is a flow diagram of a timing maintenance operation according to an embodiment of the invention.

FIG. 29 is a flow diagram of a timing maintenance operation according to an embodiment of the invention. At 975 the leading-edge phase offset value (i.e., the value stored in register 965 of FIG. 28) is selected to generate a leading-edge-aligned clock signal. At 977, a leading-edge data transfer test is performed. If the leading-edge data transfer test is determined to pass (979), then at 973, a Boolean variable, LE TEST is assigned a PASS value, and the leading edge phase offset value is decremented. If the leading-edge data transfer test is determined not to pass, then at 981, LE TEST is assigned a FAIL value, and the leading edge phase offset value is incremented. At 985, the trailing-edge phase offset-value (i.e., the value stored in register 969 of FIG. 28) is selected to generate a trailing-edge-aligned clock signal. At 987, a trailing-edge data transfer test is performed. If the trailing-edge data transfer test is determined not to pass (989), then at 991 the trailing edge phase offset value is decremented. The Boolean variable, LE TEST is inspected at 993 to determine whether the leading-edge phase offset value has also been decremented (i.e., LE TEST=PASS) and, if so, the receive clock phase offset value (i.e., the value stored in register 967 of FIG. 28) is decremented to track the shift in the data eye. If the leading-edge phase offset value has not been decremented, the receive clock phase offset value is not adjusted. If the trailing-edge data transfer test is determined to pass, then the trailing-edge phase offset value is incremented at 996, and the LE TEST variable is inspected at 997 to determine whether the leading-edge phase offset value has also been incremented (i.e., LE TEST=FAIL). If the leading-edge phase offset value has been incremented, then the receive clock phase offset value is incremented at 999 to track the shift in the data eye. If the leading-edge phase offset value has not been incremented, then the receive clock phase offset value is not adjusted. It should be noted that the increment and decrement operations at 999 and 995, respectively, effectively maintain the receive clock phase offset value midway between the leading- and trailing-edge phase offset values. In an alternative embodiment, the receive clock phase offset value may be re-calculated after each update to the leading- and/or trailing-edge phase offset value, for example, by dividing a sum of the leading- and trailing-edge phase offset values by two (i.e., halving the sum of the offset values) or by another predetermined number.

Per-Device Phase Offset; Source- and Destination-Based Phase Jumping

Figure 30:
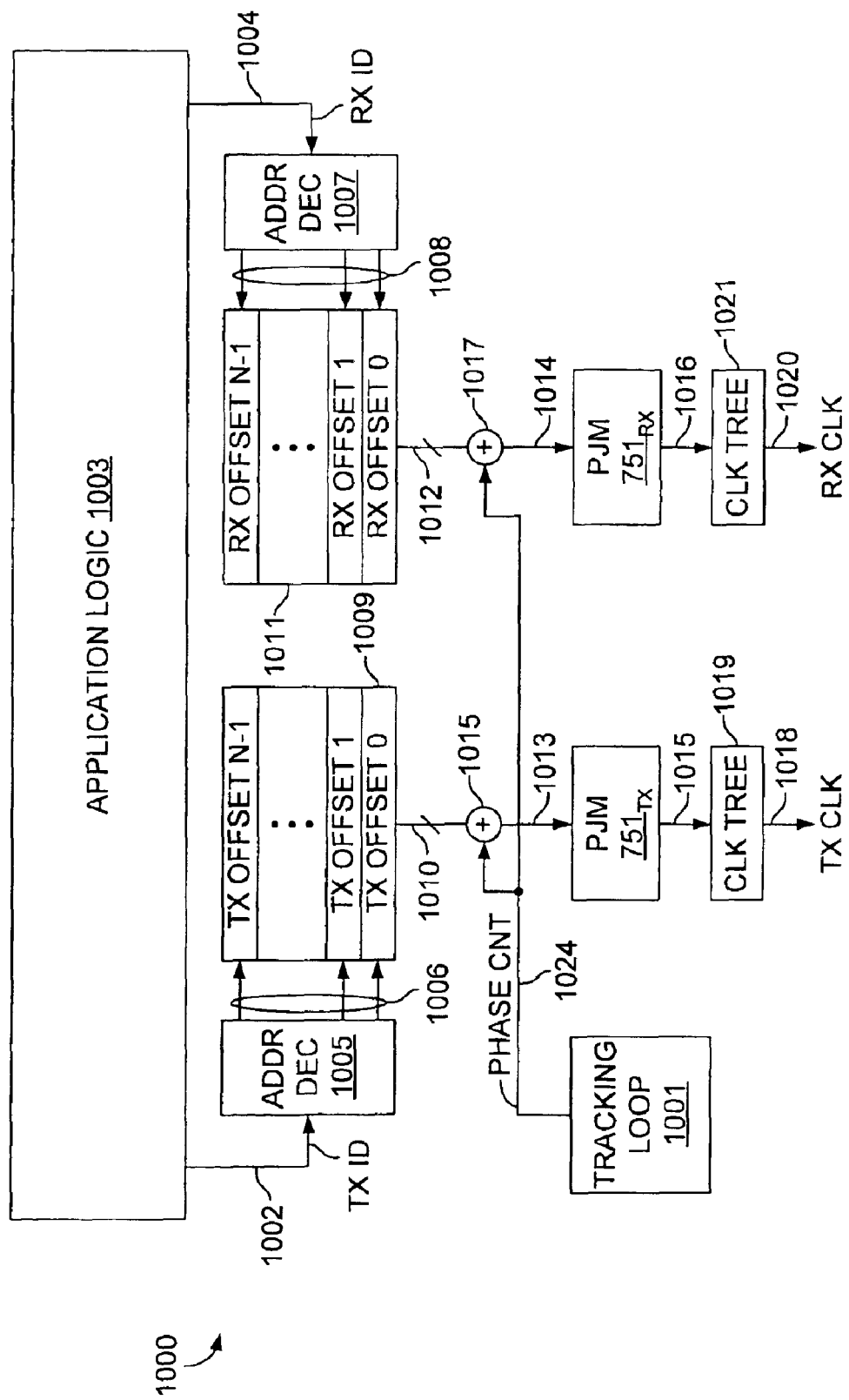
FIG. 30 illustrates a signaling device according to an embodiment of the invention.

In one embodiment of the present invention, the fast phase-jumping ability of the locked loop circuit 200 of FIG. 3 (and locked loop circuit 745 of FIG. 16) is employed to enable source- and destination-based phase jumping. FIG. 30 illustrates a signaling device 1000 which includes a storage circuit 1009 to store a number, N, of transmit clock phase offset values, each transmit clock phase offset value corresponding to a respective one of a plurality of remote devices within a signaling system. In one embodiment, the storage circuit 1009 includes a plurality of storage elements arranged in rows and columns. Access enable lines 1006 are coupled to respective rows of storage elements and bit lines (not shown in FIG. 30) are coupled to respective columns of storage elements. When an address-selected one of the access enable lines 1006 is activated, read or write access to the corresponding row of storage cells is enabled, with the access to individual storage elements of the row occurring via respective bit lines. By this arrangement, each of the rows of storage elements is enabled to store a respective phase offset value received via the bit lines in a write operation, and each of the rows of storage elements is enabled to output a previously stored phase offset value in a read operation. When application logic 1003 receives (or generates) a request to transmit data to one of the remote devices, the application logic 1003 outputs a transmit identifier value 1002 which identifies the remote device intended to receive the transmission. The transmit identifier is received within an address decoder 1005 which activates one of the plurality of access-enable lines 1006 to enable a corresponding one of the transmit phase offset values (each being a digital value stored within a row of storage elements within the storage circuit 1009) to be output to adder 1015 via bit lines 1010. The selected transmit phase offset value is added to the phase count value 1023 generated within the tracking loop 1001 to generate an updated phase control word 1013. The phase jumping mixer 751$_{TX}$ responds to the updated phase control word 1013 by rapidly transitioning the phase of an output clock signal 1015 to the indicated transmit phase offset. The output clock signal 1015 propagates through a clock tree circuit 1019 (which may be omitted where significant clock signal fan out is not needed) to generate a transmit clock signal 1018 having the desired phase. By this arrangement, the locked loop circuit responds to each new transmit identifier 1002 output by the application logic (and corresponding transmit phase offset value output from the storage circuit 1009) by rapidly transitioning the phase of the transmit clock signal 1018 to the transmit phase offset recorded for the corresponding remote device.

Still referring to FIG. 30, storage circuit 1011 is provided to store a number, N, of receive clock phase offset values, each transmit clock phase offset value corresponding to a respective one of the plurality of remote devices within the signaling system. When application logic 1003 receives (or generates) a request to receive data from one of the remote devices, the application logic 1003 outputs a receive identifier value 1004 which identifies the remote device. The receive identifier is received within an address decoder 1007 which activates one of a plurality of access-enable lines 1008 to enable a corresponding one of the receive phase offset values (each being a digital value stored within a row of storage elements within the storage circuit 1011) to be output to adder 1017 via bit lines 1012. The selected transmit phase offset value is added to the phase count value 1024 to generate an updated phase control word 1014. The phase jumping mixer 751$_{RX}$ responds to the updated phase control word 1014 by rapidly transitioning the phase of an output clock signal 1016 to the indicated receive phase offset. The output clock signal 1016 propagates through a clock tree circuit 1021 (which may be omitted where significant clock signal fan out is not needed) to generate a receive clock signal 1020 having the desired phase. By this arrangement, the locked loop circuit responds to each new receive identifier 1004 output by the application logic (and corresponding receive phase offset value output from the storage circuit 1011) by rapidly transitioning the phase of the receive clock signal 1020 to the receive phase offset recorded for the corresponding remote device. Note that the application logic 1003 may generate the request to receive data from a remote device in response to a previous transmission to the remote device. For example, in a memory system, the signaling device 1000 may be a memory controller that transmits a memory read command (or memory read request) to a remote memory device, the read command evoking a responsive, deterministic transmission by the memory device that is received by one or more receive circuits within the signaling device 1000 under control of the receive clock signal 1020.

Still referring to FIG. 30, the storage circuits 1011 and 1009 and corresponding address decoders 1005 and 1007 may be replaced by a unified storage circuit and corresponding unified address decoder in an alternative embodiment. In such an embodiment, the application logic 1003 may output a device identifier to indicate which device is to be the source or destination of a transmission, with a most significant bit (or least significant bit of the device identifier being used to select between transmit and receive phase offsets. Also, while separate adders (1015, 1017), phase jumping mixers (751$_{TX}$, 751$_{RX}$) and clock tree circuits 1019 and 1021 are depicted in FIG. 30, a single adder (or summing circuit 767 of FIG. 16), phase jumping mixer and-clock tree circuit may be alternatively be used in the arrangement described in reference to FIGS. 16–18 to alternatively generate a transmit clock signal (having a phase offset according to the selected one of N transmit phase offset values) and a receive clock signal (having a phase offset according to the selected one of N receive phase offset values) on a shared clock line.

Locked Loop Circuit with Clock Hold Function

Figure 31:
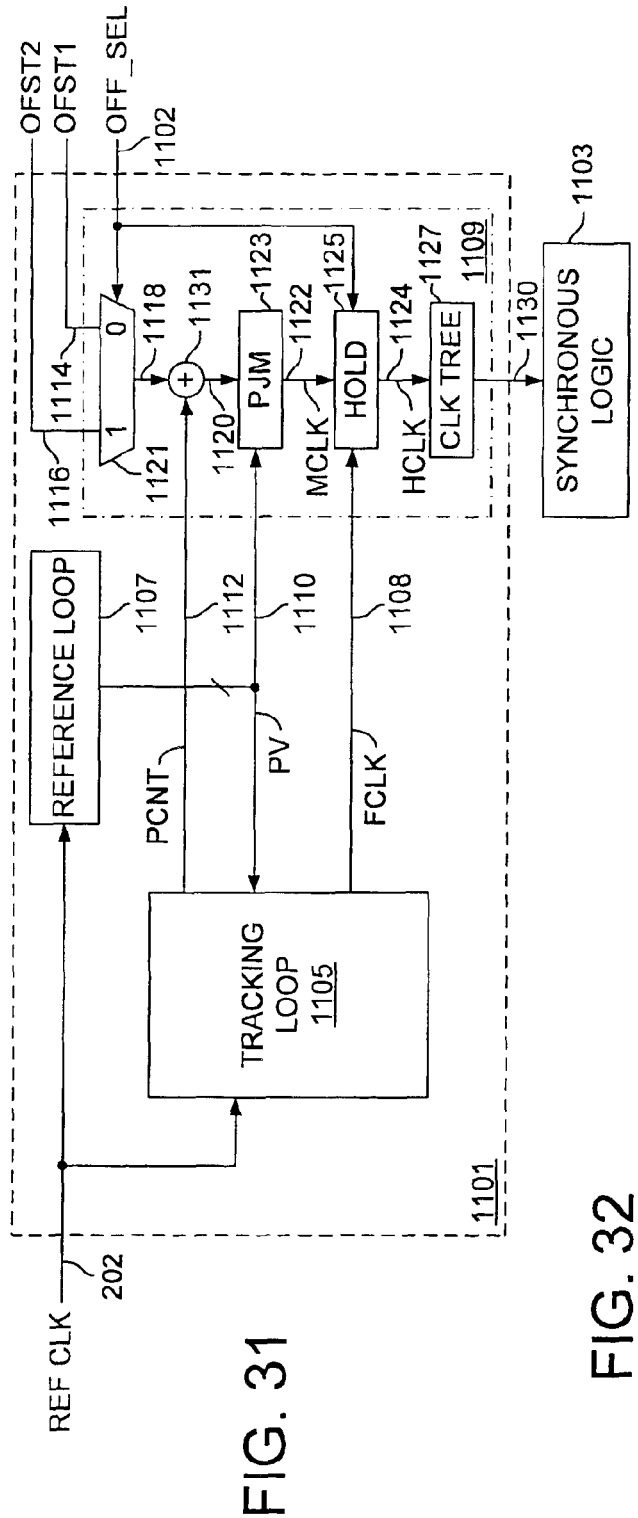
FIG. 31 illustrates another phase-jumping locked loop circuit according to an embodiment of the invention.

FIG. 31 illustrates a phase-jumping locked loop circuit 1101 that generates a clock signal 1130 for clocking a synchronous logic circuit 1103. The locked loop circuit 1101 includes a tracking loop 1105, reference loop 1107, and offset clock generator 1109. The reference loop 1107 operates as described above in reference to FIGS. 3 and 10 to output a plurality of phase vectors 1110 (PV) to phase mixing circuits within the tracking loop 1105 and offset clock generator 1109. The tracking loop 1105 operates as described above in reference to FIGS. 3 and 16 to adjust a phase count 1112 (PCNT) as necessary to produce a feedback clock signal 1108 (FCLK) that is phase-aligned with a reference clock signal 202. The phase count value 1112 represents a phase offset between the feedback clock signal and a reference phase vector (i.e., one of the phase vectors 1110 designated to have, for example, a zero degree phase angle), and is supplied to the offset clock generator 1109 along with the feedback clock signal 1108.

The offset clock generator 1109 includes an offset selector 1121, adder 1131, phase jumping mixer 1123, clock hold circuit 1125, and clock tree circuit 1127. The offset selector 1121 selects between offset values 1114 and 1116 (OFST1 and OFST2, respectively) according to an offset select signal 1102 (OFF_SEL). The selected offset value 1118 is summed with the phase count value 1112 in adder 1131 to produce a phase control value 1120. In an alternative embodiment more than two offset values may be input to the offset selector 1121, and the offset values or a subset thereof may be maintained within the locked loop circuit 1101 rather than being provided by external logic. Also, the phase count value 1112 may alternatively be summed with each of the offset values in separate adder circuits, with the summed values being input to the offset selector 1121 (see summing circuit 750 of FIG. 16, for example). Further, while the offset selector 1121 is depicted as a multiplexer in FIG. 31, any circuit capable of selecting one of a plurality of offset values or phase control values (e.g., an address decoder in association with a memory array, register file or other storage), may be used in alternative embodiments.

The phase jumping mixer 1123 generates a mix clock signal 1122 (MCLK) by interpolating between a selected pair of the phase vectors 1110 in accordance with the phase control value 1120. The mix clock signal 1122 is provided to the clock hold circuit 1125 which, in response, outputs a hold clock signal 1124 (HCLK) to the clock tree circuit 1127. The hold clock signal 1124 propagates through the clock tree circuit 1127 to produce multiple instances of an offset clock signal, at least one of which is the clock signal 1130 provided to the synchronous logic circuit 1103. The synchronous logic circuit includes one or more logic circuits which respond to transitions in the clock signal 1130 (e.g., flip-flops and/or other edge-triggered logic circuits). Note that the clock tree circuit 1127 may be omitted in embodiments in which the fan-out of the hold clock signal 1124 is limited. Also, a delay circuit which exhibits substantially the same propagation delay as the clock hold circuit 1125 may be included within the tracking loop 1105 such that, in the case of a zero-valued offset 1118, clock signal 1130 is substantially phase aligned to with the feedback clock signal 1108.

Figure 32:
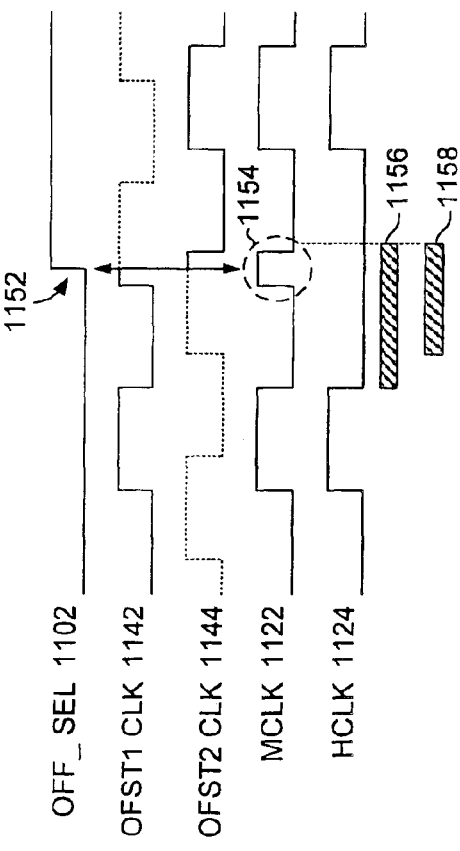
FIG. 32 illustrates an exemplary relationship between the offset select, mix clock, and hold clock signals of FIG. 31.

FIG. 32 illustrates an exemplary relationship between the offset select signal 1102, mix clock signal 1122 and hold clock signal 1124. Also shown are two clock signals, OFST1 CLK (1142) and OFST2 CLK (1144), which correspond to mix clock signals 1122 that will be generated by the phase jumping mixer 1123 for corresponding selections of the offset control values 1114 and 1116 (OFST1 and OFST2, respectively). To be clear, clock signals OFST1 CLK and OFST2 CLK are not separately generated within the locked loop circuit 1101, but rather represent instances of the mix clock signal 1122 that correspond to OFST1 and OFST2, respectively. Thus, when the offset select signal 1102 is low, OFST1 is selected as the offset control value 1118, and the mix clock signal 1122 has a phase according to the OFST1 CLK 1142. When the offset select signal 1102 goes high at 1152, a phase jump is initiated within the phase jumping mixer to transition the phase of the mix clock signal 1122 from the phase of OFST1 CLK 1142 to the phase of OFST2 CLK 1144. Because of the phase difference between OFST1 CLK and OFST2 CLK, the phase jump produces a short-duration pulse 1154 within the mix clock signal 1122, referred to herein as a runt pulse. Depending on the starting time and duration of the phase jump operation, the runt pulse 1154 may be wider or narrower than shown in FIG. 32, and may be a low-level runt pulse rather than a high-level runt pulse.

Clock signals exhibiting occasional runt pulses may be tolerated in some systems, (e.g., where the clock signal is used solely to clock input/output circuits), but tend to produce undesirable meta-stable states and/or race conditions in synchronous logic circuits due to the inability to guarantee signal setup and hold times and due to the uncertain transition time of state variables (e.g., flip-flop outputs). In the locked loop circuit 1101 of FIG. 31, the clock hold circuit suppresses runt clock pulses to avoid meta-stability and race conditions.

Still referring to FIGS. 31 and 32, the clock hold circuit 1125 is coupled to receive the offset select signal 1102 and, upon detecting a transition in the offset select signal 1102, latches the state of the hold clock signal 1124 over a clock hold interval 1156 that is long enough to avoid generation of a low-level or high-level runt pulse. In one embodiment, the mix clock signal 1122 may have an arbitrary phase relative to the transition time of the offset select signal, and therefore the hold clock signal 1124 may be in transition at the start of the clock hold interval 1156. To prevent latching or otherwise capturing an indeterminate state of the hold clock signal 1124, the clock hold circuit includes circuitry to predict whether the leading edge of the clock hold interval 1156 will coincide with a transition of the hold clock signal 1124 and, if so, to delay the start of the clock hold interval to a later time, thereby producing a delayed clock hold interval 1158. In this way, a determinate state of the hold clock signal 1124 will be latched by the clock hold circuit 1125, regardless of when the offset select signal 1102 transitions.

Figure 33:
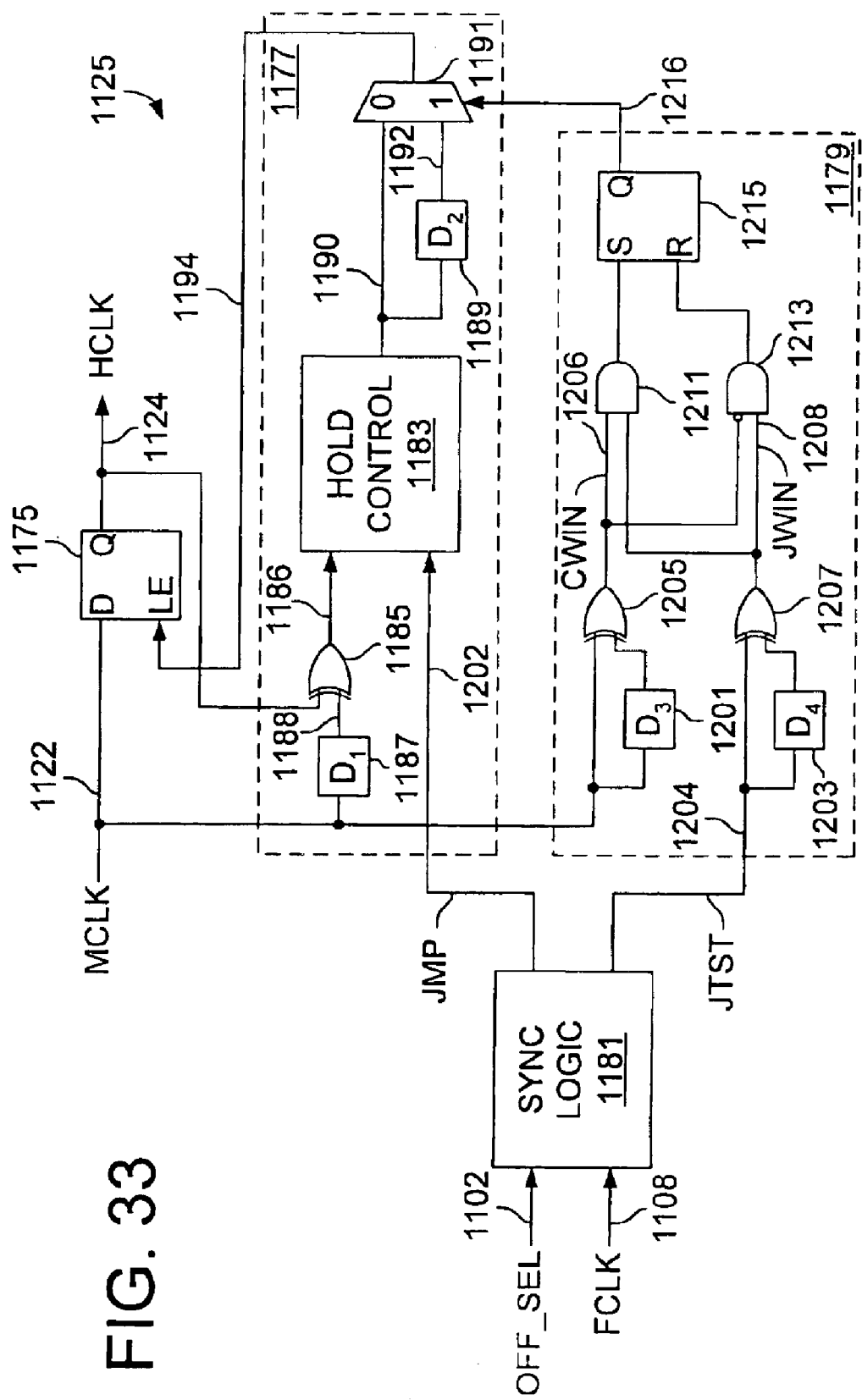
FIG. 33 illustrates the clock hold circuit of FIG. 31 according to an embodiment of the invention.

FIG. 33 illustrates the clock hold circuit 1125 of FIG. 31 according to an embodiment of the invention. The clock hold circuit 1125 includes a latch 1175, hold signal generator 1177, synchronizing logic 1181, and keepout signal generator 1179. The latch 1175 receives the mix clock signal 1122 from a phase jumping mixer and, so long as a qualified hold signal 1194 is deasserted (i.e., at a latch-enable input, LE), passes the mix clock signal 1122 to the latch output (Q) as the hold clock signal 1124. When the qualified hold signal 1194 is asserted, the latch 1175 maintains (i.e., latches) the hold clock signal 1124 at its most recently output state, even as the mix clock signal 1122 changes state at the input of latch 1175.

The hold signal generator 1177 includes a hold control circuit 1183, delay element 1187 ($D_1$), exclusive-OR gate 1185, delay element 1189 ($D_2$) and multiplexer 1191. In one embodiment, the hold control circuit 1183 is a finite state machine that outputs a hold signal 1190 as a state variable, and that transitions between states according to the respective states of a jump signal 1202, and a clock-XOR signal 1186. The jump signal 1202 is asserted by the synchronizing logic 1181 in response to a transition in the offset select signal 1102, and therefore indicates that a phase jump in the mix clock signal 1122 is being initiated. The clock-XOR signal 1186 is high whenever the hold clock signal 1124 and a delayed instance 1188 of the mix clock signal 1122 (i.e., delayed by delay element 1187), have different states. In one embodiment, the delay element 1187 is formed by an inverter chain that matches an inverter chain in a non-latching input-to-output path within the latch 1175. Consequently, when the qualified hold signal 1194 is deasserted, the delayed mix clock signal 1188 is phase aligned with the hold clock signal 1124, and the clock-XOR signal 1186 is low. By contrast, when the qualified hold signal 1194 is asserted, the clock-XOR signal goes high when the delayed mix clock signal 1188 transitions to a state different from the latched state of the hold-clock signal. That is, the clock-XOR signal goes high at the start of the first high- or low-level pulse following assertion of the qualified hold signal 1194.

Figure 34:
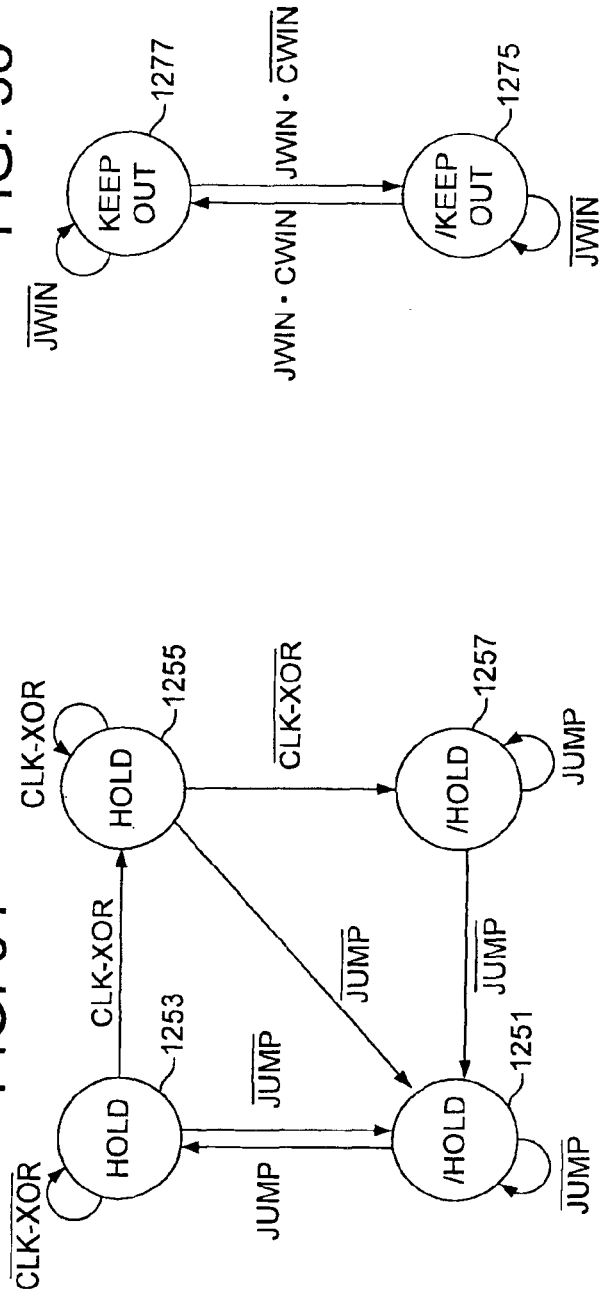
FIG. 34 is an exemplary state diagram of the hold control circuit of FIG. 33.

FIG. 34 is an exemplary state diagram of the hold control circuit 1183 of FIG. 33. Referring to FIGS. 33 and 34, the hold control circuit 1183 is initialized to a first state 1251 and remains in state 1251 until the jump signal is asserted. State 1251 is a non-hold state, meaning that the hold signal 1190 is deasserted and therefore that the qualified hold signal 1194 is deasserted and the hold clock signal 1124 tracks the mix clock signal. When the jump signal 1202 is asserted, the hold control circuit 1183 transitions to a second state 1253. In state 1253, the hold signal 1190 is asserted, producing a corresponding assertion of qualified hold signal 1194 to latch the state of the hold clock signal 1124. When the hold signal 1190 is initially asserted, the state of the hold clock signal and the delayed mix clock signal 1188 are the same so that the clock-XOR signal 1186 is low. At the first transition of the delayed mix clock signal 1188 following assertion of qualified hold signal 1194, the states of the delayed mix clock signal 1188 and the latched hold clock signal 1124 will diverge, thereby causing the clock-XOR signal 1186 to go high. The hold control circuit 1183 responds to the high-going clock-XOR signal 1186 by transitioning to a third state 1255 in which the hold signal 1190 (and therefore the qualified hold signal 1194) remains asserted. Referring briefly to FIG. 32, it can be seen that the first transition of the mix clock signal 1122 following the start of a clock hold interval (1156 or 1158) is a leading edge (rising or falling) of a potentially short-duration pulse (i.e., a potential runt pulse). The hold control circuit 1183 remains in state 1255 while the both the clock-XOR signal 1186 and the jump signal 1202 are high. After the second transition of the delayed mix clock signal 1188 (i.e., a trailing edge of the potential runt pulse), the delayed mix clock signal 1188 again matches the state of the latched hold clock signal 1124 so that the clock-XOR signal 1186 goes low. The hold control circuit 1183 transitions to a fourth state 1257 in response to the low-going clock XOR signal. In state 1257, the hold signal 1190 is deasserted, resulting in a corresponding deassertion of the qualified hold signal 1194 and restoration of the latch 1175 to a non-latched condition. Thus, after the potential runt pulse within the mix clock signal 1122 has passed, the hold clock signal 1124 is enabled to continue tracking the mix clock signal 1122. When the jump signal 1202 is deasserted, the hold control circuit 1186 returns to the initial state 1251. In one embodiment, illustrated in FIG. 34, the hold control circuit 1186 is further adapted to transition to state 1251 from any other of the states (1253, 1255 or 1257) in response to a low going jump signal 1202.

As briefly discussed above, if the qualified hold signal 1194 is asserted coincidentally with a transition of the hold clock signal 1124 (or transition of the mix clock signal 1122 or an intermediary clock signal generated within the latch 1175), a metastable hold clock signal 1124 may be output by latch 1175 (i.e., the voltage level of hold clock signal 1124 may fall within an invalid range between two valid output voltage levels). In addition to the potential for producing undesired results in the synchronous logic circuit 1103 of FIG. 31, a metastable hold clock signal 1124 will potentially produce a metastable XOR-clock signal 1186 and therefore disrupt the operation of the hold control circuit 1183 and the clock hold circuit 1125 generally. The keepout circuit 1179 of FIG. 33 is provided to prevent such undesired results.

Referring to FIG. 33, the keepout circuit 1179 includes delay elements 1201 ($D_3$) and 1203 ($D_4$), exclusive-OR gates 1205 and 1207, AND gates 1211 and 1213 and set/reset (S-R) flip-flop 1215. A jump-test signal 1204 (JTST) is supplied to a first input of exclusive-OR gate 1207 and to an input of delay element 1203. The output of delay element 1203 is supplied to a second input of exclusive-OR gate 1207 so that each transition of the jump test signal 1204 causes exclusive-OR gate 1207 to output a pulse 1208. The duration of pulse 1208 corresponds to the propagation delay through delay element 1203 and defines a time interval referred to herein as a jump window (JWIN). The mix clock signal 1122 is supplied to a first input of exclusive-OR gate 1205 and to an input of delay element 1201. The output of delay element is supplied to a second input of exclusive-OR gate 1205 so that each transition of the mix clock signal 1122 causes exclusive-OR gate 1205 to output a pulse 1206. The duration of pulse 1206 corresponds to the propagation delay through delay element 1201 and defines a time interval referred to herein as a clock window (CWIN). In one embodiment, delay element 1201 produces a substantially longer delay than delay element 1203 (e.g., by including a longer chain of inverters or other delay circuits) so that the clock window is substantially wider than the jump window.

Figure 35:
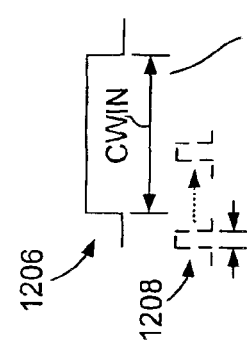
FIG. 35 illustrates exemplary timing relationships between a clock window and a jump window.

FIG. 35 illustrates exemplary timing relationships between the clock window and the jump window defined respectively by signals 1206 and 1208 of FIG. 33. Because the leading edge of the clock window is generated in response to a transition of the mix clock signal 1122, the clock window represents a time interval during which assertion of the jump signal 1202 may result in coincident transitions in the hold clock signal 1124 and the qualified hold signal 1194. In one embodiment, the jump test signal 1204 is a periodic signal that is phase aligned with the jump signal 1202 so that the jump window corresponds to a potential assertion time of the jump signal 1202 (i.e., if the offset select signal is transitioned). Thus, as indicated in FIG. 35, if the jump window falls within the clock window, a keepout signal 1216 is asserted. Referring to FIG. 33, the output of S-R flip-flop 1215 constitutes the keepbut signal, 1216. The S-R flip flop 1215 is initially in a reset state in which the keep out signal 1216 is deasserted. When signals 1206 and 1208 are both high (i.e., the jump window falls at least partially within the clock window), the output of AND gate 1211 goes high to set the S-R flip-flop and thereby assert the keepout signal 1216. Multiplexer 1191 within the hold signal generator 1177 responds to the asserted keepout signal 1216 by selecting a delayed hold signal 1192 (i.e., generated by propagation of hold signal 1190 through delay element 1189 ($D_2$)) to be output as the qualified hold signal 1194 to the latch 1175. If the jump window falls outside the clock window, then signal 1208 will be high while signal 1206 is low, causing AND gate 1213 to reset the S-R flip flop and thereby deassert the keepout signal 1216. The multiplexer 1191 responds to the deasserted keepout signal 1216 by selecting the hold signal 1190 to be output as the qualified hold signal 1194. Thus, the delayed hold signal 1192 is output as the qualified hold signal 1194 when the relative transition times of the jump test signal 1204 and the mix clock signal 1122 indicate a likelihood that an assertion of the hold signal 1190 will coincide with a transition in the mix clock signal 1122 (and therefore with a transition in the hold clock signal 1124). Conversely, the hold signal 1190 is output as the qualified hold signal 1194 when the relative transition times of the jump test signal and the mix clock signal indicate that an assertion of the hold signal 1190 will not coincide with a transition in the mix clock signal 1122.

Figure 36:
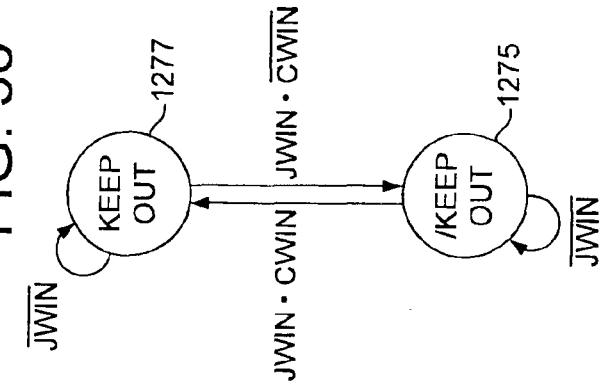
FIG. 36 is an exemplary state diagram of the keepout circuit of FIG. 33.

FIG. 36 is an exemplary state diagram of the keepout circuit 1179 of FIG. 33. Referring to both FIGS. 36 and 33, the keepout circuit 1179 is initialized to a first state 1275 in which the keepout signal is deasserted. The keepout circuit 1179 remains in state 1275 so long as the jump window and clock window do not overlap (i.e., so long as the Boolean expression /JWIN OR /CWIN remains true). If the jump window and clock window overlap (i.e., signals 1206 and 1208 are both high), the S-R flip-flop 1215 is set, transitioning the keepout circuit 1179 to state 1277, in which the keepout signal 1216 is asserted. The keepout circuit 1179 remains in state 1277 so long as the jump window does not fall outside the clock window (i.e., so long as the Boolean expression /JWIN OR CWIN remains true). If the jump window falls outside the clock window (i.e., signal 1206 is low while signal 1208 is high), the S-R flip-flop 1215 is reset, returning the keepout circuit to state 1275 and therefore deasserting the keepout signal 1216.

Figure 37:
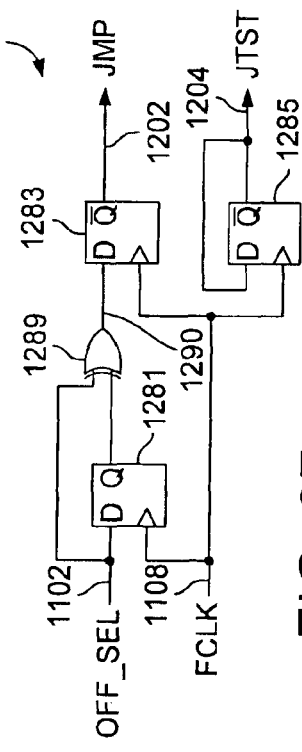
FIG. 37 illustrates an exemplary embodiment of the synchronizing logic of FIG. 33.

FIG. 37 illustrates an exemplary embodiment of the synchronizing logic 1181 of FIG. 33. The synchronizing logic 1181 includes flip-flops 1281, 1283 and 1285, and an exclusive-OR gate 1289. Each of the flip-flops (1281, 1283, 1285) is clocked by the feedback clock signal 1108 (i.e., generated within the tracking loop 1105 of FIG. 31). The offset select signal 1102 is supplied to a data input of flip-flop 1281 and to a first input of exclusive-OR gate 1289. The output of flip-flop 1281 is supplied to a second input of the exclusive-OR gate 1289 so that, when the offset select signal 1102 changes state, exclusive-OR gate 1289 asserts a jump detect signal 1290 until the next rising edge of the feedback clock signal 1108. The output of the exclusive-OR gate 1289 is coupled to a data input of flip-flop 1283 so that the asserted jump detect signal 1290 is registered within flip-flop 1283 in response to the rising edge of the feedback clock signal that succeeds the transition in the offset select signal 1102. The jump signal 1202 is output via an inverting output of the flip-flop 1283 and therefore constitutes a synchronous indication of the offset select signal transition. Note that the offset select signal 1102 may be a multiple-bit signal (e.g., used to select between more than two offset control values or phase control values) in which a transition within any bit of the offset select signal 1102 results in assertion of the jump signal 1202. Still referring to FIG. 37, the input and inverting output of flip-flop 1285 are coupled to one another to generate the jump test signal 1204. Thus, in the embodiment of FIG. 37, the jump test signal 1204 is a periodic signal that transitions in response to each edge of the feedback clock signal 1108 and that is substantially phase aligned with a transition in the jump signal 1202. In alternative embodiments, clock signals other than the feedback clock signal 1108 may be used to generate the jump and jump test signals (1202 and 1204), and falling rather than rising edges of the feedback clock signal 1108 (or other clock signal) may be used to trigger state changes within the flip-flops 1281, 1283 and 1285.

It should be noted that the exemplary phase jumping applications described above, though described in terms of phase jumping locked loop circuits that include the phase jumping mixer embodiments described in reference to FIGS. 4–14, may alternatively be implemented by locked loop circuits that include other types of mixing circuits. In general, any circuit of producing a relatively rapid phase transition in an output clock signal may be used in the above-described applications in place of the phase jumping mixer embodiments described in reference to FIGS. 4–14.

The section headings provided in this detailed description are for convenience of reference only, and in no way define, limit, construe or describe the scope or extent of such sections. Also, while the invention has been described with reference to specific exemplary embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. A method comprising:
   outputting a phase adjust signal in response to a first clock signal and a second clock signal;
   obtaining a phase count value in response to the phase adjust signal;
   summing a phase jump value and the phase count value in response to the phase adjust signal to obtain an updated phase count value; and
   biasing a plurality of transistors in a phase mixer in response to the updated phase count value.

2. The method of claim 1, wherein the first clock signal is a feedback signal and the second clock signal is a reference clock signal.

3. The method of claim 2, wherein the phase jump value represents a portion of a cycle of the reference clock signal.

4. The method of claim 2, wherein the phase jump value is a negative value.

5. The method of claim 2, further comprising:
   determining whether the feedback signal leads the reference clock signal; and
   determining whether the feedback signal lags the reference clock signal.

6. The method of claim 2, further comprising:
   reducing the phase jump value; and
   repeating the outputting, obtaining and summing.

7. The method of claim 1, wherein the obtaining is performed by a phase counter and the outputting is performed at by a phase detector.

8. The method of claim 7, further comprising:
disabling the phase counter.

9. The method of claim 8, further comprising:
enabling the phase counter.

10. A method comprising:
disabling a phase counter to adjust a phase count value;
initializing a phase jump value;
comparing a reference clock signal with a feedback clock signal;
summing the phase jump value and the phase count value to obtain an updated phase count value in response to comparing the reference clock signal to the feedback signal;
loading the updated phase count value into the phase counter;
comparing the phase jump value to a threshold value; and
reducing the phase jump value in response to comparing the phase jump value to the threshold value.

11. The method of claim 10, further comprising:
biasing a plurality of transistors in a phase mixer in response to the updated phase count value.

12. The method of claim 10, further comprising:
repeating the comparing the reference clock signal with the feedback clock signal;
repeating the summing the phase jump value and the phase count value;
repeating the loading the updated phase count value;
repeating the comparing the phase jump value to the threshold value; and
repeating the reducing the phase jump value.

13. The method of claim 10, further comprising:
enabling the phase counter in response to the comparing the phase jump value to the threshold value.

14. The method of claim 10, wherein the phase jump value is initialized to represent one fourth of a cycle of the reference clock signal.

15. The method of claim 10, wherein the phase jump value is a negative value.

16. An integrated circuit device comprising:
a select circuit to provide a first offset value;
a summing circuit to sum the first offset value and a phase count value, wherein the phase count value indicates a phase difference between a reference clock signal and a clock signal in a plurality of clock signals; and
a phase mixer to combine the first plurality of clock signals with the sum of the first offset value and the phase count value, wherein the phase mixer includes:
a plurality of differential amplifiers including a first, second, third and fourth differential amplifier,
a biasing circuit, coupled to the plurality differential amplifiers, including a first, second, third and fourth biasing transistor,
wherein the first and second biasing transistors are coupled in series with the first and second differential amplifiers, and the third and fourth biasing transistors are coupled in series to the third and fourth differential amplifiers.

17. The integrated circuit of claim 16, wherein the plurality of differential amplifiers has a plurality of inputs and outputs, wherein the plurality of inputs receives the plurality of clock signals and the plurality of outputs are coupled to first and second output signal lines.

18. The integrated circuit of claim 17, where a first resistive element is coupled to a first reference voltage and the first output signal line.

19. The integrated circuit of claim 18, wherein the first resistive element has a variable resistance value in response to a first control signal.

20. The integrated circuit of claim 18, wherein a second resistive element is coupled to the first reference voltage and the second output signal line.

21. The integrated circuit of claim 20, wherein the second resistive element has a variable resistance value in response to the first control signal.

22. The integrated circuit of claim 16, wherein a first differential amplifier in the plurality of differential amplifiers includes a first transistor having a drain coupled to a first output signal line and a second transistor having a drain coupled to a second output signal line.

23. The integrated circuit of claim 22, wherein the first transistor has a first source and the second transistor has a second source coupled to the first source.

24. The integrated circuit of claim 23, wherein the first and second sources are coupled to a switch element that is coupled to the biasing circuit.

25. The integrated circuit of claim 16, wherein the first biasing transistor is coupled in series to a fifth biasing transistor and the second biasing transistor is coupled in series to a sixth biasing transistor.

26. An integrated circuit, comprising:
a phase mixer having a plurality of differential amplifiers to combine a pair of clock signals;
means for current biasing a first differential amplifier in the plurality of differential amplifiers using a first plurality of biasing transistors and a second differential amplifier in the plurality of differential amplifiers using a second plurality of biasing transistors.

27. The integrated circuit of claim 26, further comprising:
a switch element coupled to the first differential amplifier and the first plurality of biasing transistors.

* * * * *